(12) United States Patent
Seawright et al.

(10) Patent No.: US 7,454,324 B1
(45) Date of Patent: Nov. 18, 2008

(54) SELECTION OF INITIAL STATES FOR FORMAL VERIFICATION

(76) Inventors: James Andrew Garrard Seawright, 400 W. Dana St., Mountain View, CA (US) 94041; Ramesh Sathianathan, 1172F La Rochelle Terr., Sunnyvale, CA (US) 94089; Christophe G. Gauthron, 562 Pettis Ave., Mountain View, CA (US) 94041; Jeremy R. Levitt, 1700 N. First St., #304, San Jose, CA (US) 95112; Kalyana C. Mulam, 3255 Montelena Dr., San Jose, CA (US) 95135; Chian-Min Richard Ho, 3128 Avalon Ct., Palo Alto, CA (US) 94306; Ping Fai Yeung, 1101 Brooks Range Landing, San Jose, CA (US) 95131

( * ) Notice: Subject to any disclaimer, the term of this patent is extended or adjusted under 35 U.S.C. 154(b) by 721 days.

(21) Appl. No.: 10/340,500

(22) Filed: Jan. 10, 2003

(51) Int. Cl.
*G06F 17/50* (2006.01)
(52) U.S. Cl. .................. 703/14; 716/2; 716/4; 716/5
(58) Field of Classification Search .................. 703/14; 716/2, 4–5
See application file for complete search history.

(56) References Cited

U.S. PATENT DOCUMENTS

| | | | |
|---|---|---|---|
| 5,202,889 A | 4/1993 | Aharon et al. | |
| 5,465,216 A | 11/1995 | Rotem et al. | |
| 5,479,414 A | 12/1995 | Keller et al. | |
| 5,539,652 A | 7/1996 | Tegethoff | |
| 5,555,270 A | 9/1996 | Sun et al. | |
| 5,600,787 A | 2/1997 | Underwood et al. | |
| 5,623,499 A | 4/1997 | Ko et al. | |
| 5,630,051 A | 5/1997 | Sun et al. | |
| 5,638,381 A | 6/1997 | Cho et al. | |
| 5,654,657 A | 8/1997 | Pearce | |
| 5,680,332 A | 10/1997 | Raimi et al. | |
| 5,724,504 A | 3/1998 | Aharon et al. | |
| 5,729,554 A | 3/1998 | Weir et al. | |
| 5,862,149 A | 1/1999 | Carpenter et al. | |

(Continued)

OTHER PUBLICATIONS

Burch et al., (Automatic Verification of Pipelined Microprocessor Control, 1994).*

(Continued)

*Primary Examiner*—Paul L Rodriguez
*Assistant Examiner*—Andre Pierre Louis
(74) *Attorney, Agent, or Firm*—Brian N. Young; Trellis IP Law Group, PC

(57) ABSTRACT

A computer is programmed to automatically select a state or a set of states of a digital circuit that are visited during simulation, for use as one or more initial states by a formal verification tool. Such automatic selection of one or more simulation states reduces the set of all simulation states to a small subset, thereby to address the state space explosion problem. Depending on the embodiment, the programmed computer uses one or more criteria provided by a library and/or by the user, in making its selection of states. Such criteria may be based on a property (assertion/checker) of the digital circuit and/or a signal generated during simulation. Furthermore, after such criteria (also called "primary criteria") are applied, the selected states may be pruned by application of additional criteria (also called "secondary criteria") prior to formal analysis.

18 Claims, 40 Drawing Sheets

U.S. PATENT DOCUMENTS

| | | | |
|---|---|---|---|
| 6,102,959 | A | 8/2000 | Hardin et al. |
| 6,175,946 | B1 | 1/2001 | Ly et al. |
| 6,192,505 | B1 | 2/2001 | Beer et al. |
| 6,292,765 | B1 | 9/2001 | Ho et al. |
| 6,311,293 | B1 * | 10/2001 | Kurshan et al. ............... 714/37 |
| 6,356,858 | B1 | 3/2002 | Malka et al. |
| 6,408,262 | B1 | 6/2002 | Leerberg et al. |
| 6,484,088 | B1 | 11/2002 | Reimer |
| 6,609,229 | B1 | 8/2003 | Ly et al. |
| 6,745,160 | B1 * | 6/2004 | Gupta et al. ................... 703/14 |
| 6,751,582 | B1 | 6/2004 | Andersen et al. |
| 6,848,088 | B1 * | 1/2005 | Levitt et al. .................... 716/4 |
| 6,885,983 | B1 | 4/2005 | Ho et al. |
| 6,915,248 | B1 * | 7/2005 | Ip ............................... 703/14 |
| 6,957,404 | B2 * | 10/2005 | Geist et al. ...................... 716/4 |
| 6,985,840 | B1 * | 1/2006 | Hsu et al. ....................... 703/7 |
| 7,007,249 | B2 | 2/2006 | Garbowski et al. |
| 2003/0206730 | A1 | 11/2003 | Singhal et al. |
| 2004/0093571 | A1 * | 5/2004 | Jain et al. ....................... 716/5 |
| 2005/0081169 | A1 | 4/2005 | Levitt et al. |

OTHER PUBLICATIONS

Bhagwati et al., (Automatic Verification of Pipelined Microprocessors, 1995).*
CheckerWare Data Book, Version 1.4.1, May 2002.
Clarke, et al. "Automatic Verification of finite-state concurrent systems using temporal logic specifications"1986, pp. 244-263, vol. 8, No. 2, ACM Transactions on Programming Languages and Systems, ISSN: 0164-0925.
Clarke, et al. "Bounded Model Checking Using Satisfiability Solving", 2001, pp. 7-34, Formal Methods in System Design, vol. 19, Issue 1 (Jul. 2001) ISSN: 0925-9856.
Hoskote, et al. "Coverage Estimation for Symbolic Model Checking", Jun. 1999, pp. 300-305, Annual ACM IEEE Design Automation Conference, Proceedings of the 36th ACM/IEEE conference on Design automation, New Orleans, Louisiana, United States, ISBN: 1-58133-109-7.
U.S. Appl. No. 09/849,005, filed Jun. 16, 2005, Ho, Chian-Min Richard et al.
U.S. Appl. No. 09/635,598, filed Oct. 23, 2003, Ly, Tal An et al.
U.S. Appl. No. 10/340,555, filed Jan. 10, 2003, Levitt, J. et al.
Yatin Hoskote, et al., "Coverage Estimation for Symbolic Model Checking", Annual ACM IEEE Design Automation Conference, Proceedings of the 38th ACM/IEEE conference on Design automation, New Orleans, Louisiana, United States, pp. 300-305, 1999, ISBN:1-58133-109-7.
Jerry R. Burch, et al., "Automatic Verification of Pipelined Microprocessor Control", Lecture Notes In Computer Science; vol. 818, Proceedings of the 6th International Conference on Computer Aided Verification, pp. 68-80, 1994, ISBN:3-540-58179-0.
C. Kern, et al. "Formal Verification in Hardware Design: A Survey", ACM Transactions on Design Automation of Electronic Systems (TODAES), vol. 4 , Issue 2 (Apr. 1999), pp. 123-193, ISSN:1084-4309.
Burch et al.; "Symbolic Model Checking: $10^{20}$ States and Beyond", Information and Computation, vol. 98, No. 2, Jun. 1992.
Moskewicz, M. et al.; "chaff Engineering and Efficient SAT Solver"; Proceedings of the $38^{th}$ Design Automation Conference, Jun. 2001.
Devadas, S., et al.; "An Observability-Based Code Coverage Metric Fro Functional Simulation"; IEEE/ACM International conference on Computer-Aided Design; Nov. 10-14, 1996; pp. 418-425.
Ho, R. et al.; "Validation Coverage Analysis for Complex Digital Designs"; IEE/ACM International Conference on Computer-Aided Design; San Jose, CA; Digest of Technical Papers; Nov. 10-14, 1996.
Geist, D. et al.; "Coverage-Directed Test Generation Using Symbolic Techniques"; Format Methods in Computer-Aided Design, First International Conference; FMCAD.96; Palo Alto, CA; No. 6-8, 1996; pp. 142-159.
Thomas, D. et al.; "The Verilog Hardware Description Language"; Third Edition, Kluwer Academic Publishers; 1996.

http://www.haifa.il.ibm.com/projects/verification/sugar/; 1 page.
http://www.cs.cmu.edu/~modelcheck/smv.html; 4 pages.
http://www.gnu.org/software/ggc.html; 2 pages.
http://embedded.eecs.berkeley.edu/Respep/Research/vis/; 2 pages.
http://www.mentor.com/products/fv/cdv/checkerware/; 1 page.
U.S. Appl. No. 10/340,555, filed Jan. 10, 2003, Levitt et al.
U.S. Appl. No. 10/340,500, filed Jan. 10, 2003, Seawright et al.
Abdulla, P.A., et al. "Symbolic Rachability Analysis Based on SAT Solvers" TACAS '00, 6th International Conference on Tools and Algorithms for the Construction and Analysis of Systems (TACAS), Springer-Verlag, 2000, pp. 411-425.
Amato, et al., "Checking Linked Data Structures" IEEE, pp. 164-173 (1994).
Benso, et al., "Exploiting HLDs for Circuits Fault Tolerance Assessments" 1997, no page number.
Biere, A., et al., "Symbolic Model Checking Using SAT Procedures Instead of BDDs" Proceedings of the Design Automation Conference (DAC '99) Jun. 1999.
Burch, J.R., et al., "Symbolic Model Checkintg: 10.sup.20 States and Beyond" Information and Computation, 1998, pp. 428-439.
Burch, Jerry R., et al., "Automatic Verification of Pipelined Microprocessor Control" published in the proceedings of International Conference on Computer-Aided Verification, LNCS 818, Springer-Verlag, Jun. 1994, pp. 1-17.
Caporossi, et al., "Rule Checking at the Register Level" IEEE Spectrum, pp. 72-73 (1996).
Clarke, E.M., et al., "Automatic Verification of Finite-state Concurrent systems Using Temporal Logic Specifications" published in aCM Transactions on Programming Languages and Systems, 8(2):244-263, 1986.
Devadas, S., et al., "An Observability-Based Code Coverage Metric for Functional Simulation" IEEE/ACM International Conference on Computer-Aided Design, Nov. 10-14, 1996, pp. 418-425.
Dill, David, et al., "Protocol Verification as a Howard Design Aid" published in Proceedings of the International Conference on Computer Design, Oct. 1992, pp. 1-4.
Ganai, M., et al., "Improved SAT-Based Bounded Reachability Analysis" Proceedings of the 15.sup.th International Conference on VLSI Design (VLSID '02), Mar. 2002, 6 pages.
Geist, D., et al., "Coverage-Directed Test Generation Using Symbolic Techniques" Formal Methods in Computer-Aided Design, First International Conf., FMCAD 96, Palo Alto, CA, Nov. 6-8, 1996, pp. 142-159.
Goering, R., et al., "Tool Vendors Attach Verification Logjam" Mar. 4, 2002; http://www.eedesign.com/story/OEG20020304S0018, pp. 1-4.
Gu, J., et al., "Algorithms for the Satisfiability (SAT) Problem: A Survey" DIAMACA Series on Discrete Mathematics and Theoretical Computer Science 35:0-131, American Mathematical Society, 1997, http://Citeseer.nj.nec.com/56722.html.
Ho, Chian-Min Richard, "Validation Tools for Complex Digital Designs" A Dissertation Submitted to the Department of Computer Science and the Committee on Graduate Studies of Stanford University in Partial Fulfillment of the Requirements for the Degree of Doctor of Philosophy, Nov. 1996, no page number.
Ho, R., et al., "Validation Coverage Analysis for Complex Digital Designs" IEEE/ACM International Conference on Computer-Aided Design, San Jose, CA, Digest of Technical Papers, Nov. 10-14, 1996, pp. 146-151.
Hoskote, Yatin, et al., "Coverage Estimation for Symbolic Model Checking" published in Proceedings of DAC 1999 (Best Paper Award), pp. 300-305.
Jones, K.D., et al., "The Automatic Generation of Functional Test Vectors for Rambus Designs" 33.sup.rd Design Automation Conference, Las Vegas, NV, Proceedings 1996, pp. 415-420.
Kant, et al., "Synthesizing Robust Data Structures-An Introduction" IEEE Trans on computers, pp. 161-173 (1990).
Kern, C., et al., "Formal Verification in Hardware Design: A Survey" ACM Trans. On Design Automation of Electronic Systems, vol. 4, pp. 1-61, Apr. 1999; http://citeseer.nj.nec.com/kern99format.html.
Kuehlmann, A., et al., "Circuit-Based Boolean Reasoning" proceedings of the Design Automation Conference (DAC '01), Jun. 2001, 8 pages.

Maxfield, C. "Why Properties are Important" eedesign, May 12, 2002; http://www.eedesign.com/story/oeg20020515S0033, pp. 1-5.

McMillan, K.L., "Fitting Formal Methods into the Design Cycle" 31.sup.st Design Automation Conference, San Diego, CA Jun. 6-10, 1994, pp. 314-319.

Monaco, J., "Functional Verification Methodology for the PowerPC 604.TM. Microprocessor" 33.sup.rd Design Automation Conference, Las Vegas, NV, 1996, pp. 319-324.

Moundanos, D., "Abstraction Techniques for Validation Coverage Analysis and Test Generation" believed to be prior to Jun. 2002, pp. 1-35.

Singer, S., et al., "Next Generation Test Generator (NGTG) for Digital Circuits"Autotestcon, 97. 1997 IEEE Autotestcon Proceedings, Sep. 22-25, 1997, pp. 105-112.

Thomas, D., et al., "The Verilog Hardware Description Language" Third Edition, Kluwer Academic Publishers; 1996.

Vinnakota, et al., "Design of Multiprocessor Systems for Concurrent Error Detection and Fault Diagnosis" IEEE, pp. 504-511.

"Sato: An Efficient Propositional Prover" Proceedings of the International Conference on Automated Deduction, Jul. 1997, 5 pages.

Clarke, Edmund M., et al., "Model Checking" The MIT press, 1999, 20 pages.

Kurshan, R.P. et al., "Formal Verification In a Commercial Setting", Bell Laboratories, 5 pages.

Davis, Martin, et al. A Computing Procedure for Quantification Theory, 15 pages, Sep. 1959.

Davis, Martin, et al. , "A Machine Program for Theorem-Proving" 4 pages, Institute of Mathematical Sciences, New York University, communication of the ACM.

Sangiovanni-Vincentelli, Alberto L., et al., "Verification of Electronic Systems" IEEE/ACM International Conference on Computer-Aided Design, Nov. 10-14, 1996, pp. 106-111.

Hayes, Brian, "Can't Get No Satisfaction", American Scientist, vol. 85, pp. 108-112.

Hayes, Brian, "On The Threshold", American Scientist, vol. 91, pp. 12-17.

Ly, Tai et al.; "Formally Verifiying Clock Domain Crossing Jitter Using Assertion—Based Verification" O-In Design Automation, San Jose, CA pp. 1-5.

Heinrich, David et al.; "Hardware/Software Co-Design of the Sanford Flash Multiporcessor" Proceeding of the IEEE, vol. 85 No. 3 Mar. 1997; pp. 455-466.

Liang, Hsing-Chung et al.; "Invalid State Identification for Sequential Circuit Test Generation" Fifth Asian Test Symposium ATS'96; pp. 10-15.

Camurati, P. et al.; "Efficient Verification of Sequential Circuits on a Parallel System" The European Conference on Design Automation IEEE Computer Society Press 1992; pp. 64-68.

\* cited by examiner

```
module fifo (clk, rst, enq, enq_data, deq, deq_data,
             is_full, is_empty);
input clk, rst;
input enq, deq;
input [7:0] enq_data ;
output [7:0] deq_data;
output is_full, is_empty;

reg [7:0]    deq_data;
reg [7:0]    fifo_mem[0:1]; //memory: FIFO contents reg          eng_ptr,deg_ptr;  //counters
reg          last_op;
parameter OP_ENQ = 0;
parameter OP_DEQ = 1;

wire is_full_on_empty = (eng_qtr == deq_ptr);
wire is_full = ((last_op == OP_ENQ) && is_full_or_empty);
wire is_empty = ((last_op == OP_DEQ) && is_full_or_empty);

always @(posedge clk or posedge rst) begin
    if (rst)       //reset the device
        begin
            eng_ptr <= 1'b0;
            deq_ptr <= 1'b0;
            last_op <= OP_DEQ;
        end
    else
        begin
            if (enq) //enqueue data
                begin
                    fifo_mem[enq_ptr] <= enq_data;
                    eng_ptr <= eng_ptr + 1'b1;
                    last_op <= OP_ENQ;
                end
            if (deq) //dequeue data
                begin
                    deq_data <= fifo_mem[deq_ptr];
                    deq_ptr <= deq_ptr + 1'b1;
                    last_op <= OP_DEQ;
                end
        end //else
end //always
endmodule //fifo
```

*Fig. 4*
(Prior Art)

| Ports of the FIFO device | Description | Range of values |
|---|---|---|
| clk | Clock - FIFO operates on the rising edge of the clock | 0/1 |
| rst | Reset - Resets the FIFO - FIFO is empty after reset is applied | 0/1 |
| enq | When high at the rising edge of the clock, the FIFO will enqueue one byte of data | 0/1 |
| enq_data | Data to be enqueued into the FIFO | 0-ff (hexadecimal) |
| deq | When high at the rising edge of the clock, the FIFO will dequeue one byte of data | 0/1 |
| deq_data | Data that is dequeued from the FIFO | 0-ff (hexadecimal) |
| is_full | Driven to high by the FIFO when it is full | 0/1 |
| is_empty | Driven to high by the FIFO when it is empty | 0/1 |

*Fig. 4A*
*(Prior Art)*

| Circuit Element that hold state | Description | Range of values |
|---|---|---|
| enq_ptr | Enqueue pointer | 0/1 |
| deq_ptr | Dequeue pionter | 0/1 |
| last_op | Stores last operation on FIFO (e.g. enqueue or dequeue) | 0/1 |
| fifo_mem | Memory used to store data in the FIFO | Each entry in memory: 0-ff (hexadecimal) Number of items in memory: 0-2 |

*Fig. 4B*
*(Prior Art)*

| State # | rst | enq | enq_data | deq | deq_data | is_full | is_empty |
|---|---|---|---|---|---|---|---|
| 0 | 1 | 0 | xx | 0 | xx | 0 | 1 |
| 1 | 0 | 0 | xx | 0 | xx | 0 | 1 |
| 2 | 0 | 1 | 8a | 0 | xx | 0 | 0 |
| 3 | 0 | 0 | 8a | 0 | xx | 0 | 0 |
| 4 | 0 | 0 | 8a | 1 | 8a | 0 | 1 |
| 5 | 0 | 0 | 8a | 0 | 8a | 0 | 1 |
| 6 | 0 | 1 | 24 | 0 | 8a | 0 | 0 |
| 7 | 0 | 1 | 81 | 0 | 8a | 1 | 0 |
| 8 | 0 | 0 | 81 | 1 | 8a | 1 | 0 |
| 9 | 0 | 0 | 81 | 0 | 24 | 0 | 0 |
| 10 | 0 | 1 | 8f | 0 | 24 | 1 | 0 |
| 11 | 0 | 0 | 8f | 0 | 24 | 1 | 0 |
| 12 | 0 | 0 | 8f | 1 | 81 | 1 | 0 |
| 13 | 0 | 0 | 8f | 1 | 8f | 0 | 0 |
| 14 | 0 | 0 | 8f | 0 | 8f | 0 | 1 |
| 15 | 0 | 0 | 8f | 0 | 8f | 0 | 1 |

*Fig. 5A*
*(Prior Art)*

| State # | enq_ptr | deq_ptr | last_op |
|---|---|---|---|
| 0 | 0 | 0 | 1 |
| 1 | 0 | 0 | 1 |
| 2 | 1 | 0 | 0 |
| 3 | 1 | 0 | 0 |
| 4 | 1 | 1 | 1 |
| 5 | 0 | 1 | 1 |
| 6 | 1 | 1 | 0 |
| 7 | 1 | 1 | 0 |
| 8 | 1 | 0 | 0 |
| 9 | 1 | 0 | 1 |
| 10 | 0 | 0 | 1 |
| 11 | 0 | 0 | 0 |
| 12 | 0 | 1 | 0 |
| 13 | 0 | 1 | 1 |
| 14 | 0 | 1 | 1 |
| 15 | 0 | 0 | 1 |

*Fig. 5B*
*(Prior Art)*

Properties

1. The file cannot be enqueued and dequeued in the same clock cycle

• //0in  assert-var !(enq && deq)  ∼592

2. Do not add data to the fifo when it is full

• //0in  assert-var (!is_full || !enq)  ∼594

3. Do not remove data from the fifo when it is empty

• //0in  assert-var (!is_full || !deq)  ∼596

*Fig. 5C*
*(Prior Art)*

Antecedents /⁓793

1. *Property:* The fifo cannot be enqueued and dequeued in the same clock cycle
   - *Implications:*
     - enq -> !deq  ⁓785
     - deq -> !enq  ⁓786
   - *Antecedents*
     - enq  ⁓787
     - deq  ⁓788
   - *Selection criteria:* antecedent_select = (enq or deq)  ⁓780

2. *Property:* Do not add data to the fifo when it is full  ⁓794
   - *Implication:* is_full -> !enq  ⁓789
   - *Antecedent:* is_full  ⁓790
   - *Selection criteria:* antecedent-select = is_full  ⁓782

3. *Property:* Do not remove data from the fifo when it is empty  ⁓795
   - *Implication:* is_empty -> !deq  ⁓791
   - *Antecedent:* is_empty  ⁓792
   - *Selection criteria:* antecedent_select = is_empty  ⁓784

*Fig. 7*

| State # | rst | enq | enq_data | deq | deq_data | is_full | is_empty | antecedent_select |
|---|---|---|---|---|---|---|---|---|
| 0 | 1 | 0 | xx | 0 | xx | 0 | 1 | 0 |
| 1 | 0 | 0 | xx | 0 | xx | 0 | 1 | 0 |
| 2 | 0 | 1 | 8a | 0 | xx | 0 | 0 | 1 (select this state) |
| 3 | 0 | 0 | 8a | 0 | xx | 0 | 0 | 0 |
| 4 | 0 | 0 | 8a | 1 | 8a | 0 | 1 | 1 (select this state) |
| 5 | 0 | 0 | 8a | 0 | 8a | 0 | 1 | 0 |
| 6 | 0 | 1 | 24 | 0 | 8a | 0 | 0 | 1 (select this state) |
| 7 | 0 | 1 | 81 | 0 | 8a | 1 | 0 | 1 (select this state) |
| 8 | 0 | 0 | 81 | 0 | 8a | 1 | 0 | 0 |
| 9 | 0 | 0 | 81 | 1 | 24 | 0 | 0 | 1 (select this state) |
| 10 | 0 | 1 | 8f | 0 | 24 | 1 | 0 | 0 |
| 11 | 0 | 0 | 8f | 0 | 24 | 1 | 0 | 0 |
| 12 | 0 | 0 | 8f | 1 | 81 | 0 | 0 | 1 (select this state) |
| 13 | 0 | 0 | 8f | 1 | 8f | 0 | 1 | 1 (select this state) |
| 14 | 0 | 0 | 8f | 0 | 8f | 0 | 1 | 0 |
| 15 | 0 | 0 | 8f | 0 | 8f | 0 | 1 | 0 |

Fig. 7B

| State # | rst | enq | enq_data | deq | deq_data | is_full | is_empty | Illegal_access | antecedent_select |
|---|---|---|---|---|---|---|---|---|---|
| 0 | 1 | 0 | xx | 0 | xx | 0 | 1 | 0 | 0 |
| 1 | 0 | 0 | xx | 0 | xx | 0 | 1 | 0 | 0 |
| 2 | 0 | 1 | 8a | 0 | xx | 0 | 1 | 0 | 1 |
| 3 | 0 | 0 | 8a | 0 | xx | 0 | 0 | 0 | 0 |
| 4 | 0 | 0 | 8a | 1 | xx | 0 | 1 | 0 | 1 |
| 5 | 0 | 0 | 8a | 0 | 8a | 0 | 1 | 0 | 0 |
| 6 | 0 | 1 | 24 | 0 | 8a | 1 | 0 | 0 | 1 |
| 7 | 0 | 1 | 81 | 0 | 8a | 0 | 0 | 1 | 1 |
| 8 | 0 | 1 | 9 | 0 | 8a | 0 | 0 | 0 | 1 |
| 9 | 0 | 0 | 9 | 0 | 8a | 0 | 0 | 0 | 0 |
| 10 | 0 | 0 | 9 | 1 | 8a | 0 | 0 | 0 | 1 |

*Fig. 7D*

Corner Cases

1. *FIFO is full* ⏜ 890

• *Selection criteria:* corner_case_select = is_full ⏜ 880
                                                                    885

2. *FIFO is empty* ⏜ 892

• *Selection criteria:* corner_case_select = is_empty

Combined Corner Case

• *FIFO is either full or empty* ⏜ 894

• *Selection criteria:* corner_case_select = is_full | is_empty ⏜ 884

*Fig. 8*

| State # | rst | enq | enq_data | deq | deq_data | is_full | is_empty | Illegal_access | corner_case_select |
|---|---|---|---|---|---|---|---|---|---|
| 0 | 1 | 0 | xx | 0 | xx | 0 | 1 | 0 | 1 |
| 1 | 0 | 0 | xx | 0 | xx | 0 | 1 | 0 | 1 |
| 2 | 0 | 1 | 8a | 0 | xx | 0 | 1 | 0 | 1 |
| 3 | 0 | 0 | 8a | 0 | xx | 0 | 0 | 0 | 0 |
| 4 | 0 | 0 | 8a | 1 | xx | 0 | 0 | 0 | 0 |
| 5 | 0 | 0 | 8a | 0 | 8a | 0 | 1 | 0 | 1 |
| 6 | 0 | 1 | 24 | 0 | 8a | 1 | 1 | 0 | 1 |
| 7 | 0 | 1 | 81 | 0 | 8a | 0 | 0 | 0 | 0 |
| 8 | 0 | 1 | 9 | 0 | 8a | 0 | 0 | 1 | 1 |
| 9 | 0 | 0 | 9 | 0 | 8a | 0 | 0 | 0 | 0 |
| 10 | 0 | 0 | 9 | 1 | 8a | 0 | 0 | 0 | 0 |

*Fig. 8C*

| State # | rst | enq | enq_data | deq | deq_data | num_enqs | num_deqs | num_over_high_wtr | max_entries | current_entries | stastitic_changed |
|---|---|---|---|---|---|---|---|---|---|---|---|
| 0 | 1 | 0 | xx | 0 | xx | 0 | 0 | 0 | 0 | 0 | 0 |
| 1 | 0 | 0 | xx | 0 | xx | 0 | 0 | 0 | 0 | 0 | 0 |
| 2 | 0 | 1 | 8a | 0 | xx | 1 | 0 | 0 | 1 | 1 | 1 |
| 3 | 0 | 0 | 8a | 0 | xx | 1 | 0 | 0 | 1 | 1 | 0 |
| 4 | 0 | 0 | 8a | 1 | 8a | 1 | 1 | 0 | 1 | 0 | 1 |
| 5 | 0 | 0 | 8a | 0 | 8a | 1 | 1 | 0 | 1 | 0 | 0 |
| 6 | 0 | 1 | 24 | 0 | 8a | 2 | 1 | 1 | 1 | 1 | 1 |
| 7 | 0 | 1 | 81 | 0 | 8a | 3 | 1 | 1 | 2 | 2 | 1 |
| 8 | 0 | 0 | 81 | 0 | 8a | 3 | 1 | 1 | 2 | 2 | 0 |
| 9 | 0 | 0 | 81 | 1 | 24 | 3 | 2 | 2 | 2 | 1 | 1 |
| 10 | 0 | 0 | 81 | 0 | 24 | 4 | 2 | 2 | 2 | 1 | 0 |
| 11 | 0 | 1 | 8f | 0 | 24 | 4 | 2 | 2 | 2 | 2 | 1 |
| 12 | 0 | 0 | 8f | 1 | 24 | 4 | 3 | 2 | 2 | 1 | 0 |
| 13 | 0 | 0 | 8f | 1 | 81 | 4 | 4 | 2 | 2 | 0 | 1 |
| 14 | 0 | 0 | 8f | 0 | 8f | 4 | 4 | 2 | 2 | 0 | 1 |
| 15 | 0 | 0 | 8f | 0 | 8f | 4 | 4 | 2 | 2 | 0 | 0 |

Fig. 9A

Properties
- FIFO has one entry

*Fig. 10*

```
fifo FIFO_INST (clock, reset, enqueue, datain, dequeue, dataout, is-full, is_empty);
...
case (state)
...
    STORE_DATA:
        if (is_full)
            next_state = STOP_TRANSMISSION;
        else begin
            enqueue = 1'b1 ;                      // enqueue data into FIFO
            datain = framein[31:24];
            next_state = STORE_DATA;
        end
    RETRIEVE_DATA:
        if (is_empty)
            next_state = NO_MORE_DATA;
        else begin
            dequeue = 1'b1 ;                      // dequeue data from FIFO
            frameout[31:24] = dataout;
            next_state = RETRIEVE_DATA;
        end
```

*Fig. 11*
*(Prior Art)*

| State # | rst | enq | enq_data | deq | deq_data | is_full | is_empty | first_antecedent |
|---|---|---|---|---|---|---|---|---|
| 0 | 1 | 0 | xx | 0 | xx | 0 | 1 | 0 |
| 1 | 0 | 0 | xx | 0 | xx | 0 | 1 | 0 |
| 2 | 0 | 1 | 8a | 0 | xx | 0 | 0 | 1 (select this state) |
| 3 | 0 | 0 | 8a | 1 | xx | 0 | 0 | 0 |
| 4 | 0 | 0 | 8a | 0 | 8a | 0 | 1 | 1 (select this state) |
| 5 | 0 | 0 | 8a | 0 | 8a | 0 | 1 | 0 |
| 6 | 0 | 1 | 24 | 0 | 8a | 0 | 0 | 0 |
| 7 | 0 | 1 | 81 | 0 | 8a | 1 | 0 | 0 |
| 8 | 0 | 0 | 81 | 1 | 8a | 1 | 0 | 0 |
| 9 | 0 | 0 | 81 | 0 | 24 | 0 | 0 | 0 |
| 10 | 0 | 1 | 81 | 0 | 24 | 1 | 0 | 0 |
| 11 | 0 | 0 | 8f | 0 | 24 | 1 | 0 | 0 |
| 12 | 0 | 0 | 8f | 1 | 24 | 0 | 0 | 0 |
| 13 | 0 | 0 | 8f | 1 | 81 | 0 | 0 | 0 |
| 14 | 0 | 0 | 8f | 0 | 8f | 0 | 1 | 0 |
| 15 | 0 | 0 | 8f | 0 | 8f | 0 | 1 | 0 |

*Fig. 15B*

| State # | rst | enq | enq_data | deq | deq_data | num_enqs | num_deqs | num_over_high_wtr | max_entries | current_entries | stastitic_changed |
|---|---|---|---|---|---|---|---|---|---|---|---|
| 0 | 1 | 0 | xx | 0 | xx | 0 | 0 | 0 | 0 | 0 | 0 |
| 1 | 0 | 0 | xx | 0 | xx | 0 | 0 | 0 | 0 | 0 | 0 |
| 2 | 0 | 1 | 8a | 0 | xx | 1 | 0 | 0 | 1 | 1 | 1 |
| 3 | 0 | 0 | 8a | 0 | xx | 1 | 0 | 0 | 1 | 1 | 0 |
| 4 | 0 | 0 | 8a | 1 | 8a | 1 | 1 | 0 | 1 | 0 | 1 |
| 5 | 0 | 0 | 8a | 0 | 8a | 1 | 1 | 0 | 1 | 0 | 0 |
| 6 | 0 | 1 | 24 | 0 | 8a | 2 | 1 | 0 | 1 | 1 | 1 |
| 7 | 0 | 1 | 81 | 0 | 8a | 3 | 1 | 1 | 2 | 2 | 1 |
| 8 | 0 | 0 | 81 | 0 | 8a | 3 | 1 | 1 | 2 | 2 | 0 |
| 9 | 0 | 0 | 81 | 1 | 24 | 3 | 2 | 1 | 2 | 1 | 1 |
| 10 | 0 | 0 | 81 | 0 | 24 | 3 | 2 | 1 | 2 | 1 | 0 |
| 11 | 0 | 1 | 8f | 0 | 24 | 4 | 2 | 2 | 2 | 2 | 1 |
| 12 | 0 | 0 | 8f | 0 | 24 | 4 | 2 | 2 | 2 | 2 | 0 |
| 13 | 0 | 0 | 8f | 1 | 81 | 4 | 3 | 2 | 2 | 1 | 1 |
| 14 | 0 | 0 | 8f | 1 | 8f | 4 | 4 | 2 | 2 | 0 | 1 |
| 15 | 0 | 0 | 8f | 0 | 8f | 4 | 4 | 2 | 2 | 0 | 0 |
| #changes | n/a | n/a | n/a | n/a | n/a | no | no | yes | yes | 7 | 12 |
| low_freq | n/a | n/a | n/a | n/a | n/a | no | no | yes | yes | no | n/a |

*Fig. 16B*

SELECTION OF INITIAL STATES FOR FORMAL VERIFICATION

CROSS-REFERENCE TO COMPUTER PROGRAM LISTING APPENDIX

Appendix A contains the following file in one CD-ROM (of which two identical copies are attached hereto), and is a part of the present disclosure and is incorporated by reference herein in its entirety.

Volume in drive D is 030110_1128

Volume Serial Number is ED8F-77EC

| Directory of D:\ | |
|---|---|
| 01/10/2003 11:22a | 40,576 APPENDIXA.TXT |
| 1 File(s) | 40,576 bytes |
| 0 Dir(s) | 0 bytes free |

The software in Appendix A is used in some embodiments of the invention with a C Compiler, such as GNU Compiler (e.g. gcc 3.2) The software may be used to program any computer well known in the art, such as a SUN Solaris 2.7 machine with 500 MB memory, to create a programmed computer embodiment of the type described herein.

CROSS-REFERENCE TO RELATED APPLICATIONS

This application is related to and incorporates by reference herein in their entirety, each of the following commonly owned and copending U.S. patent applications:

Application Ser. No. 10/340,555, filed on Jan. 10, 2003, entitled "Reuse Of Learned Information To Simplify Functional Verification Of A Digital Circuit" by Jeremy R. Levitt et al;

application Ser. No. 09/635,598, filed Aug. 9, 2000, entitled "A Method For Automatically Generating Checkers for Finding Functional Defects in a Description of a Circuit" by Tai An Ly et al.; and application Ser. No. 09/849,005, filed May 4, 2001, entitled "Method for Automatically Searching for Functional Defects in a Description of a Circuit" by Chian-Min Richard Ho, et. al.; and application Ser. No. 10/174,379, filed Jun. 17, 2002, entitled "Measure of Analysis Performed In Property Checking" filed by Jeremy Rutledge Levitt et al.

BACKGROUND OF THE INVENTION

Exhaustively checking one or more properties in each and every possible state (e.g. of size 1000 bits) and each and every possible input combination to each state by simulation of a digital circuit (e.g. using test vectors) is prohibitively expensive. For this reason, digital circuits (portions thereof or in their entirety) are often analyzed by formal verification, to determine the validity of one or more properties (also called "assertions") that describe correct and incorrect behaviors in the circuit.

Formal verification of properties can use any of a variety of methods to prove that it is impossible to violate a given property, starting from an initial state of the digital circuit. Tools for formal verification of properties that are available in the prior art (either commercially or from public sources such as universities and laboratories) may be based on any of a number of techniques, such as (1) symbolic model checking, (2) symbolic simulation, (3) explicit state enumeration, and (4) satisfiability (SAT). For background on each of the just-described techniques, see, for example, the following references, each of which is incorporated by reference herein in its entirety:

(1) (a) article by J. R. Burch, E. M. Clarke, K. L. McMillan, D. L. Dill, and J. Hwang, entitled "Symbolic model checking: $10^{20}$ states and beyond", published in Information and Computation, Vol. 98, no. 2, June 1992; (b) another article entitled "Coverage Estimation for Symbolic Model Checking" by Yatin Hoskote, Timothy Kam, Pei-Hsin Ho, and Xudong Zhao, published in Proceedings of DAC 1999 (Best Paper Award), pp. 300-305, and (c) a PhD thesis by K. L. McMillan entitled "Symbolic model checking—an approach to the state explosion problem", Carnegie Mellon University, 1992;

(2) article entitled "Automatic Verification of Pipelined Microprocessor Control," by Jerry R. Burch and David L. Dill, published in the proceedings of International Conference on Computer-Aided Verification, LNCS 818, Springer-Verlag, June 1994;

(3) article entitled by E. M. Clarke, E. A. Emerson and A. P. Sistla entitled "Automatic verification of finite-state concurrent systems using temporal logic specifications" published in ACM Transactions on Programming Languages and Systems, 8(2):244-263, 1986;

(4) article entitled "Bounded Model Checking Using Satisfiability Solving" by Edmund Clarke, Armin Biere, Richard Raimi, and Yunshan Zhu, published in Formal Methods in System Design, volume 19 issue 1, July 2001, by Kluwer Academic Publishers; and (5) article entitled "Chaff: Engineering an Efficient SAT Solver" by Matthew W. Moskewicz, Conor F. Madigan, Ying Zhao, Lintao Zhang and Sharad Malik, published in the Proceedings fo the $38^{th}$ Design Automation Conference, June 2001.

In addition, see U.S. Pat. No. 5,465,216 granted to Rotem, et al. on Nov. 7, 1995, and entitled "Automatic Design Verification" (that is incorporated by reference herein in its entirety) for an additional example of a formal verification tool. See also U.S. Pat. No. 6,192,505 granted to Beer, et al. on Feb. 20, 2001, and entitled "Method and system for reducing state space variables prior to symbolic model checking" that is incorporated by reference herein in its entirety.

Formal verification tools available in the prior art for property checking include, for example, Symbolic Model Verification (SMV) software package available from Carnegie-Mellon University, the coordinated specification analysis (COSPAN) software package available from Bell Laboratories (e.g. at ftp.research.att.com), and the VIS package available from University of California, Berkeley (e.g. at www-cad.eecs.berkeley.edu/Respep/Research/VIS).

For additional information on formal verification tools, see C. Kern and M. R. Greenstreet, "Formal Verification in Hardware Design: A Survey," in ACM Trans. on Design Automation of Electronic Systems, vol. 4, pp. 123-193, April 1999 that is incorporated by reference herein in its entirety.

Such formal verification tools normally operate on a description of the digital circuit (also called "circuit-under-verification"), which is generated from a hardware description language (HDL) such as Verilog (see "The Verilog Hardware Description Language," Third Edition, Don E. Thomas and Philip R. Moorby, Kluwer Academic Publishers, 1996) or VHDL (see "A Guide to VHDL", Stanley Mazor and Patricia Langstraat, Kluwer Academic Publishers, 1992).

Therefore, during prior art testing of a digital circuit, properties or assertions about the correct and incorrect behaviors of the circuit may be checked using a formal verification tool. The properties are normally described using a HDL language such as Verilog or using a property specification language such as Sugar (e.g. available from IBM Research Labs, Haifa, Israel To validate the correctness of a digital circuit, the formal verification tool must check many properties. The properties may be checked individually sequentially or simultaneously. The formal verification tool may start from a single initial state (or from each of several initial states in a set) for each property.

See U.S. Pat. No. 6,102,959 granted to Hardin, et al. on Aug. 15, 2000 and entitled "Verification tool computation reduction" that is incorporated by reference herein in its entirety.

See also U.S. Pat. No. 6,311,293 granted to Kurshan, et al. on Oct. 30, 2001 and entitled "Detecting of model errors through simplification of model via state reachability analysis" that is incorporated by reference herein in its entirety.

Formal analysis of a property of a digital circuit requires an initial state. In certain prior art, the initial state is commonly chosen to be the reset state of the digital circuit. The reset state is determined by asserting the reset signal of the digital circuit during simulation. More complex circuits may require a sequence of vectors, known as the reset sequence, to place the circuit into the reset state during simulation. Due to the size and complexity of today's digital circuits, a complete formal analysis of the circuit from the reset is not possible due to explosion in the number of potential states in which a digital circuit may exist. For a description of state explosion, see for example, the above-referenced PhD thesis by K. L. McMillan.

Due to the problem of explosion in the number of potential states in which a digital circuit may exist, formal verification tools typically take either of the following approaches to attack the problem of proving a property:

1. design abstraction—perform transformations to reduce and abstract the circuit while ensuring that the formal verification results on the transformed circuit are applicable to the original circuit, see for example, the above-referenced U.S. Pat. No. 6,311,293 granted to Kurshan, et al.; and
2. bounded analysis—entitled "Bounded Model Checking Using Satisfiability Solving" by Edmund Clarke, Armin Biere, Richard Raimi, and Yunshan Zhu, published in Formal Methods in System Design, volume 19 issue 1, July 2001, by Kluwer Academic Publishers.

Various methods of bounded analysis are well known in the art although bounded analysis can use SAT solvers of the type described in "Chaff: Engineering an Efficient SAT Solver" by Matthew W. Moskewicz, et. al., and U.S. Pat. No. 6,292,765 granted to Ho, et. al. on Sep. 18, 2001 and entitled "Method for 10 automatically searching for functional defects in a description of a circuit" that is incorporated by reference herein in its entirety.

Such prior art approaches normally use an initial state (e.g. reset) for formal analysis.

SUMMARY

A computer when programmed in accordance with the invention (also called "automatic state selector"), automatically selects one or more states (that form a subset) from among a set of states in the simulation of a digital circuit. States that are automatically selected in certain embodiments of the invention are each used as an initial state by a formal verification tool. Such a subset of states can form the initial states for any prior art or new approach to formal analysis, including the above-described (a) design abstraction and (b) bounded analysis. Formal analysis using initial states that are automatically selected in several embodiments increases the likelihood of finding defects, as compared to, for example, starting from a reset state.

In some embodiments, when performing automatic state selection, a programmed computer uses one or more user inputs of the type commonly identified to a formal verification tool for its normal operation. For example, in some embodiments, one or more criteria that are used in automatically selecting the initial state(s) may be based on a property (also called "assertion" or "checker") or a corner case that is to be validated by the tool. Such a corner case and/or property is commonly identified to a formal verification tool, either via user input or a library. In other embodiments, user inputs to a formal verification tool are not used, and instead other criteria for automatic selection of initial states may be based on the digital circuit to be analyzed and/or signals to be monitored, as discussed next.

Other criteria for automatic state selection in accordance with the invention include: (a) states on entry into which a statistic that is being monitored changes value, (b) states that satisfy one or more user-specified criteria, (c) states on entry into which a value of a circuit element changes, wherein the circuit element drives a signal used in a property being checked, (d) states on entry into which a metric changes value, wherein the metric is any coverage metric well known in the art (e.g. line coverage, branch coverage, path coverage, toggle coverage, state coverage, arc coverage, transition coverage, pair state coverage and pair arc coverage); (e) states on entry into which a metric selected by the user changes for the first time; and (f) states on entry into which a metric selected by the user changes least frequently (or at a frequency below a predetermined amount or predetermined percentage).

In addition, other embodiments may have variations on the just-described criteria, as will be apparent to the skilled artisan in view of the disclosure. For example, another criterion (g) is a variation of criterion (c) discussed above, in which there is a change in a signal that is generated by a checker (which could be a signal internal to the checker or supplied by the checker), and yet another criterion (h) is a variation of criterion (e) discussed above, which chooses a state in which a metric that has changed at most a predetermined number of times (e.g. if the number is predetermined to be 4, then use of this criterion selects the states in which the metric changes for the first time, the second time, the third time, and the fourth time, but does not select states in which the metric changes for fifth time or any more times).

In still another example, a variation of the above-described criteria (a)-(h) is to pick not just one state when applying these criteria, but to pick one or more states that occur within a predetermined time window during simulation around that state (i.e. select one or more states before the selected state and/or one or more states after the selected state) thereby to select a set of states instead of just one state. For example, when applying such a variation of criterion (a), not only is a state selected by application of criterion (a) but also 5 states before and 5 states after the selected state are also selected, thereby to yield a set of eleven states that have been selected by application of this variant of criterion (a).

In several embodiments, one or more such selection criteria may be predetermined and preprogrammed into a computer that performs the selection of initial states. Still other embodiments may use a combination of two or more of the above-described criteria. Moreover, also depending on the embodiment, some selection criteria may be provided as user inputs while other selection criteria may be predetermined.

One or more subset of states that are selected using one or more of the above-described criteria are used directly by a formal verification tool as its initial states, in several embodiments. However, in other embodiments, use of the criteria is merely an initial state in a multi-stage process that is performed prior to formal verification. For example, in some embodiments, an act of selecting (also called "primary selecting") is performed using one or more criteria of the type described above (also called "primary criteria"), to identify states (called "intermediate states") which are to be subjected to further selection.

In the just-described embodiments, an act of further selecting (also called "secondary selecting") is performed on the intermediate states, to identify one or more states that are to be used as starting points for formal analysis. Depending on the embodiment, such a secondary selecting may be based on one or more additional criteria (also called "secondary criteria"), such as the frequency of occurrence of a state, and/or removal of duplicate and erroneous states. In certain embodiments, after a subset of states has been selected (either by primary selecting alone, or by a combination of primary and secondary selecting), the subset of states are prioritized, and then the states are provided in the prioritized order to the formal verification tool.

BRIEF DESCRIPTION OF THE DRAWINGS

FIG. 4 illustrates a prior art description of the device of FIG. 3 in the Verilog hardware description language (HDL).

FIG. 4A illustrates, in a table, the various ports of the prior art FIFO of FIG. 3, and a description of the signal at each port, and the range of values of the signals.

FIG. 4B illustrates, in a table, the various circuit elements of the prior art FIFO of FIG. 3, a description of function performed by the circuit element, and the range of values of signals in the circuit elements.

FIG. 5A illustrates, in a table, values of prior art signals shown in FIG. 5.

FIG. 5B illustrates, in a table, values of prior art signals in the circuit elements that hold state for the simulation shown in FIG. 5.

FIG. 5C illustrates prior art properties of the FIFO that are to be tested.

FIG. 7 illustrates, in a conceptual drawing, casting of three properties into their respective implications, parsing of the implications to identify antecedents, and generation of selection criteria from the antecedents, in several embodiments of the invention.

FIG. 7B illustrates, in a table form, values of the signals illustrated in FIG. 7A.

FIG. 7D shows a table of values that correspond to the waveform in FIG. 7C.

FIG. 8 illustrates, in a in a conceptual drawing, expression of two corner cases, and a combination of the two corner cases, and selection criteria generated from the corner cases, that are used in several embodiments of the invention.

FIG. 8C shows a table of values that correspond to the waveform in FIG. 8B.

FIG. 9A illustrates, in a table form, values of the signals illustrated in FIG. 9.

FIG. 10 illustrates, in a conceptual drawing, expression of a property specified by a user in some embodiments of the invention.

FIG. 11 illustrates a snippet of a prior art description (in Verilog) of a circuit that uses the FIFO device of FIG. 3.

FIGS. 15A and 15B illustrate, in a graph and a table respectively, use of the new activity criterion to select states as per FIG. 15.

FIGS. 16A and 16B illustrate, in a graph and a table respectively, use of the low frequency criterion to select states as per FIG. 16.

DETAILED DESCRIPTION

When verification of a description of a digital circuit is done by simulation, there are a large number of states of the digital circuit that are visited during the simulation, and each of these states can potentially be used as an initial state for formal analysis. Instead of choosing every state visited during simulation as an initial state, one or more states from the simulation are selected automatically in accordance with the invention, for use as an initial state for formal analysis. Depending on the embodiment, starting formal analysis from such automatically selected states (also called "seeds") can find a large percentage (e.g. greater than 50%) of unique counter-examples that are normally found only by selecting every state of the simulation as an initial state. As would be apparent to the skilled artisan, counter-examples are examples that show violation of a property, indicating a flaw in the design.

Therefore, formal analysis can be used effectively in certain embodiments of the invention, as a tool to find defects in a design of a digital circuit without having to start from every state in the simulation (thereby to avoid the state space explosion). In many embodiments, the states from which formal analysis is to be started are not arbitrarily selected (either by a user or at random), and instead the states are selected methodically, using one or more criteria that are applied to one or more states in the simulation, to select initial states for formal analysis. Although in several embodiments state selection for formal analysis is not done at random and not manually picked by the user, in other embodiments a small number of states for use in formal analysis may be selected at random or selected by the user. In most embodiments, at least a majority of selected states (i.e. >50%) are selected by applying one or more predetermined criteria, while the remaining selected states may be selected by any method well known in the art.

The number of counter-examples that are found by such automatically limited formal analysis depends on a number of factors, such as the type and complexity of properties specified by the user to be used for formal analysis, and the size and complexity of the digital circuit description being verified. In several embodiments, formal verification is performed on a digital circuit by conducting multiple formal analyses of the circuit using multiple sets of initial states, with each set being automatically picked by a computer programmed in accordance with the invention.

The multiple formal analyses may be performed either sequentially or in parallel, depending on the embodiment. In several embodiments, such automatically limited formal analysis is performed without any test vectors.

Figure 1:
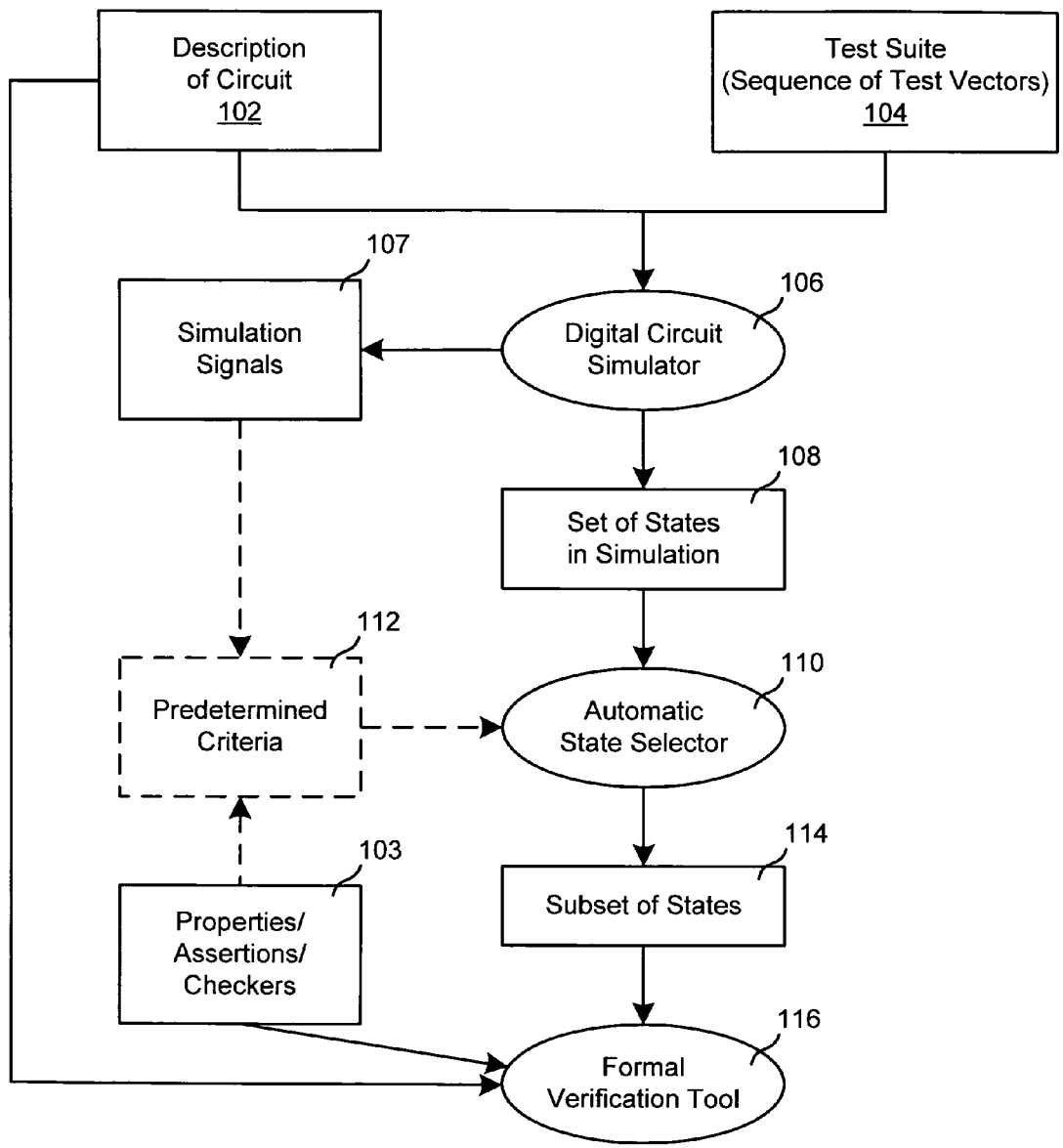
FIG. 1 illustrates, in a high level data flow diagram, use of a computer programmed in accordance with the invention, to automatically select a subset of simulation states, to be used in formal verification.

Given a set of states of a digital circuit that are generated by simulating the circuit description with its entire test suite, various embodiments of a computer programmed in accordance with the invention use one or more predetermined criteria to choose one or more simulation states as initial states for formal analysis. FIG. 1 illustrates a data flow diagram of an automatic state selection process executing in a computer programmed in accordance with the invention. In several embodiments, a description 102 of a digital circuit is provided by a user in a Hardware Description Language (HDL), such as Verilog or VHDL.

Depending on the embodiment, circuit description 102 is simulated by use of a commercially available digital circuit simulator 106, such as VCS from Synopsys or Ncverilog from Cadence. In such embodiments, the user also provides a set of tests (also called "test suite") for use in testing the circuit that is described in description 102. Depending on the embodiment, test suite 104 may include other items, such as instructions to simulator 106 and/or comments and or properties (also called "checkers" or "assertions") and/or corner case definitions. A user may create a test suite 104 to verify the functionality of a design under test (DUT). The test suite 104 is frequently designed to drive the DUT to states that would exercise and stress the legal functionality of the DUT. Such a test suite 104 is normally used with a simulator to dynamically verify the functionality of the DUT.

Digital circuit simulator 106 applies test suite 104 to circuit description 102 in the normal manner. The process of simulating a digital circuit with each test vector moves the circuit simulation from one state to another state. A state of simulation includes the values of all sequential elements in the design of the circuit, such as registers, latches and memories. In some embodiments, the value of each state is stored in a compressed form in a manner similar or identical to a conventional simulator, and depending on the embodiment, the states may be stored in a file that can be accessed from outside of the simulator.

Depending on the embodiment, a simulation state may include other items, such as values of statistics signals and/or values of properties. The process of simulating the circuit described by description 102 with a sequence of test vectors 104 results in simulator 104 taking the design through a sequence of states 108. States 108 may be available as an output of simulator 106.

As noted elsewhere, the number of states 108 that are generated by simulator 106 is typically too large to permit a complete formal analysis of a digital circuit of any reasonable size (e.g. on the order of hundred thousand gates). For this reason, one or more states 114 are automatically selected from the set 108 by a computer programmed with software in accordance with the invention, also called automatic state selector 110. Each selected state 114 is suitable to be used as an initial state for a formal verification tool 116.

Formal verification tool 116 can be any tool suitable for formal analysis, and may perform, for example, static formal verification, model checking, property checking, theorem proving, semi-formal verification and dynamic formal verification. Depending on the embodiment, such a formal verification tool 116 may use algorithms to analyze the state space of a DUT to either validate that a specified assertion is always true irrespective of any sequence of values on the DUT's input ports or it may find a counter-example as a sequence of values on the DUT's input ports that result in the violation of an assertion. In order to ensure that a formal verification tool 116 considers only legal sequences of values on the DUT's input ports, certain embodiments in accordance with the invention require the user to constrain the DUT's input ports via specification of a set of "constraints". Such constraints can be specified by the user in any predetermined language, and/or in a built-in primitive, and/or in an element in a library of assertions and/or constraints or any combination thereof. For sources of commercially available formal verification tools, see the following:

(1) SMV—from Carnegie Mellon University (2) Formal Check from Cadence Design Systems Selection of one or more of states 108 may be performed based on one or more predetermined criteria 112 (also called "selection criteria") which may be provided by a software vendor, e.g. pre-programmed into automatic state selector 110. Alternatively, one or more selection criteria 112 may be provided by a user's input to selector 110 (in which case such criteria are also referred to as "user-specified" criteria). Regardless of whether provided by vendor or user, in several embodiments such criteria are determined ahead of state selection, and in such embodiments the criteria are referred to as being predetermined.

Figure 2A:
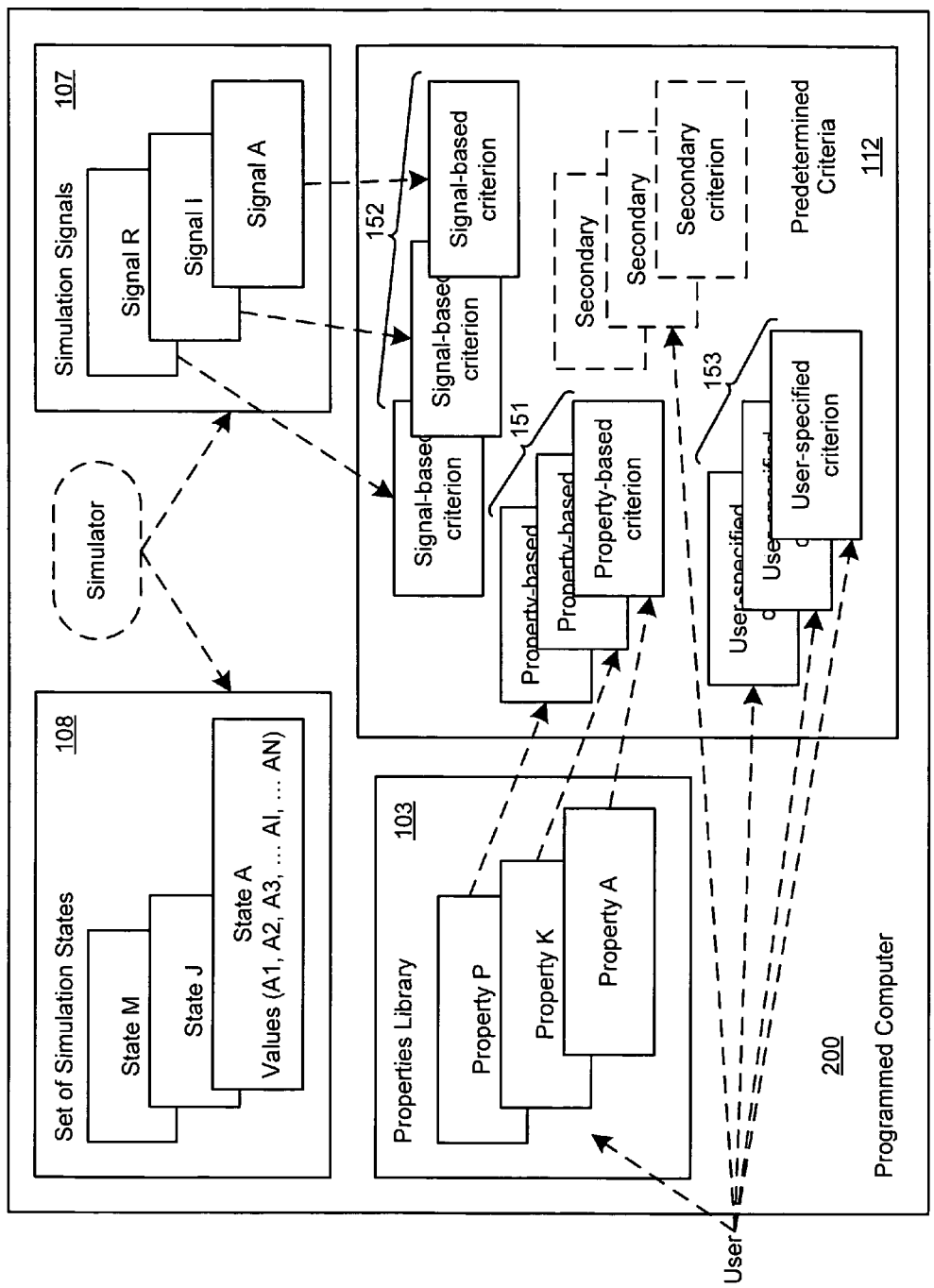
FIG. 2A illustrates various items of data that are held in memory of one embodiment of the programmed computer illustrated in FIG. 1.

Predetermined criteria 112 (FIG. 2A) that are used for automatic state selection in several embodiments may be based on properties (see criteria 151 in FIG. 2A) that are to be verified and/or based on signals that are generated during simulation (see criteria 152 in FIG. 2A). Examples of properties (also called "assertions" or "checkers") that may be used for identifying state selection criteria are described in the following references, each of which is incorporated by reference herein in its entirety:

(1) U.S. Pat. No. 6,175,946 granted to Ly, et al and entitled "Method for automatically generating checkers for finding functional defects in a description of a circuit"; and (2) CHECKERWARE® DATA BOOK version 1.4.1 published May 2002, by 0-IN DESIGN AUTOMATION, Inc. 1784 Technology Drive, San Jose, Calif. 95110.

Assertions can be specified by a user in a predetermined language, or as a built-in primitive, or as an element in a library of assertions or any combination of such assertions, as would be apparent to the skilled artisan in view of the disclosure.

Moreover, one example of a signal-based selection criterion is a specific value (i.e. the binary value 0 or 1) of a circuit element in the fanin cone of a property that is known to eventually affect the property. Another example of a signal-based criterion is the set of states traversed during simulation (e.g. a coverage metric) of the type described in the following references each of which is incorporated by reference herein in its entirety:

(1) Ho, R., et al., "Validation Coverage Analysis for Complex Digital Designs", IEEE/ACM International Conference on Computer-Aided Design, San Jose, Calif., Digest of Technical Papers, Nov. 10-14, 1996, pp. 146-151;

(2) Devadas, S., et al., "An Observability-Based Code Coverage Metric for Functional Simulation", IEEE/ACM International Conference on Computer-Aided Design, Nov. 10-14, 1996, pp. 418-425; and (3) Geist, D., et al., "Coverage-Directed Test Generation Using Symbolic Techniques", Formal Methods in Computer-Aided Design, First International Conference, FMCAD 0.96, Palo Alto, Calif., Nov. 6-8, 1996, pp. 142-159. Several examples of each of the above-described two types of criteria, namely property-based criteria and signal-based criteria are identified below:

1. Property-based (either library-based or user-specified)
   a. Antecedent
   b. Consequence
2. Signal-based (either library-based or user-specified)
   a. Circuit-based
   b. Coverage-based (e.g. line, branch, path, toggle, expression, state, arc, pair-arc)
   c. Statistics-based As noted above, such criteria may be specified in software, e.g. in a library 103 (FIG. 2A), or derived from simulation signals 107. Alternatively, such criteria 153 (FIG. 2A) may be specified by a user, e.g. in a script file. The time at which such criteria are specified, and the format in which the criteria are specified are not critical aspects of the invention and they depend on implementation in the different embodiments.

In some embodiments, property-based selection criteria are derived from a library 103 (FIG. 1) of properties that are normally used by a formal verification tool 116 (FIG. 1) during formal analysis. For examples of such properties, see U.S. Pat. No. 6,175,946 which is incorporated by reference herein in its entirety. As noted above, in alternative embodiments, such property-based selection criteria may also be manually derived by a user, based on assumptions and/or characteristics that are inherent to a device and not previously articulated in property library 103.

Depending on the embodiment, in addition to the just-described selection criteria, there may be additional criteria, such as selection criteria specified by the user, selection criteria specified in a library, and/or certain elimination criteria (e.g. screening out duplicate states and/or erroneous states from the set of all states 108).

Figure 2B:
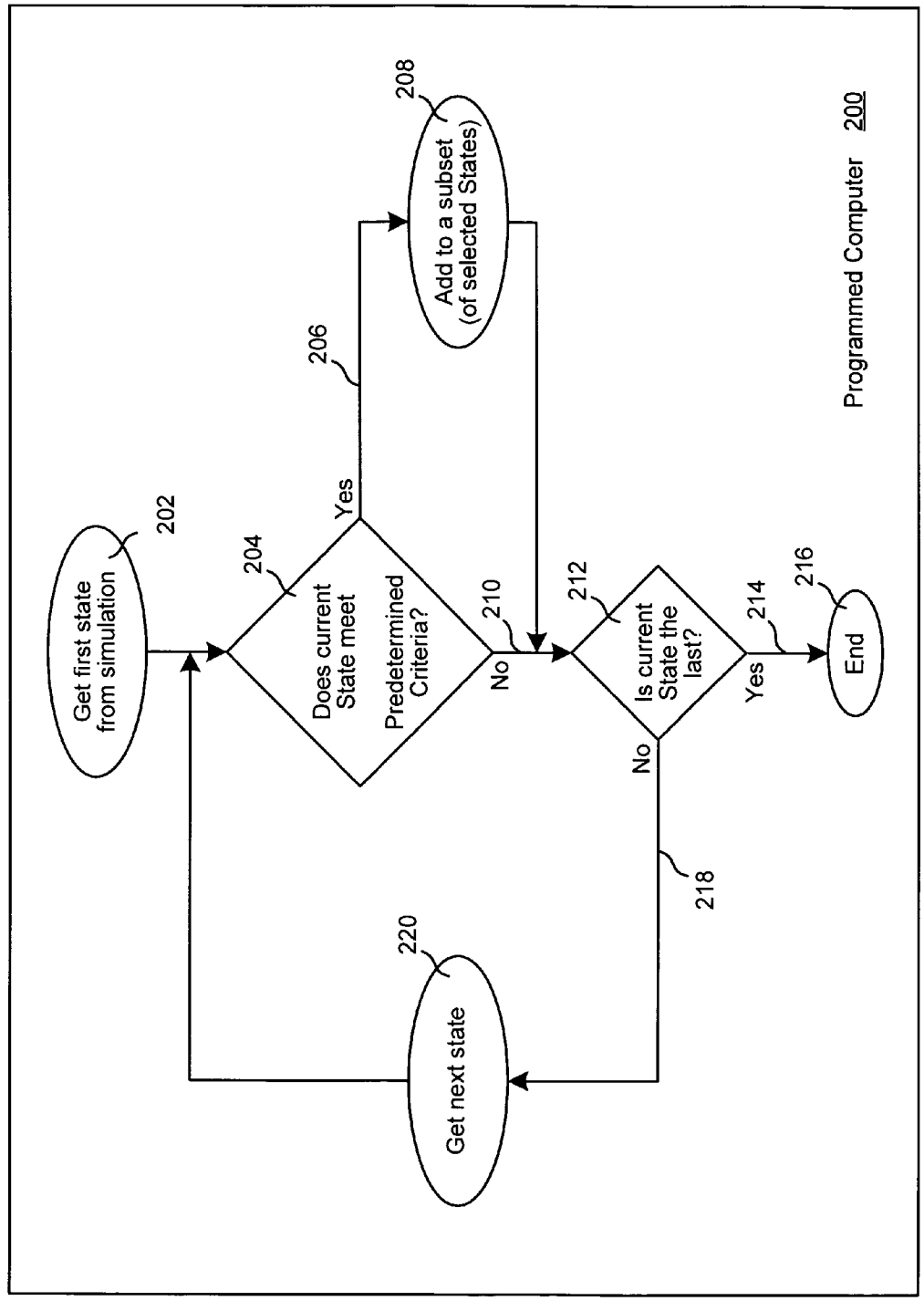
FIG. 2B illustrates, in a flow chart, acts performed by one embodiment of the programmed computer of FIG. 1 to identify a subset of states.

FIG. 2B illustrates, in a flow chart, a method used by a programmed computer 200 to implement an automatic state selector 110 (FIG. 1) in one embodiment by applying certain predetermined selection criteria 112 on the set of all simulation states 108. In one embodiment, the method begins by picking the very first state provided by digital circuit simulator 106 (see act 202) to be the current state, and checking if the current state satisfies the selection criteria (see act 204).

If the current state satisfies the selection criteria (see branch 206), the current state is added to a list which is to identify the selected states (see act 208) and then act 212 is performed. Although a list is being described as the data structure being used for holding a set of selected states, any other data structure that is well known in the art (such as an array) may be used in accordance with the invention, to hold a set of selected states. If the current state does not satisfy the selection criteria (see branch 210) then act 212 is performed. In act 212 if the current state is not the last simulation state, the next simulation state (see act 220) is selected as the current state for checking against the selection criteria (see act 204). If the current state is the last simulation state (see branch 214 out of act 212), then the selection process terminates (see act 216). After termination, the states that were selected (see act 208) are used as initial states for formal verification by tool 116 (FIG. 1).

If there is only one predetermined criterion, the above-described act 204 can be performed simply by substituting values of the current state into a predetermined formula (which is derived from the predetermined criterion), and if the result of the substitution matches a predetermined result then branch 206 is taken else branch 210 is taken. If a number of predetermined criteria are to be checked, e.g. to see if a current state satisfies any of these criteria, then acts 231-237 (see FIG. 2C) are performed.

Figure 2C:
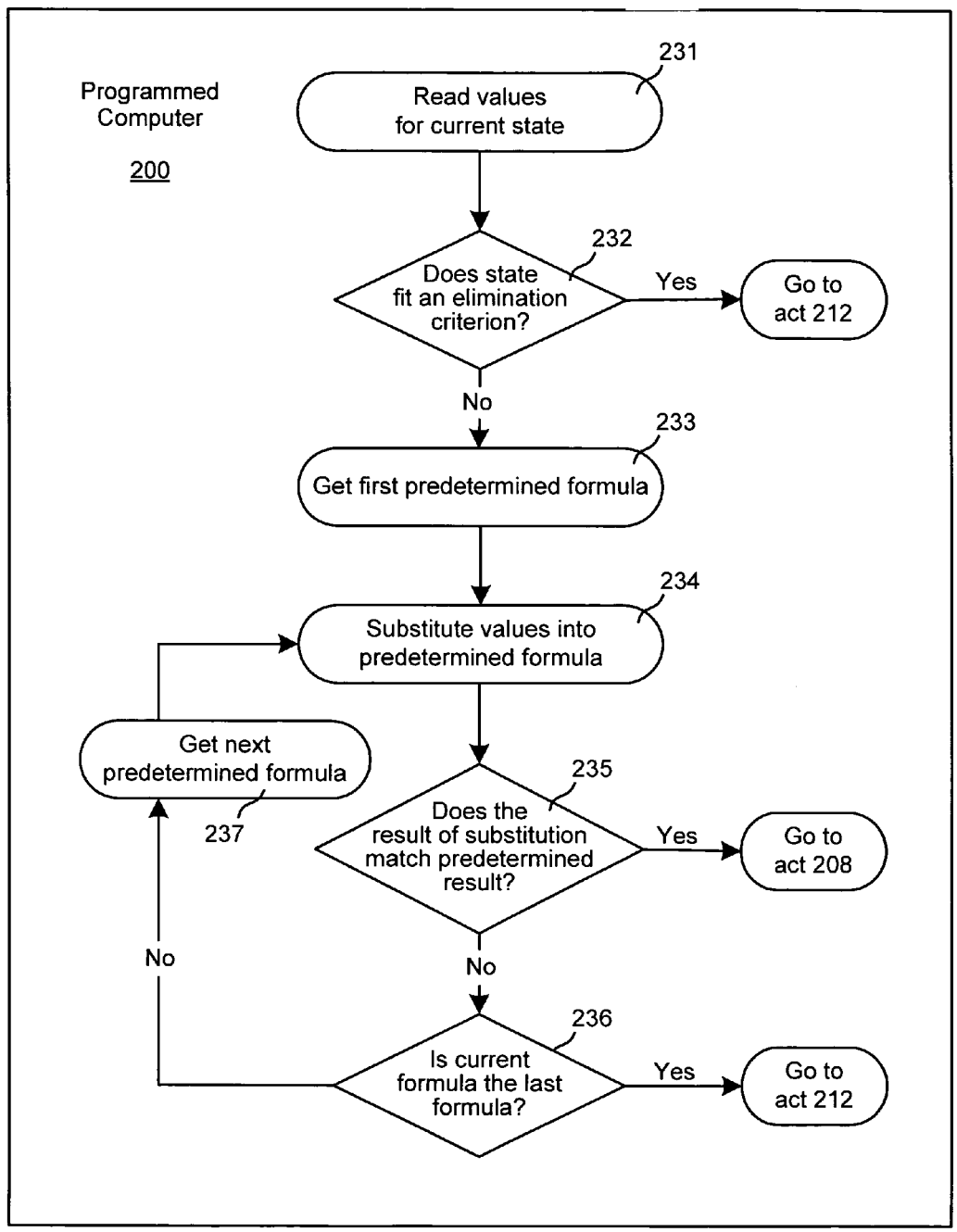
FIG. 2C illustrates, in another flow chart, acts performed by one embodiment of the programmed computer to check if a current state meets one or more predetermined criteria as per act 204 of FIG. 2B.

Although a sequential process has been illustrated in FIGS. 2B and 2C, two or more of the illustrated acts can be performed in a different order than the shown order or even performed simultaneously with one another. Also, not all of the illustrated acts may be performed, depending on the embodiment. For example, act 232 may be skipped in certain embodiments in which a large subset of states (as compared to a subset obtained by elimination) need to be generated for use in formal analysis.

In some embodiments, act 232 may be performed after generation of such a large subset of states, for example to implement a multi-stage process of the type illustrated in FIG. 2D and described below. Furthermore, depending on the embodiment, several selection criteria may be combined into a single Boolean formula, and application of the single Boolean formula provides an indication of whether or not a current state is to be selected, e.g. included in the subset of states to be used as initial states in a formal verification tool.

Certain embodiments implement a multi-stage process between generation of a set of states by simulation of a description of a digital circuit and use of a subset of states by a formal verification tool. Specifically, in several embodiments an automatic state selector 250 in accordance with the invention selects states in a two stage process, wherein during one stage (called "primary selecting") 251, one or more subset(s) of states 252 are selected from the entire set of simulation states 108 (FIG. 2D), and in another stage (called "secondary selecting") 253, a smaller subset of states 254 is selected from among states in the one or more subset(s) 252 that have been selected by primary selecting 251.

Primary selecting 251 uses one or more criteria (called "primary criteria") 260 which include the above-described user-specified criteria 261, property-based criteria 262 and signal-based criteria 263. In some embodiments, primary selecting 251 is performed using one criterion to select one set of states, and primary selecting 251 is repeated with other criteria, thereby to eventually select a number of sets of states.

Alternatively, primary selecting 251 may be performed in a single act, by applying all primary criteria together (e.g. using a single Boolean formula).

Secondary selecting 253 is performed not on all states in the simulation 108, but only on the one or more subset(s) 252 that have been identified by primary selecting 251, thereby to yield a smaller subset 254 of states that are to be used as starting points for formal analysis. Therefore, secondary selecting 253 uses one or more criteria (called "secondary criteria") 270 which include two types of criteria: exclusion criteria 272 which identify states that are to be removed from the one or more subset(s) 252, and inclusion criteria 276 which identify states that are to retained in one or more subset(s) 252.

Examples of exclusion criteria 272 that may be used during secondary selecting 253 include the following criteria: (a) exclusion of duplicate states 273, (b) exclusion of error states 274, (c) exclusion of states that are located within a predetermined number of transitions from reset 275. Examples of inclusion criteria 276 that may be used during secondary selecting 253 include the following criteria: (a) inclusion of states that satisfy multiple primary criteria 277, (b) inclusion of states by transitioning in to which, a change in a signal happens for the very first time from reset (also called "new activity") 278, and (c) inclusion of states by transitioning into which there is a change in a signal that normally changes at a very low frequency as compared to other signals (also called "low frequency of change") 279.

Depending on the implementation, one or more exclusion criteria may be expressed as inclusion criteria and vice versa.

For example, exclusion of duplicate states may be expressed as inclusion of only unique states, and exclusion of error states may be expressed as inclusion of only operational states (i.e. non-error states).

As another example, inclusion of states that satisfy multiple criteria may be expressed as exclusion of states that satisfy only one criterion, and inclusion of states with low frequency of change may be expressed as exclusion of states with high frequency of change.

In several embodiments, subset of states 254 that are generated by secondary selecting 253 are provided directly to formal verification tool 116 as illustrated by arrow 257. However, certain other embodiments include another stage in which a prioritizer 255 re-arranges the order in which the states are arranged thereby to generate a prioritized subset 256 that is then supplied to formal verification tool 116. Such prioritization may be useful in situations that impose limits on the amount of time and/or resources that may be used by formal verification tool 116. Such a prioritizer 255 may perform prioritization of states based on a number of factors, such as, for example: primary selection criteria, secondary selection criteria, time-order in which the states occur during simulation, test bench, test bench chunk, and user specified order. In one embodiment, states are automatically selected by use of test benches as follows: one or more test benches in a test suite are used to generate a number of test vectors, and during simulation a predetermined slicing method is performed (e.g. every 500 clocks of simulation) to identify the states selected for verification, by formal analysis.

Numerous modifications and adaptations of the methods and apparatuses described herein will be apparent to the skilled artisan in view of the disclosure. For example, as discussed above, some embodiments may implement a single stage of primary selecting 251 and one or more subset of states 252 generated thereby may be supplied directly to formal verification tool 116, as illustrated by dashed arrow 258. Other embodiments may omit the secondary selecting 253 but implement the other two stages, namely primary selecting 251 followed by prioritizer 255 as illustrated by dashed arrow 259.

Moreover, still other embodiments may interleave and/or integrate performance of two or more stages, e.g. after performance of one or more acts of primary selecting 251 to generate a first subset of states, one or more acts of secondary selecting 253 may be performed (e.g. screening out of error and/or duplicate states from the first subset), followed by repeating performance of primary selecting 251 to generate a second subset of states, followed by one or more acts of secondary selecting 253 (e.g. one or more states common to first and second subset may be retained).

Also, certain embodiments may interleave and/or integrate the acts of secondary selecting 253 with one or more acts of prioritizing, whereby each time a state is selected by secondary selecting 253, that state is placed at a specific location among states to be supplied to the formal verification tool, and thereafter the just-described acts are performed repeatedly, thereby to assemble an ordered set of states.

Furthermore, although certain criteria are described herein as illustrative examples, any number of such criteria will be apparent to the skilled artisan in view of the disclosure. For example, instead of or in addition to a criterion for new activity, there may be a criterion for last activity that selects the states by transitioning in to which, a change in a signal happens for the very last time before the simulation ends.

Numerous such modifications and adaptations of the criteria described herein, as well as other such criteria will be apparent to the skilled artisan in view of the disclosure. Application of the above-described criteria in certain embodiments is described below in the context of an exemplary prior art circuit 300 (FIG. 3) which implements a queue, or First-In, First-Out device (commonly referred to as a "FIFO"). The FIFO 300 can be used to store data. After storage of data in the FIFO 300, at a later time, the stored data can be retrieved from the FIFO 300, in the order in which it was stored. In this example, a maximum of two bytes of data can be stored in the FIFO 300 although as will be apparent to the skilled engineer, any number of bytes may be stored in such a FIFO, depending on the amount of memory and size of the counters (i.e. the enque and/or deque counters) used in its implementation.

In this prior art example, in a single cycle either at most one byte of data can be stored (i.e. enqueued) in the FIFO 300, or at most one byte of data can be retrieved (i.e. dequeued) from the FIFO 300, although as will be apparent to the skilled engineer, such an implementation of the FIFO 300 can be extended so that any number of bytes may be stored or retrieved in a single cycle. In this prior art example, the FIFO 300 is a synchronous device which is activated on the rising edge of a signal 304 on the line 'clk' and an active-high asynchronous signal 302 on the line 'rst'. When signal 306 on port 'enq' is high, the FIFO 300 writes the value 310 on port 'enq_data' into a memory element 318, at the address identified by write pointer signal 320 which is held in a register 'enq_ptr'.

A multiplexer 328 in FIFO 300 selects whether the write pointer or the read pointer is presented to the address port of the memory element 318, based on signal 322 which is held in register 'deq_ptr'. The signal on the control port 330 of the multiplexer 328 is computed by a combinational logic 324 based on the value of signal 306 on port 'enq' and the value of signal 308 on port 'deq'. The same combinational logic 324 drives an empty signal 316 or a full signal 314 to the output ports of the FIFO 300 based on the value of the read pointer 322 and write pointer 320 and whether the last operation to the FIFO 300, stored in register 326, was an enqueue or dequeue on the current state.

Specifically, if the value of read pointer 322 is the same as the value of write pointer 320 and the value on the last operation register 326 indicated that the last operation to the FIFO 300 was an enqueue operation then the FIFO 300 is full and will drive the full signal 314 to logic one and will drive the empty signal 316 to logic zero. Alternatively, if the values of read pointer 322 and write pointer 320 are the same and the last operation register 326 indicated that the last operation to the FIFO 300 was a dequeue operation, then the FIFO 300 is empty and drives the empty signal 316 to logic one and drive the full signal 314 to logic zero.

If the values of the read pointer 322 and the write pointer 320 are not the same, the FIFO 300 will drive both the full signal 314 and the empty signal 316 to logic zero. Data is dequeued from the FIFO 300 on the rising edge of 'clk' signal 304 when the value 'deq' signal 308 on port is high. The data can be sampled on the 'deq_data' (312) port on the following rising edge of 'clk' (304).

Figure 3:
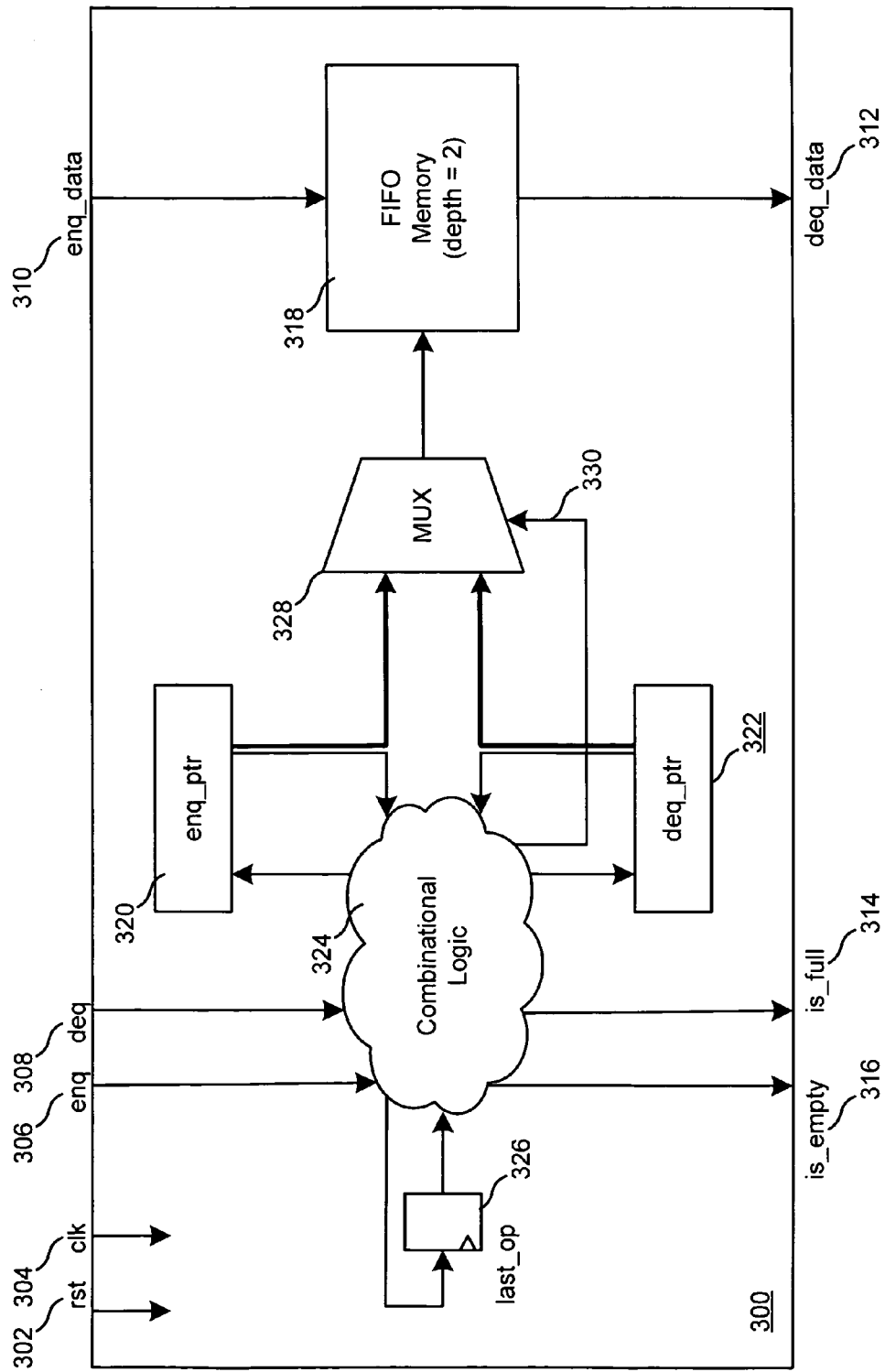
FIG. 3 illustrates, in a circuit diagram, a prior art device to implement a First-In First-Out queue (FIFO).

FIG. 4 illustrates a prior art description 400 of the FIFO 300 of FIG. 3, in the Verilog Hardware Description Language. Such a description is typically provided by circuit designers, and may contain one or more design flaws. Simulation of the circuit description 400 is normally performed in order to identify design flaws. In FIGS. 3 and 4, all the circuit elements and their corresponding descriptions are identified by reference numbers that have the following relationship: subtract 100 from reference numbers in FIG. 4 to find a corresponding reference number in FIG. 3. For example, combinational logic 324 illustrated as a cloud in FIG. 3 is described in FIG. 4, as the right-hand-side of the continuous assignment statements 424; multiplexer 328 in FIG. 3 is described by two if statements 428 in FIG. 4; and a control line 330 (FIG. 3) of multiplexer 328 is described by conditional expressions 430 and 432 in the if statements in FIG. 4.

FIG. 4A shows a range of legal values that can occur in each signal on each port of the FIFO illustrated in FIG. 3. Specifically, clock signal 404, reset signal 402, enqueue signal 406, dequeue signal 408, is_full signal 414 and is_empty signal 416 can have a logic value 0 or logic value 1, and enq_data signal 410 and deq_data signal 412 have values in the range 0-ff (hexadecimal).

FIG. 4B describes the range of legal values of each signal (i.e. enq_ptr signal 420, deq_ptr signal 422, last_op signal 426 and fifo_mem signal 418) that occur in the circuit elements in FIG. 3 that hold state, i.e. hold values over more than one clock cycle. The combination of the values held by the circuit elements in FIG. 4B over a single clock cycle constitute a state of the FIFO in FIG. 4 for that clock cycle (and this state is indicated by a 'state_num' signal 501 in FIG. 5). The combination of the current state of the FIFO (as per signal values in FIG. 4B) and the values of the signals at the input ports of the FIFO at the next rising edge of the clock (as per signal values in FIG. 4A) determine the next state of the FIFO.

Note that, since the FIFO merely stores the enqueued data and retrieves the data in the order enqueued at a later time, the value of the data is not used to determine the state of the FIFO. Hence, for the purposes of this example, the state of the FIFO is constituted by the values of the read pointer 322, write pointer 320 and the last operation register 326. The next state of the FIFO is determined by the current state, and the values of the signals at reset port 302, enqueue port 306 and dequeue port 308, at the rising edge of the signal on clock port 304.

Figure 5:
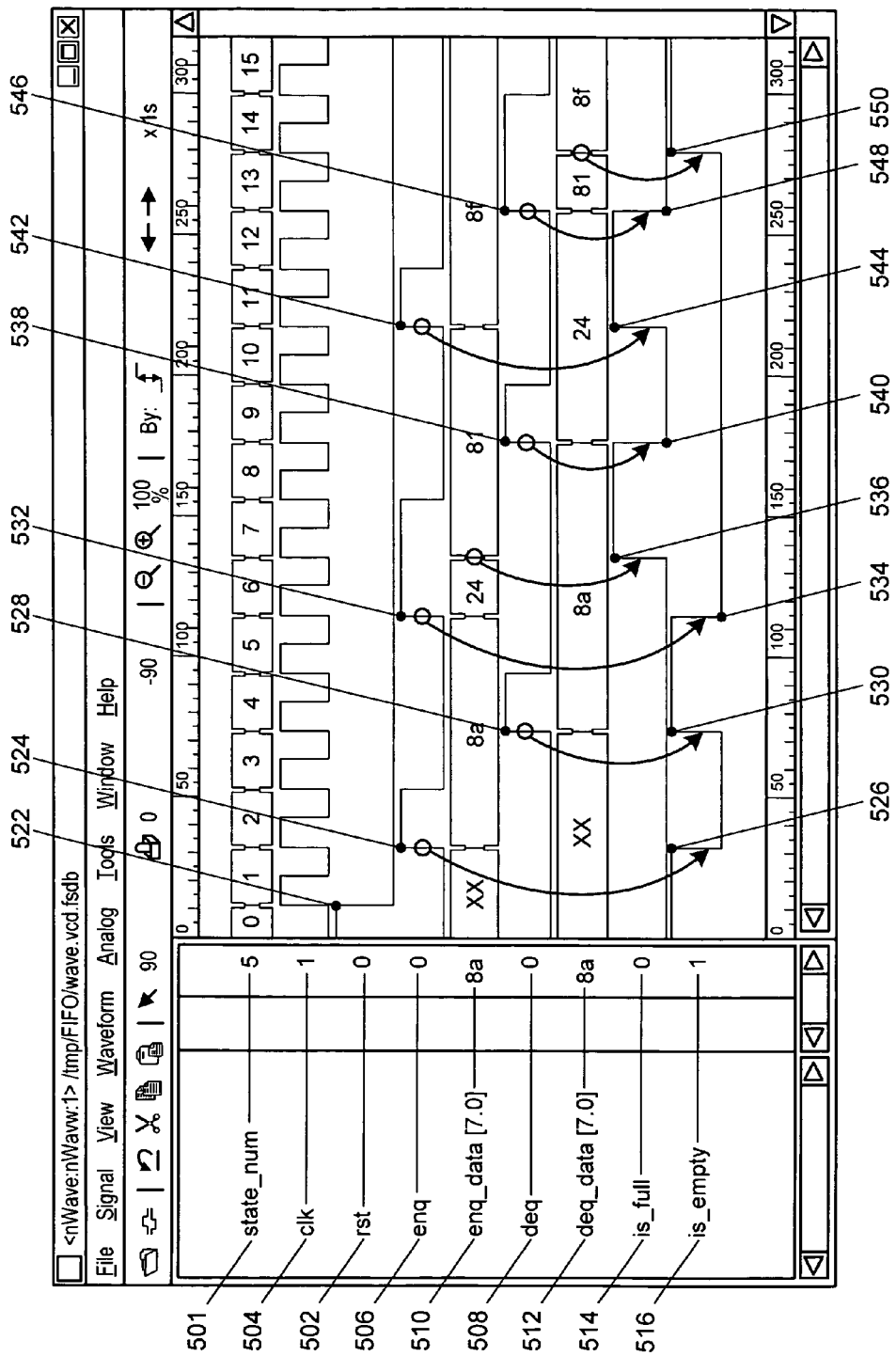
FIG. 5 illustrates waveforms of signals for a typical use of the prior art FIFO.

A sequence of conventional operations of prior art FIFO 300 is now described. Such a sequence of operations may be specified in, for example, one or more test vectors that are to be applied in testing the circuit description during simulation. FIG. 5 illustrates, in a timing diagram, signals generated over time, during a typical use of the FIFO. The waveform diagram includes a "state_num" signal 501 which is used to identify each state of the FIFO (during the just-described use). The signals shown are those that occur at various ports of the FIFO shown in FIG. 4A. Corresponding items in FIGS. 5 and 4A are labeled with corresponding reference numerals as follows: subtract 100 from each reference numeral in FIG. 5 to find the corresponding reference number in FIG. 4A. FIG. 5A shows the same information as FIG. 5 but in tabular form. FIG. 5B shows the values of signals in the circuit elements that hold state during the simulation of FIG. 5.

In this example, the FIFO is reset for one clock (and for this reason the rst signal 502 has a high value 522 as illustrated in FIG. 5). One byte of data is enqueued into the FIFO (and for this reason the enq signal 506 has a high value 524), which causes a signal 516 at the is_empty port 318 (FIG. 3) to transition from a high value 526 to a low value (FIG. 5), indicating that the FIFO is no longer empty. At a later time, the one byte of data is dequeued from the FIFO (and for this reason the deq signal has a high value 528), causing the signal on is_empty port 318 (FIG. 3) to transition from a low value to a high value 530 (FIG. 5), thereby indicating that the FIFO is empty.

Then one byte of data is enqueued in each of two consecutive clocks, (and for this reason the enq signal 506 has a high value 532), the result is that two bytes of data are enqueued in the FIFO 300. When the first byte was enqueued, the signal at is_empty port 318 (FIG. 3) transitioned from a high value 530 to a low value 534, indicating that the FIFO is no longer empty. When the second byte was enqueued, the is_full port transitioned from low to a high value 536, indicating that the FIFO is full, since this implementation of the FIFO can hold a maximum of two bytes.

Subsequently, one byte of data is dequeued from the FIFO 300 (and for this reason the deq signal 508 has a high value 538), which causes a signal 514 at the is_full port 314 (FIG. 3) to transition from high value 536 to low value 540. At a later time, one more byte is enqueued into the FIFO at time 542, which caused the signal 514 at is_full port 314 to transition from a low value 540 to a high value 544, indicating that the FIFO 300 is full. Finally, one byte is dequeued in each of two consecutive clocks, (and for this reason the deq signal has a high value 546). The first byte dequeue caused the signal 514 at is_full port 314 (FIG. 3) to transition from a high value to a low value 548, and the last byte dequeue caused a signal 516 at the is_empty port 318 (FIG. 3) to transition from a low value 534 to a high value 550, indicating that the FIFO 300 is empty.

Properties must always be true if a device being described is to behave correctly as per the designer's assumptions. Hence, any verification tool, such as a digital circuit simulator or formal analysis tool may be used to validate such properties. While the format used to specify a property may vary between different verification and/or simulation tools, the property itself remains the same (because it defines an assumption that has been made for proper operation of the device).

Property-based criteria use artifacts (which are expressions of human workmanship) about a property, to select appropriate states in the simulation, as initial states for use in formal analysis. Such artifacts may be articulated in statements (either by a user or by a software vendor) in a predetermined format, and these statements may be used to generate one or more criteria in accordance with the invention. The generated criteria in turn are used in several embodiments of the invention to select states for formal analysis, and other embodiments will be apparent to the skilled artisan in view of this disclosure.

FIG. 5C illustrates three prior art properties 592, 594 and 596 of the exemplary FIFO 300 of FIG. 3, and specifies them using a predetermined format, namely the format of 0-In assertions, which are assertions available in a library from the software vendor 0-In Design Automation, Inc. The properties 592, 594 and 596 indicate one or more assumptions that an integrated circuit (IC) designer makes when using the FIFO 300. These assumptions include, for example: (1) data will not be stored and retrieved simultaneously (as illustrated by assertion 592), (2) data will not be stored when the device is full (as illustrated by assertion 594) and (3) data will not be retrieved when the device is empty (as illustrated by assertion 596).

Figure 6:
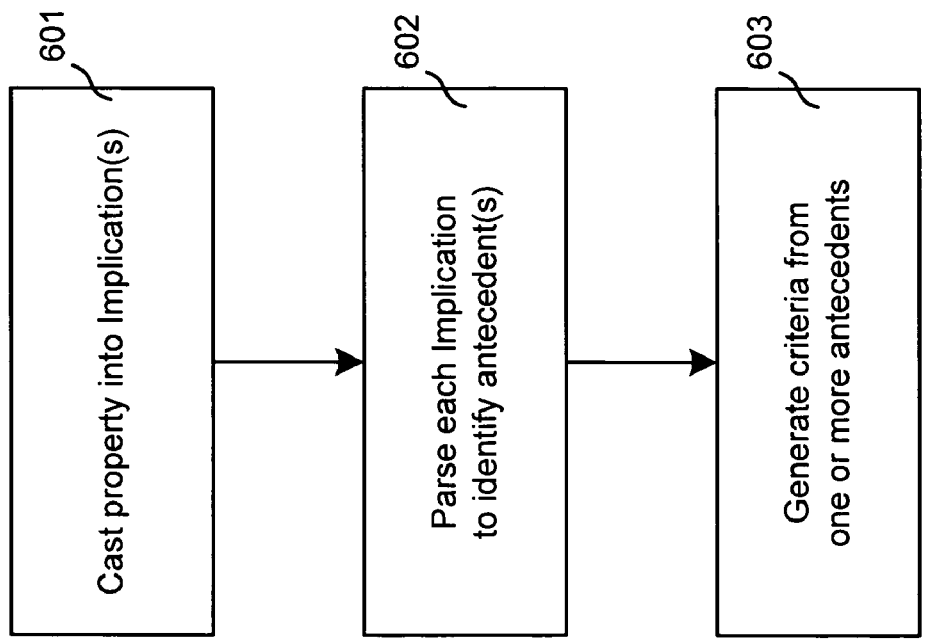
FIG. 6 illustrates, in a flow chart, conversion of properties into selection criteria, in several embodiments of the invention.

In certain embodiments of the invention, each prior art property of digital circuits of the type illustrated in FIG. 5C is cast into the format of one or more implications, namely the format "antecedent→consequence", as per act 601 in FIG. 6. Each antecedent on the left-side of such an implication is an expression which may be composed of subexpressions. Use of properties to generate criteria in accordance with the invention is based on the following principle: when the antecedent evaluates true, the consequence must be true, else the property has been violated and a counter-example has been found. One criterion (which is a primary criterion) in such embodiments is to choose those states where the antecedent evaluates true. Therefore, in such embodiments, the implications generated by act 601 (FIG. 6) are parsed to identify antecedents as per act 602. Then a criterion to be used in state selection as described herein is generated in act 603, e.g. by forming an expression which is a logical OR of multiple antecedents, and alternatively as an antecedent itself if only one antecedent identified in act 602.

The above-described acts 601-603 illustrated in FIG. 6 can be performed either manually, or automatically, depending on the embodiment. Furthermore, in some embodiments, checkers/assertions/properties may already be present in a prior art library in the format of implications, in which case act 601 need not be performed, and in such embodiments only acts 602 and 603 are performed, and these two acts may be performed automatically (by an appropriately programmed computer). Moreover, act 603 for generation of a criterion can be modified in some embodiments as follows: the criterion may be expressed as a logical OR of one of more subexpressions of an antecedent. In such embodiments, it is possible for the criterion to evaluate to true and thereby for the current state to be selected for formal analysis, even if the antecedent itself evaluates to not true.

In the example of property 592 (FIG. 5C), the property states that signals on both 'enq' and 'deq' lines of the FIFO 300 (FIG. 3) cannot be high at the same time. When performing act 601 (FIG. 6) in some embodiments, this property 592 (FIG. 5C) is cast into two implications: if the 'enq' signal is high, then the 'deq' signal must be low (e.g. a first implication "enq→!deq") as per statement 785 (FIG. 7), and also if the 'deq' signal is high, the 'enq' signal must be low (e.g. a second implication "deq→!enq") as per statement 786 (FIG. 7).

When performing act 602 (FIG. 6) in some embodiments, one or more antecedents of implications are identified, by selecting the expression to the left of the implication sign→in each statement. FIG. 7 shows antecedents for each of the three properties 592, 594 and 596 shown in FIG. 5C. Specifically, in the just-described property 592, the first implication statement 785 (FIG. 7) has the 'enq' signal itself as the antecedent (as per statement 787), and the second implication statement 786 (FIG. 7) has the 'deq' signal itself as the antecedent (as per statement 788).

When performing act 603 (FIG. 6) in some embodiments, the identified antecedents are used to articulate a statement of a criterion. Specifically, in the example of property 592, performance of act 603 generates a criterion that uses both antecedents (i.e. both first and second implication statements 785 and 786): and such criteria select states where either the 'enq' signal is high or the 'deq' signal is high (as illustrated by statement 780 that defines a signal to be used in selecting states called "antecedent_select") as follows (as illustrated by statement 780 in FIG. 7):

antecedent_select=(enq OR deq)

Methods of the type described above for generation of criteria can be extended to form a logical OR operation on all antecedents, for all properties of a device under verification. Therefore, for the remaining two properties 594 and 596 (FIG. 5C) of the FIFO there are the following two implications in the format "antecedent→consequence": namely "is_full→!enq" and "is_empty→!deq" that are generated by performance of act 601 (FIG. 6). Therefore, act 602 generates for properties 594 and 596 the two antecedents 'is_full' and 'is_empty' from the respective implications. Thereafter, performance of act 603 generates the following signal as a criterion to be used to select states, based on the FIFO's three properties 592, 594 and 596 illustrated in FIG. 5C:

antecedent_select=(enq OR deq) OR is_full OR is_empty

Figure 7A:
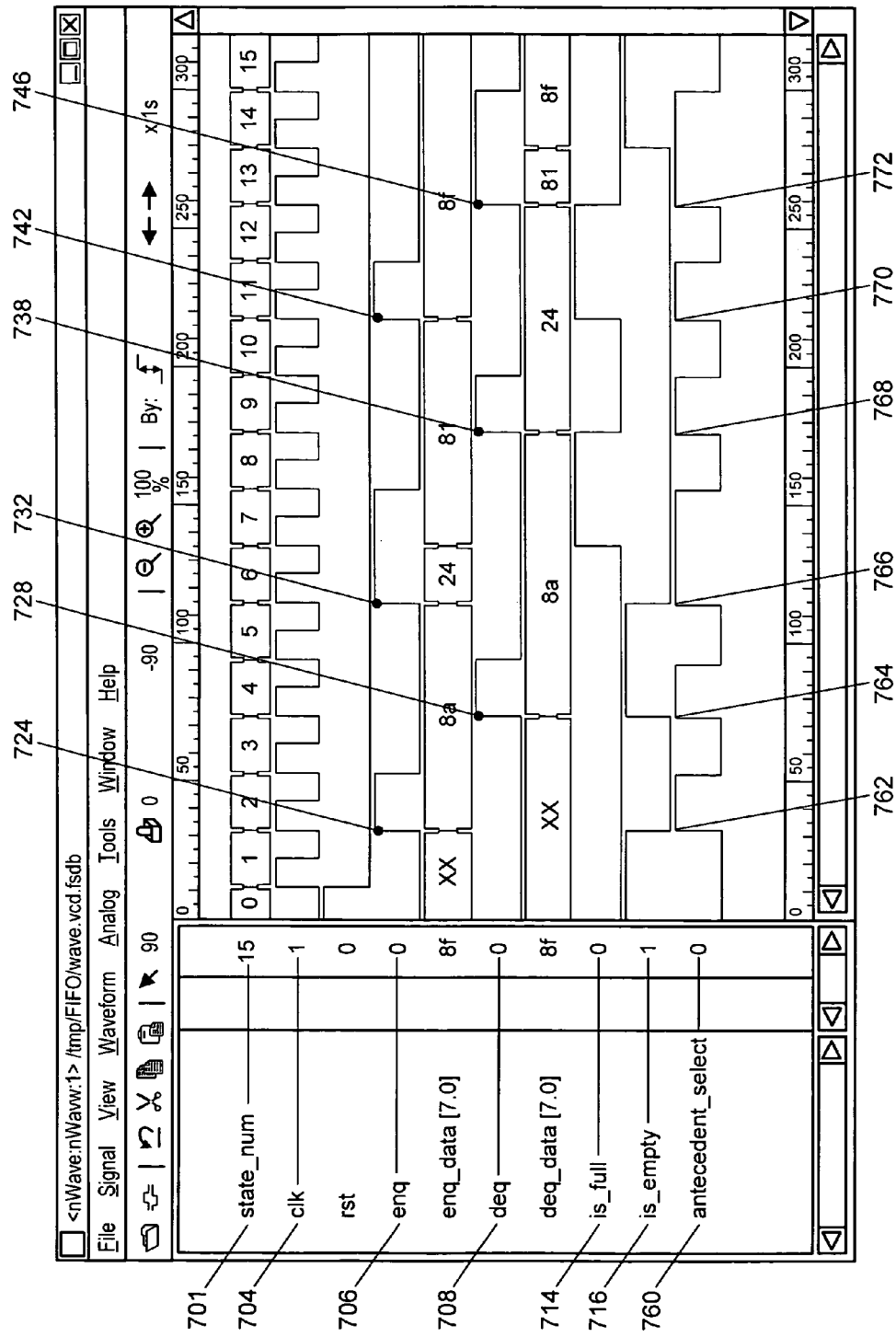
FIG. 7A illustrates, in a timing diagram, change in values of antecedents of the properties in FIG. 6, and variation of antecedent_select signal 760 which when active identifies the states of simulation that are being automatically selected for use in formal analysis, in embodiments that perform the process of FIG. 7.

Use of a property-based criterion for FIFO 300 is illustrated in FIGS. 7A and 7B. Specifically, the waveforms in FIG. 7A are the same as the waveforms of FIG. 5, with the addition of a waveform for antecedent_select signal 760 for just one property, namely property 592. Signal 760 is generated by a logical OR operation on the two antecedents of property 592 in FIG. 5C. FIG. 7A also illustrates the states of the simulation that are selected when applying this criterion.

The waveform in FIG. 7A shows a clock signal 704 that is used to clock the FIFO 300, an 'enq' signal 706 that is used to enqueue data (i.e. write data into the FIFO) and a 'deq' signal 708 that is used to dequeue data (i.e. read data from the FIFO). An 'antecedent_select' signal 760, when high, is used to show states which are selected with this criteria. As shown in FIG. 7A, selection criteria 780 for property 592 may result in an 'antecedent_select' signal 760 (see FIGS. 7, 7A and 7B) which goes high when either 'enq' signal 704 or 'deq' signal 706 goes high. FIG. 7B shows the same information as FIG. 7A, in tabular format.

In FIGS. 7A and 7B, for several items with reference numbers less than 740, subtract 200 to find the reference number of the corresponding item in FIG. 5. As shown in FIG. 7A and FIG. 7B, when the FIFO is enqueued (e.g. the 'enq' signal has the values 724, 732, 742), the 'antecedent_select' signal 760 is high (e.g. has the values 762, 766, 767, and 770). Moreover, when the FIFO is dequeued (e.g. the 'deq' signal has the values 728, 238, 746), the 'antecedent_select' signal 760 is also high (e.g. has the values 764, 768, 772 and 773).

Therefore, states when the 'antecedent_select' signal is active are the states that match the selection criteria for property 602, namely, states 2, 4, 6, 7, 9, 11, 13 and 14. Note that in this example, only 50% of the simulation states 0-15 have been selected for formal analysis, based property 592. Therefore, in this example, formal analysis does not need to be performed on the remaining 50% of the states. The selected states 2, 4, 6, 7, 9, 11, 13 and 14 may be subject to further selection, as described above in reference to secondary selecting 253 as illustrated in FIG. 2D.

Note that for property 592, the values of the circuit elements that hold state, such as read pointer 322, write pointer 320 or last operation register 326 need not be considered in determining the state of FIFO 300, because these values do not appear in the antecedent of property 592. Considering only the values of signals that appear in the antecedent of a property (as illustrated by antecedent_select signal 760 in FIGS. 7A and 7B) reduces the number of states to be formally analyzed (and therefore minimizes state space explosion).

Figure 7C:
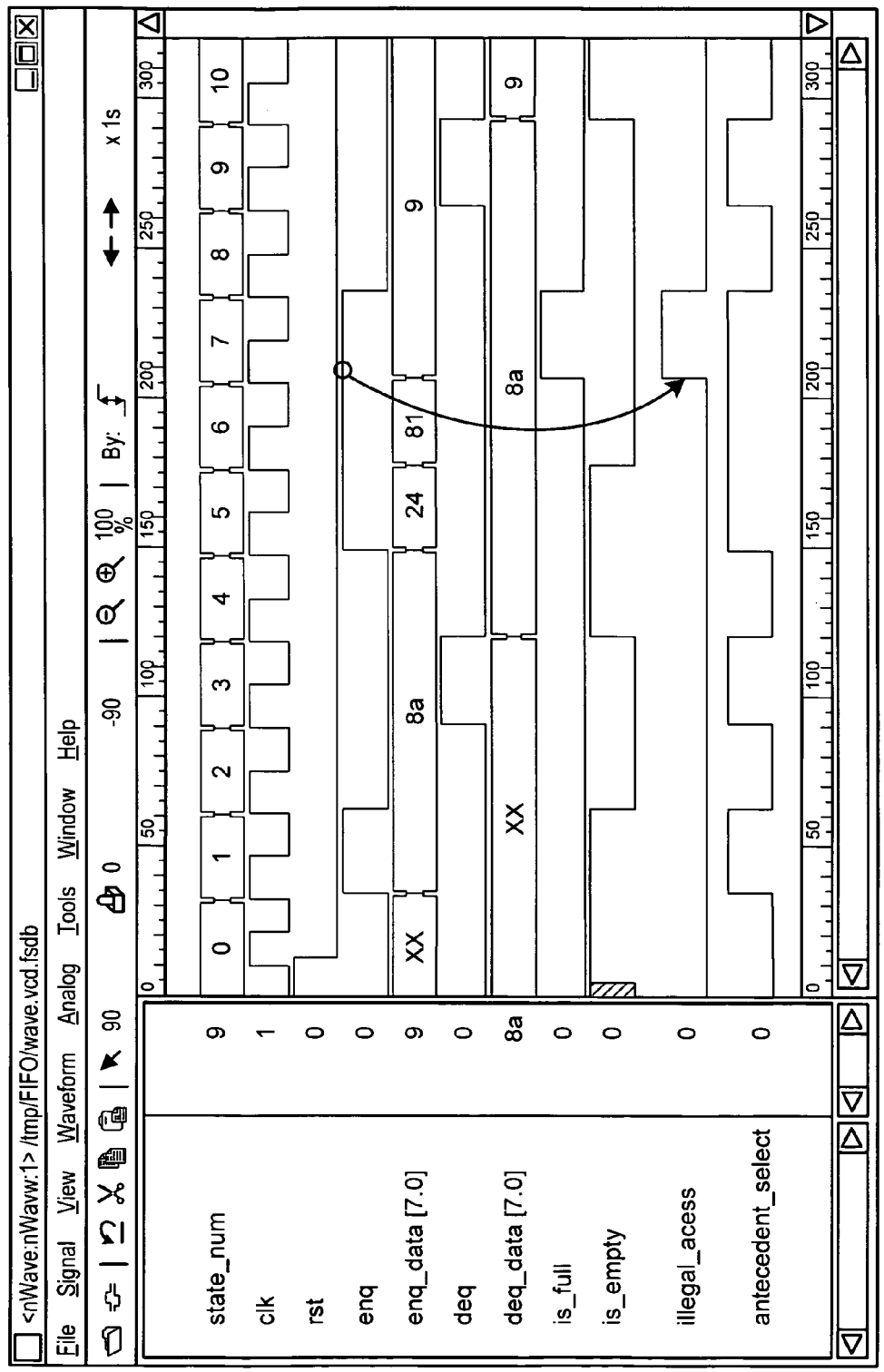
FIG. 7C shows a waveform similar to FIG. 7A, but wherein the simulation illegally accesses the FIFO by causing an overflow.

FIG. 7C shows a waveform where the simulation illegally accesses the FIFO by causing an overflow in state 8 (because the enq signal has remained active in two previous states 6 and 7). FIG. 7D shows a table of values that correspond to the waveform in FIG. 7C. As shown in FIG. 7C, at state 10 when a dequeue operation is issued to the FIFO, the is_empty signal is asserted, indicating that the FIFO is empty.

Clearly the FIFO cannot be empty after three consecutive enqueue operations followed by one dequeue operation. Thus after the FIFO has been illegally accessed, the contents of the state have become incorrect.

Figure 2D:
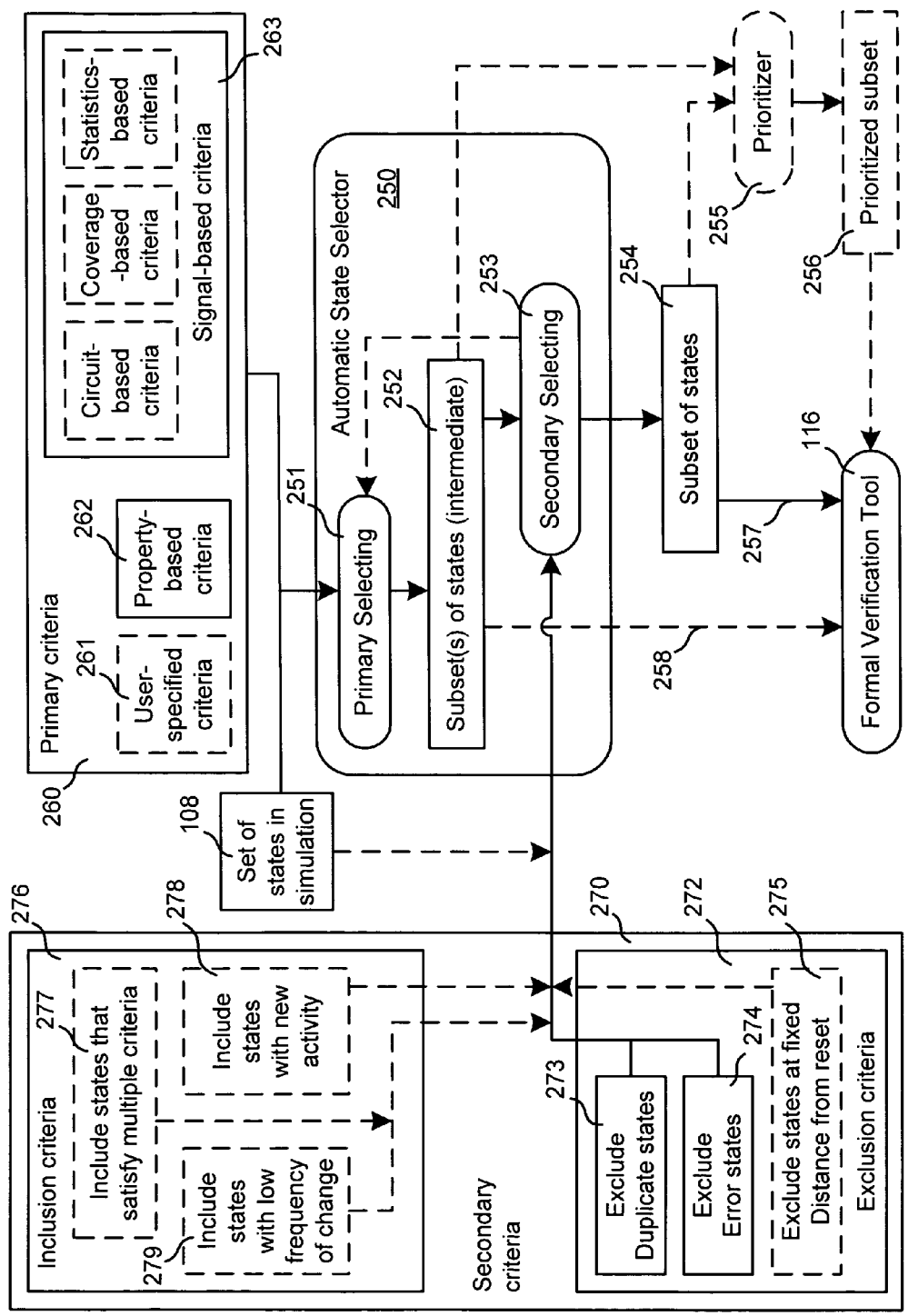
FIG. 2D illustrates, in a data flow diagram, an embodiment of an automatic state selector in accordance with the invention which operates in two states, namely primary selecting which generates one or more intermediate subsets of states and secondary selecting which finalizes the subset of states to be used for formal analysis.

If the simulation illegally accesses the FIFO, a property has been violated (i.e. a counter example has been found), and in some embodiments such states and any subsequent states in the simulation are not used for formal analysis (as per criterion 274 in FIG. 2D). The reasons for not selecting such error states during automatic state selection for formal analysis are as follows: firstly the states after an illegal behavior may contain incorrect values, and secondly the overriding intent in using formal analysis is to find defects in the design which is thwarted when starting with error states.

In several embodiments, if simulation has found a defect, the defect is corrected, and then simulation, automatic state selection, and formal analysis are performed on the corrected circuit description, to find more defects. In actual use, the location of a defect is not known apriori and state selection must be performed in a systematic manner using one or more criteria of the type described herein, followed by formal analysis using the selected states to find the defect.

In the following example, automatic state selection is applied to states that are generated from simulation with an illegal behavior, merely to illustrate the effectiveness of automatic state selection using property-based criteria as described herein. Specifically, a design flaw is found by automatic state selection if the flaw was not found during simulation. In the illegal behavior shown in FIG. 7C, the 'antecedent_select' signal goes high at states 2,4,6,7,8 and 10.

If a formal verification tool did an exhaustive analysis of one clock cycle, using state 7 as an initial state, the tool would find that the FIFO could be illegally accessed at state 8 by adding another item to the FIFO (i.e. issue of an enqueue command) when the FIFO is already full. Note that in practice, formal analysis is not started from illegal state 7, because once an error (e.g. illegal enqueue command) is found during simulation, it is corrected. The just-described illegal enqueue command is merely used in this description, to provide an illustration of a defective circuit design.

Similarly, the same formal verification tool finds that an exhaustive analysis of one clock cycle starting with state 4 as an initial state allows issuance of a dequeue command to an empty FIFO to cause an illegal access, although this particular behavior is not shown in FIGS. 7A and 7C.

FIGS. 7A-7D illustrate just one example of how automatic state selection finds design flaws in enqueueing a full FIFO and dequeueing an empty FIFO, and this technique is extended in several embodiments to much larger designs using more powerful formal verification tools. Although the above description is primarily focused on property 592, antecedent_select statements 782 and 784 in FIG. 7 illustrate how to apply the antecedent based selection criteria for properties 594 and 596.

Formal analysis based on automatically selected states in certain embodiments can provide an indication of confidence in the validity of a property of a digital circuit that is used in a criterion for state selection. One example of a confidence indicator is described in U.S. patent application Ser. No. 10/174,379, entitled "Measure of Analysis Performed In Property Checking" filed by Jeremy Rutledge Levitt et al, on Jun. 17, 2002, which is incorporated by reference herein in its entirety. Note that other measures may be used in other embodiments.

During generation of selection criteria from statements about properties, the criteria being generated may be chosen to yield start states for formal analysis that are likely to identify defects in the circuit description, regardless of the property (i.e. checker/assertion) and the simulation. For example, certain embodiments generate a criterion by use of two or more statements about different properties, thereby to increase the likelihood of identifying defects regardless of the property.

Although FIGS. 7, and 7A-7D illustrate certain criteria based on the properties of a FIFO as used in some embodiments, other embodiments may use other criteria based on, for example, properties of other devices, such as stacks. Examples of properties that are used in some embodiments as the basis for criteria of the type illustrated in FIGS. 7 and 7A-7D are listed in Table 1 below.

TABLE 1

| Device | Checker/Assertion/Property |
| --- | --- |
| arbiter | check that in every clock cycle no more than one grant occurs |
| Bus | check that in every clock cycle a shared tri-stated bus has exactly one driver |
| decoder | check that input data is properly binary-decoded |
| encoder | check that input data is properly binary-encoded |
| multiplexer | check that output is equal to the selected input |
| one-hot | check that values have exactly one bit asserted |
| serializer | check conversion from parallel to serial |
| deserializer | check conversion from serial to parallel |
| Stack | check that pop does not occur when the stack is empty; push does not occur when stack is full; and both pop and push do not occur in the same clock cycle |

Note that table 1 listed above is not an exhaustive list of properties, but is merely exemplary. For more information on checkers that may be used for generating criteria for use in state selection, see the CHECKERWARE® DATA BOOK which has been incorporated by reference above.

Although Table 1 illustrates certain primary criteria based on properties that are used in some embodiments, other embodiments may use other primary criteria based on, for example, corner cases. Specifically, a device in a circuit description may have a predetermined corner case behavior that is associated with it. A corner case is a correct behavior (also called "legal behavior") of the device at the boundary of its operation, and beyond the boundary the operation should fail. In the above-described exemplary FIFO 300, one can enqueue data into FIFO 300 before it becomes full or dequeue data from FIFO 300 before it becomes empty—both are correct operations.

The boundary of a FIFO's operation (i.e. corner case) occurs when the FIFO is either full or empty. If the FIFO is empty, then a dequeue operation is no longer correct in this state, i.e. until data is enqueued. Similarly, if the FIFO is full, an enqueue operation is no longer correct in this state, i.e. until data is dequeued. A computer may be programmed to keep a count of the number of times such corner cases arise, e.g. the number of times the FIFO becomes full, becomes empty or reaches a predetermined high water mark. Such numbers provide an indication of the coverage attained during simulation: e.g. if any of these numbers is zero then the corner case was not reached.

Corner cases can also be predetermined e.g. within a library of assertions that specify one or more properties of a circuit device, such as a FIFO or a stack. When each assertion comes from a predetermined library, one or more assertions may have predefined corner cases. The corner case based selection criteria used in some embodiments automatically select the states to be used for formal analysis as being states where the corner case is achieved during simulation.

Therefore, some embodiments of the invention start with libraries of checkers (i.e. assertions/properties) that identify corner case behaviors. In such embodiments, acts for corner case behaviors are performed a manner similar or identical to the acts in a flow chart illustrated in FIG. 6 and described above in reference to checkers. Specifically, in certain embodiments, corner case behaviors are also expressed in the form of implications, and such implications are parsed to identify antecedents, and the antecedents in turn are used to generate criteria for state selection.

For example, if a state of FIFO 300 happens to reach a corner case, then the next operation on the FIFO should not be an incorrect operation—i.e. if the FIFO is full, the next operation should not be an enqueue operation (as indicated by property 594 in FIG. 5C) or if the FIFO is empty, the next operation should not be a dequeue operation (as indicated by property 596).

FIG. 8 shows several examples of corner cases of FIFO 300 that are preprogrammed in a library of one or more assertions for a FIFO and can be used as a selection criteria for formal analysis. When referring to the simple example of FIFO 300, the following description for corner case based criteria assumes that property based criteria 782 and 784 (FIG. 7) are not in use. The corner cases for FIFO 300 include: (1) FIFO is full statement 890 or (2) FIFO is empty statement 892 which respectively yield as selection criteria the two signals 'is_full' and 'is_empty', as illustrated by statements 880 and 882. Note that in this example, a selection signal that is generated for use in selecting states for formal analysis is also called 'corner_case_select' signal. In this example, assume that only the aforementioned corner cases were preprogrammed into an assertion for a FIFO, in a library of assertions/properties/checkers.

Figure 8A:
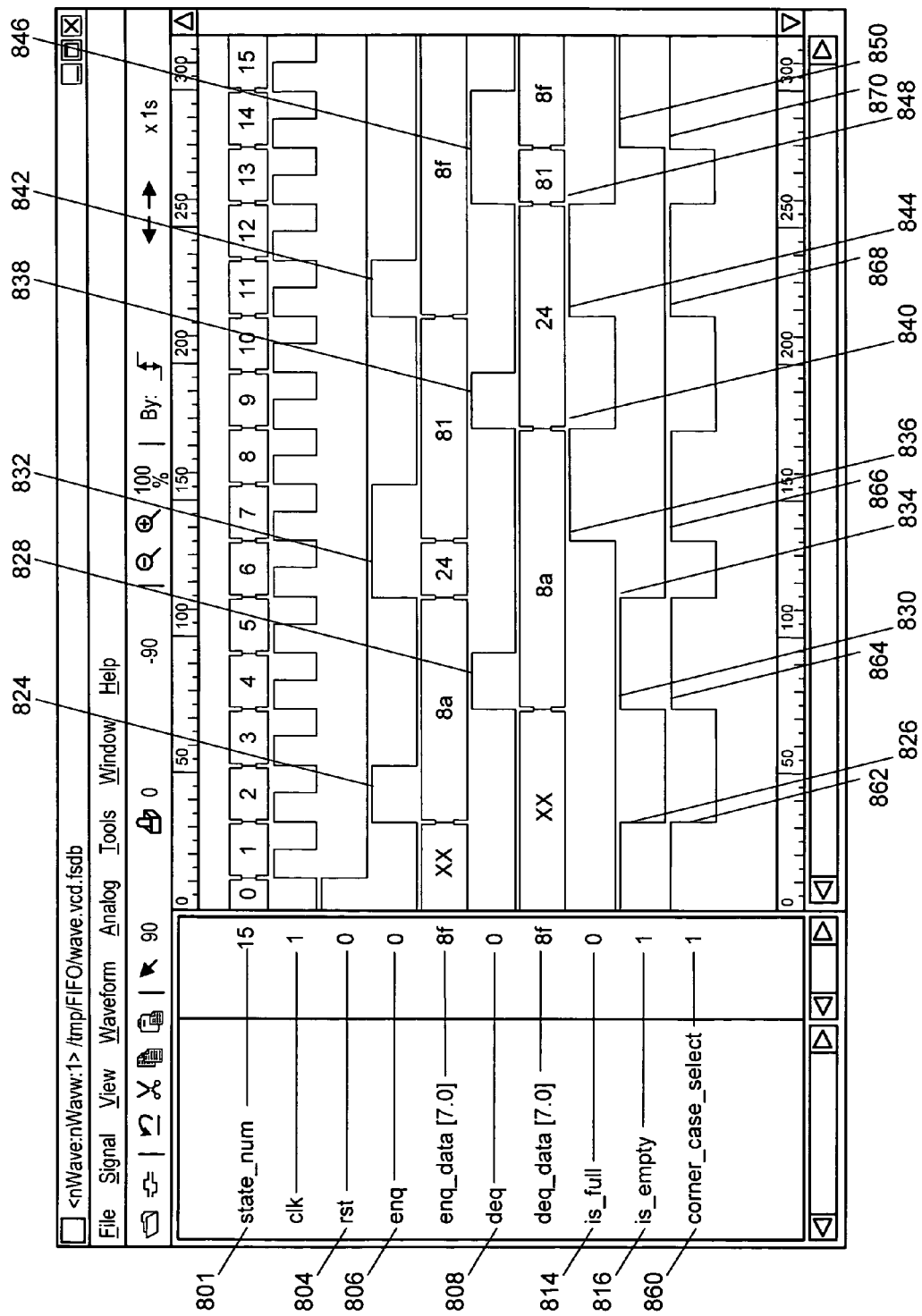
FIG. 8A illustrates, in a timing diagram, the corner cases that are applicable to the properties in FIG. 8 and the states that are selected.

Combination of statements 890 and 892 (FIG. 8) yields yet a "combined" corner case statement 894 in which the FIFO being either full or empty is used as the selection criterion 884 (FIG. 8), e.g. by selection signal 860 in the waveform shown in FIG. 8A. Specifically, the waveform in FIG. 8A illustrates a 'state_num' signal 801 which identifies each state, a 'clk' signal 804 that is used to clock the FIFO, an 'enq' signal 806 which is active when data is being enqueued in the FIFO, and a 'deq' signal 808 which is active when data is being dequeued from the FIFO. The 'corner_case_select' signal 860 (FIG. 8A), when high, is used to identify states which are selected with this criteria. The waveforms in FIG. 8A are the same as that of FIG. 5 with the addition of an extra waveform for the 'corner_case_select' signal 860.

As shown in FIG. 8, statement 884 includes a logical OR operation on the two signals 'is_full' and 'is_empty', and these two signals were the selection criteria as per corner case statements 890 and 892 that the FIFO is full or that the FIFO is empty. The 'corner_case_select' signal 860 (FIG. 8A) goes high when either 'is_full' signal 814 is high or 'is_empty' signal' 816 is high. In FIGS. 8 and 8A, for items with numbers less than 840, subtract 300 to find the corresponding numbered item in FIG. 5 or subtract 100 to find the corresponding numbered item in FIG. 7.

As shown in FIG. 8A, when the FIFO is enqueued (see values 724, 732, 742 for the 'enq' signal in FIG. 7) and dequeued (see values 728, 238, 746 for the 'deq' signal), this results in the FIFO being full at some times (see values 836, 844 of the 'is_full' signal in FIG. 8A) and empty at other times (see values 826, 830, 850 of the 'is_empty' signal). The states that match the corner case selection criteria statement 884 (FIG. 8) as shown by high values 862, 864, 865, 866, 867, 868, 869, 870 and 871 of signal 860 (FIG. 8A) are therefore selected for formal analysis. In the simulation illustrated in FIG. 8A, states 1, 4, 5, 7, 8, 11, 12, 14 and 15 are selected.

For such corner case criteria, the values of the circuit elements that hold state, such as the dequeue pointer 322, enqueue pointer 320 or last operation register 326 are indirectly considered, because their values are used in the computation of 'is_full' signal 814 and 'is_empty' signal 816. The values of signals in the circuit elements are shown in FIG. 5B.

Figure 8B:
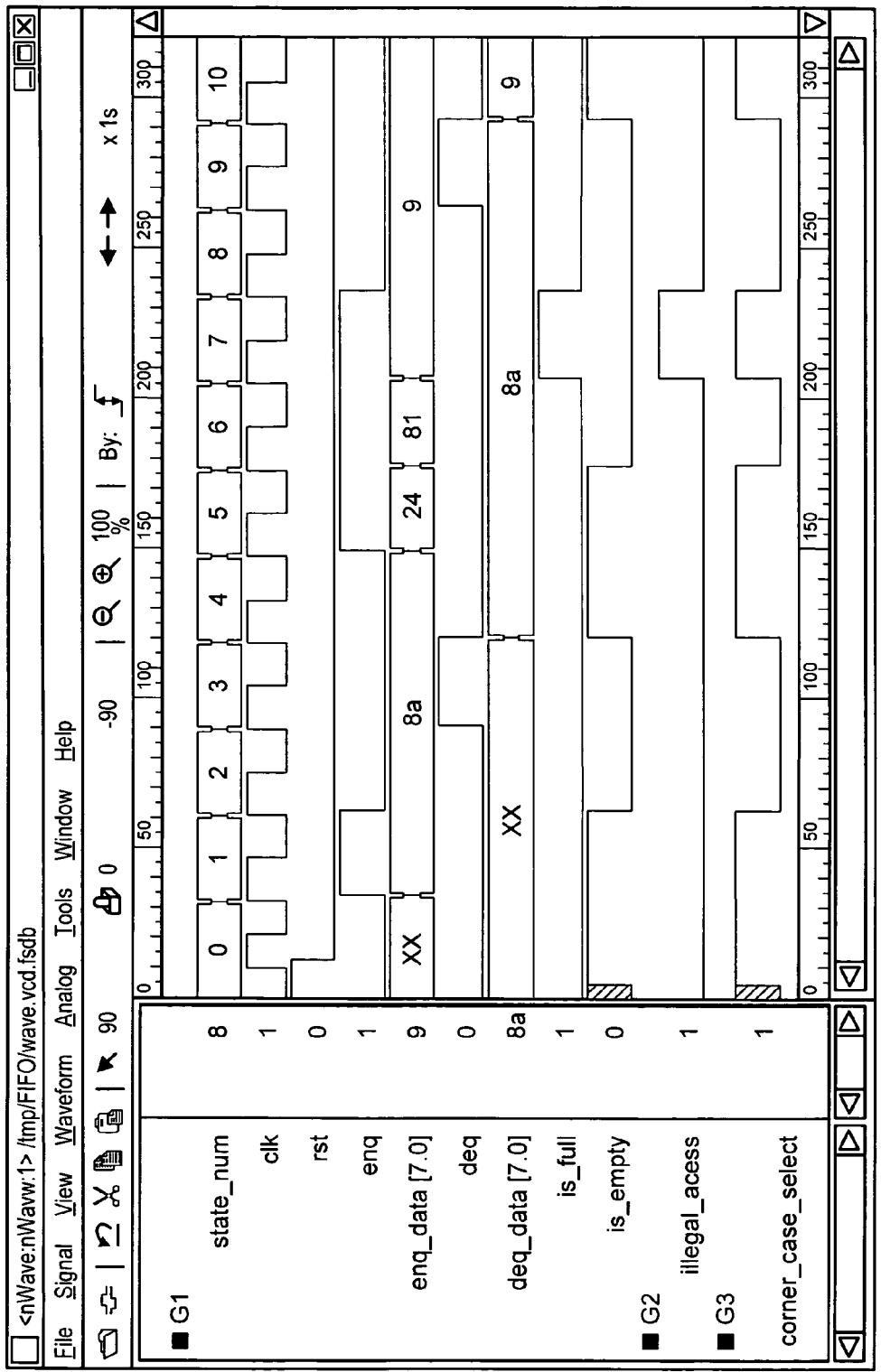
FIG. 8B shows a waveform similar to FIG. 8A, but wherein the simulation illegally accesses the FIFO by causing an overflow, and selection of such states in several embodiments of the invention.

FIG. 8B shows the same simulation of the FIFO as FIG. 7C, where the simulation overflows the FIFO on state 8 by issuing an enqueue operation while the FIFO is full. FIG. 8C shows the same information in tabular form. In this simulation, the corner cases are satisfied when the FIFO is either full or empty, in states 0,1,4,5,7, or 10. Comparing this set of selected states to the states selected when the antecedents are satisfied (as discussed above), only three states, namely states 4, 7 and 10, are the same.

Since the state of the simulation may be incorrect after the illegal access of the FIFO on state 8, several embodiments of the type described herein eliminate the subsequent states 9 and 10 from the set to be used for formal analysis. Such elimination results in states 4 and 7 as the only ones that are selected by both methods. Therefore, in this example, only two states 4 and 7 are selected for formal analysis from among sixteen simulation states 0-15, which is a reduction by a factor of 8. The decision of whether to use the set of states selected by one criteria or to use an intersection or union of sets of states selected by multiple criteria is a decision that is made by the user, based on the amount of time and compute power that can be dedicated to formal verification.

The above-described corner case criteria can be expanded in some embodiments to select for formal analysis those states where a corner case is close to being achieved but is not in fact achieved. Closeness to a corner case may be defined to be any state that is within a predetermined number n cycles or operations from which a corner case state is achieved, wherein n is a small number, e.g. 10. This is possible in some embodiments, when using a library-based approach.

In the example of FIFO 300, two pre-defined corner cases are: FIFO is full and FIFO is empty. If the depth D of FIFO 300 is known, a programmed computer can automatically predefine a corner case as follows: that the FIFO is close to being full if "n" more enqueues would fill it, i.e. that the FIFO currently has stored D-n units of data. In another example, a property is defined as follows: that a signal A must be asserted within a fixed window of time, as measured in the number of clock cycles, M, and a predefined corner case (and hence a state selected for formal analysis) is that signal A asserts at the last (Mth) clock cycle. This set of states selected for formal analysis can be expanded in some embodiments to add states in which the signal A asserts within (M-p) clock cycles, where p is a small number, and smaller than M, e.g. p may be 2. Other embodiments may use other definitions of "closeness" to a boundary (such as a fixed percentage), e.g. the FIFO being 90% full, or 90% empty or the signal A remains unasserted for 90% of the duration M, thereby to identify a criterion independent of the specific numbers "n" and "p".

Although FIGS. 8, and 8A-8D illustrate certain criteria based on the corner cases of a FIFO as used in some embodiments, other embodiments may use other criteria based on, for example, corner cases of other devices, such as stacks. Examples of corner cases that are used in some embodiments as the basis for criteria of the type illustrated in FIGS. 8 and 8A-8D are listed in Table 2 below.

TABLE 2

| Device | Corner Case |
|---|---|
| arbiter | all requests are outstanding at least once |
| Bus | all drivers are enabled at least once |
| decoder | all decodes are checked at least once |
| encoder | all encodes are checked at least once |
| multiplexer | every input is selected during simulation |
| one-hot | all one hots checked |
| serializer | parallel input data is shifted right for full width without change in mode |
| Stack | stack is full or empty |

Note that table 2 listed above is not an exhaustive list, but is merely exemplary. For more information on corner cases that may be used for generating criteria for use in state selection, see the CHECKERWARE® DATA BOOK which has been incorporated by reference above.

Note that in each of the property based criterion and corner case based criterion, the check that is being made is for a given value of the signal (e.g. that signal enq is of value 1) whereas in other criteria of the type described below, the check that is being made is for a change in the value of the signal (e.g. that the signal "number of entries in FIFO" changes from value 0 to value 1).

An assertion library may have one or more predetermined statistics that are to be monitored in relation to a property of a circuit element. Depending on the embodiment, during simulation, an appropriately programmed computer checks if a property specified for a design under test (DUT) is or is not violated. Simultaneously, the programmed computer also captures predefined information about the simulation that is associated with the property. This information is normally displayed to the user, as statistics. Although described in relation to a property, statistics in other embodiments need not be associated with a property.

When implementing a FIFO assertion, a programmed computer of some embodiments checks that the FIFO does not overflow or underflow during simulation. At the same time, the programmed computer of these embodiments also captures the following statistics: the number of times the FIFO was enqueued; the number of times the FIFO was dequeued; the number of times that elements used in the FIFO exceeded a predetermined number (called a high-water mark); the current number of elements being used in the FIFO; and the maximum number of elements used in the FIFO, during the entire simulation.

Figure 9:
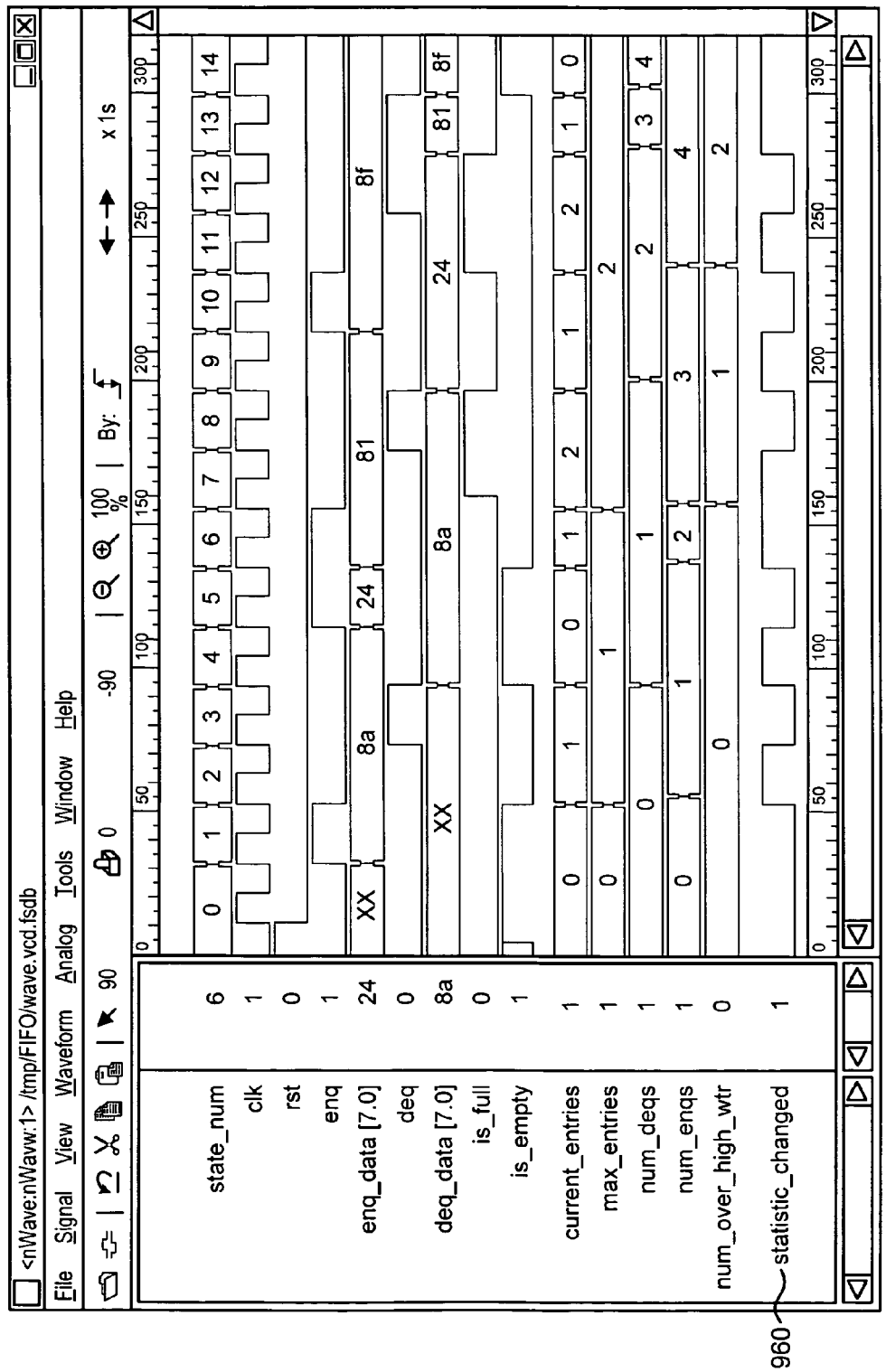
FIG. 9 illustrates, in a timing diagram, various statistics that are monitored, and a signal 960 labeled "statistic_changed" which when active identifies the states of simulation that are being automatically selected in certain embodiments of the invention, for use in formal analysis.

One primary criterion used in some embodiments selects those states where any statistic that is being monitored changes value, on entry into those states. FIG. 9 illustrates the statistics that are applicable to the properties in FIG. 6, and the states of simulation that are selected when applying this criteria. Waveforms illustrated in FIG. 9A are similar or identical to the corresponding waveforms illustrated in FIGS. 5, 7 and 8. FIG. 9 shows the values of statistics during the simulation. FIG. 9A shows this information in tabular form. The states at which the values of any of these statistics change are those that are selected with this criteria. Those states are the states numbered 2, 4, 6, 7, 9, 11, 13 and 14. A similar analysis is done to determine the states that are to be selected based on statistics changes, even if the simulation run was that of an illegal access of a FIFO as shown in FIGS. 7C and 8C.

In some embodiments, signal 960 (FIG. 9) that is labeled "statistic_changed" is created by performing a Boolean OR operation over a number of signals that identify a change in statistic between clocks, e.g. an OR operation over every statistic signal (in a library of assertions) that changes. The change in any statistic (e.g. number of enqueues in a FIFO) is determined in such embodiments by the following:

(value of statistic in previous clock cycle !=value of statistic in current clock cycle)

Although FIGS. 9 and 9A illustrate certain criteria based on the statistics of a FIFO as used in some embodiments, other embodiments may use other criteria based on, for example, corner cases of other devices, such as stacks. Examples of statistics that are used in some embodiments as the basis for criteria of the type illustrated in FIGS. 9 and 9A are listed in Table 3 below.

TABLE 3

| Device | Statistic |
| --- | --- |
| arbiter | Total number of requests and grants |
| Bus | Total number of clocks that bus is driven |
| decoder | Total number of decodes checked |
| multiplexer | Total number of inputs selected |
| one-hot | Total number of times new value is loaded |
| serializer | Total number of shift operations (equal to the sum of right shifts and left shifts) |
| Stack | Total number of push and pop operations |

Note that table 3 listed above is not an exhaustive list, but is merely exemplary. For more information on corner cases that may be used for generating criteria for use in state selection, see the CHECKERWARE® DATA BOOK which has been incorporated by reference above.

Figure 10:
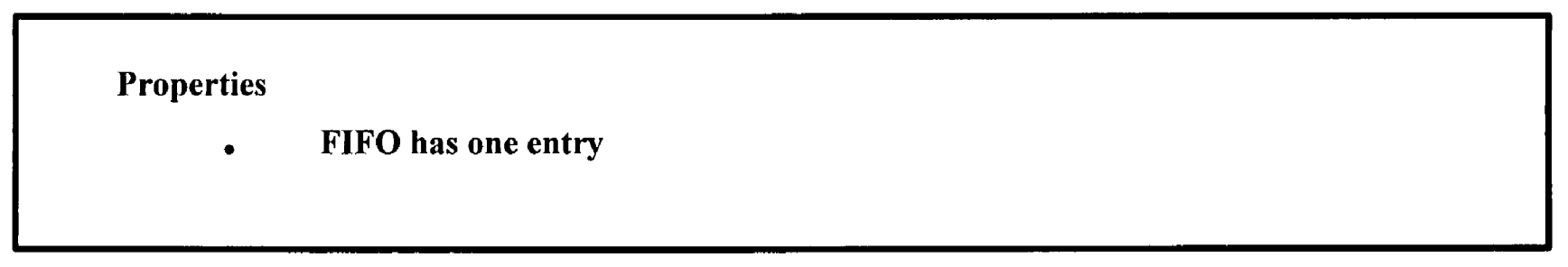

In addition to generating primary criteria from properties, corner cases and/or statistics, certain embodiments permit a user to specify certain signals and/or conditions to be used as primary criteria, to determine which states of the simulation are to be selected for formal analysis. FIG. 10 illustrates a user-specified criteria to be used for automatic state selection in accordance with the invention. In this example, a user specifies (e.g. via a statement in a predetermined language) that all states in which FIFO 300 has a single entry are to be used as initial states for formal verification. A user may articulate such statements based on their specialized knowledge of the particular application of the specific circuit element (e.g. FIFO).

Certain embodiments use properties that are specified by users in a circuit description language, such as Verilog or VHDL. Specifically, the user may specify an expression in Verilog or VHDL and when the expression evaluates to a predetermined Boolean value (e.g. TRUE) then the checker fires, and firing of the checker causes the programmed computer to automatically select the current state as a seed for formal analysis.

Figure 10A:
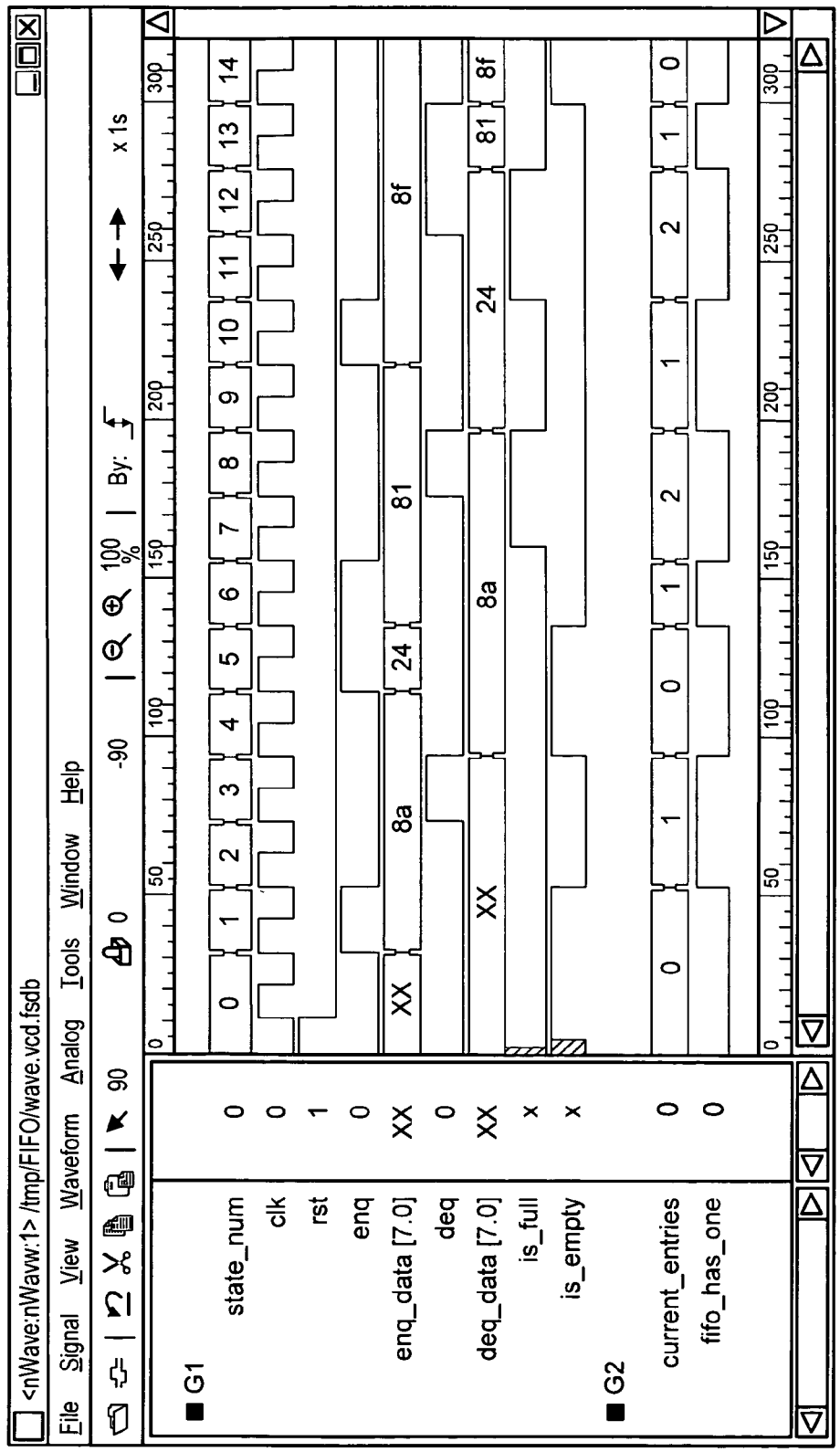
FIG. 10A illustrates, in a timing diagram, monitoring of the user-specified property of FIG. 10, to generate a signal "fifo_has_one" which when active identifies the states of simulation that are being automatically selected in certain embodiments of the invention, for use in formal analysis.

FIG. 10A illustrates waveforms that are similar or identical to the corresponding waveforms in FIGS. 5, 7A,7C, 8A, 8B and 9. In this embodiment, the user's statement is parsed, and a new signal 'fifo_has_one' is created, for use in identifying states to be selected for formal analysis. The signal fifo_has_one may be specified by the user as follows:

fifo_has_one=(current_entries==1)

During operation, signal fifo_has_one goes high whenever the value of 'current_entries' register in FIFO 300 equals one. As shown in FIG. 10A, the states in which 'fifo_has_one' is asserted are chosen as initial states for formal analysis. A similar analysis is used to determine the states that would be selected in the simulation run that causes the illegal FIFO access shown in FIGS. 7C and 8C.

Yet another primary criterion that is used in some embodiments is based on signals in circuit elements and ports that drive the signals that are used in properties/checkers/assertions. Specifically, such criteria are based on changes in the value of the circuit elements and ports in the fanin cone of the signals that are input to properties/checkers/assertions.

Figure 12:
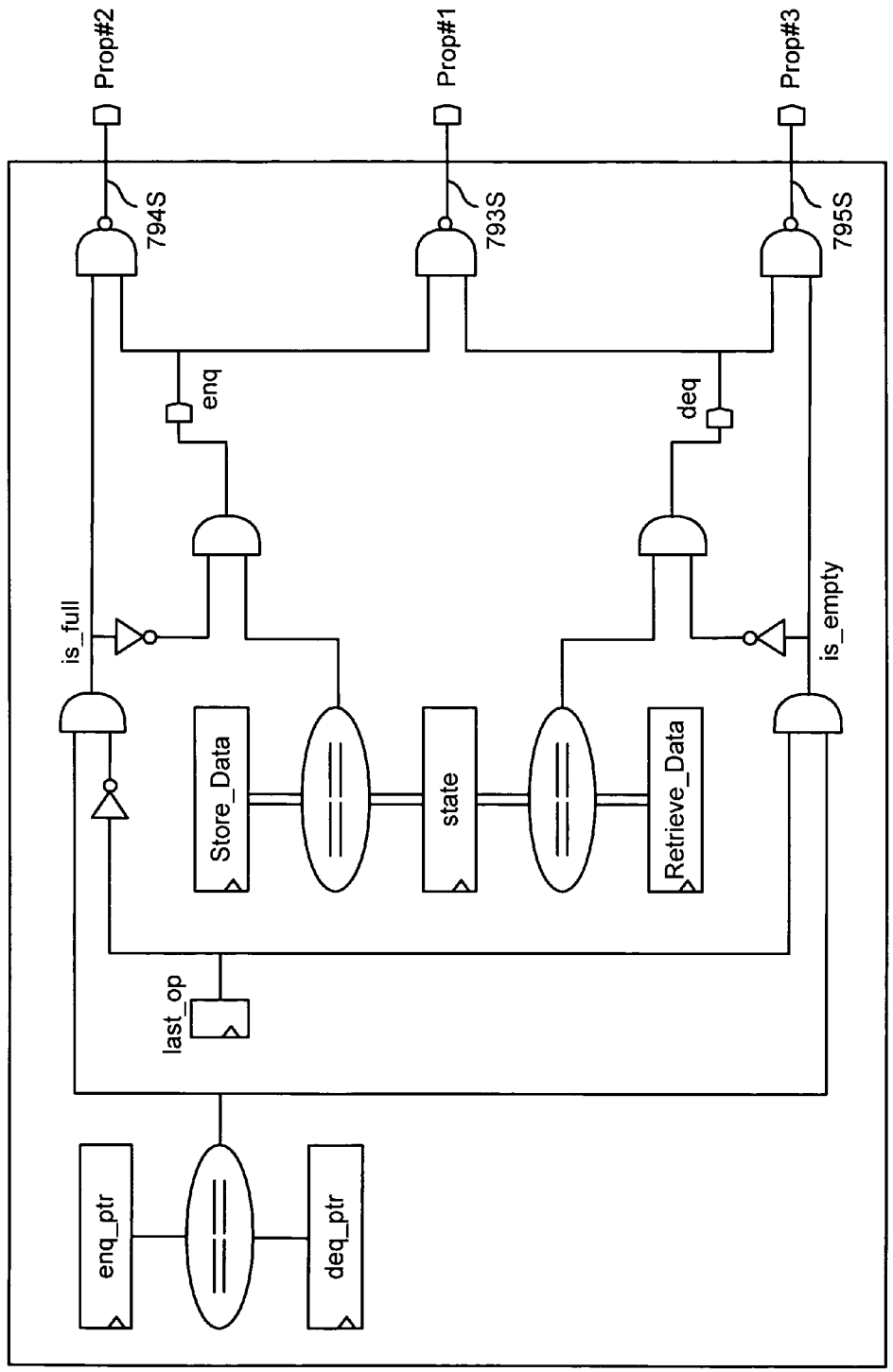
FIG. 12 illustrates circuit elements described in prior art FIG. 11, in the fanin cone of the FIFO's properties.

FIG. 11 illustrates a snippet of a Verilog description of a circuit that uses FIFO 300. FIG. 12 shows circuit elements in the fanin cone of the FIFO's properties. The circuit elements in FIG. 12 may be created by use of a synthesis tool of the type available from, for example, Synopsys, Inc. In FIG. 12, the lines labeled 793S, 794S and 795S carry signals related to the respective properties 793, 794 and 795 illustrated in FIG. 7 (described above). In FIG. 12, the ovals containing the sign "=" denote Boolean logic to check if the two inputs are equal.

The signals provided by such circuit elements that are of interest are determined by the specification of the properties in FIG. 5C. The specification of the first property 592 uses the values of signals 'enq' and 'deq'. Similarly, other properties 594 and 596 use the values of signals 'enq', 'deq', 'is_empty' and 'is_full'. Thus, in this example, specification of the three properties in FIG. 5C uses only the following signals, 'enq', 'deq', 'is_empty' and 'is_full'.

Figure 13:
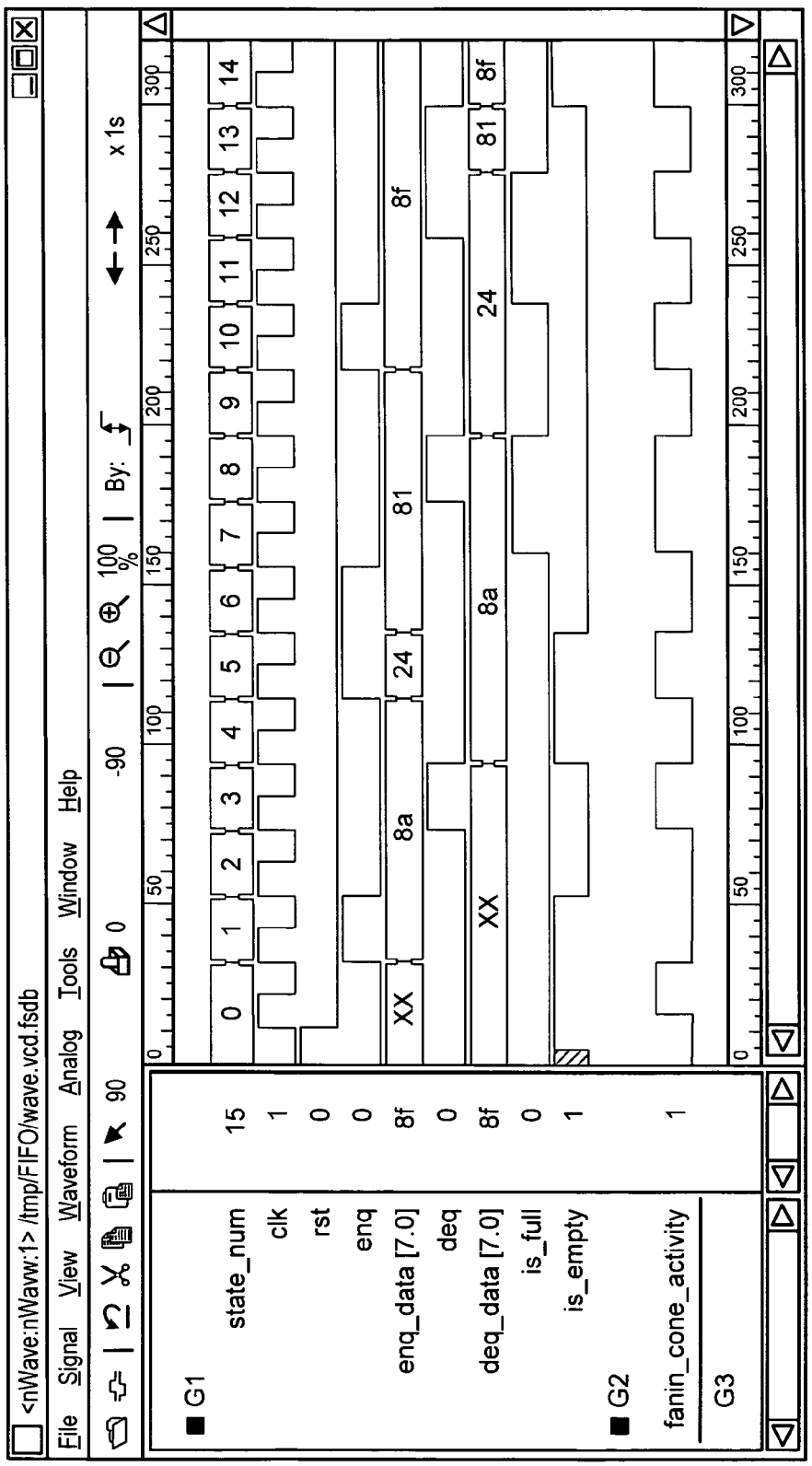
FIG. 13 illustrates, in a timing diagram, states of simulation that are selected from the activity of the circuit element in the fanin of the properties in certain embodiments of the invention, for use in formal analysis.
Figure 14:
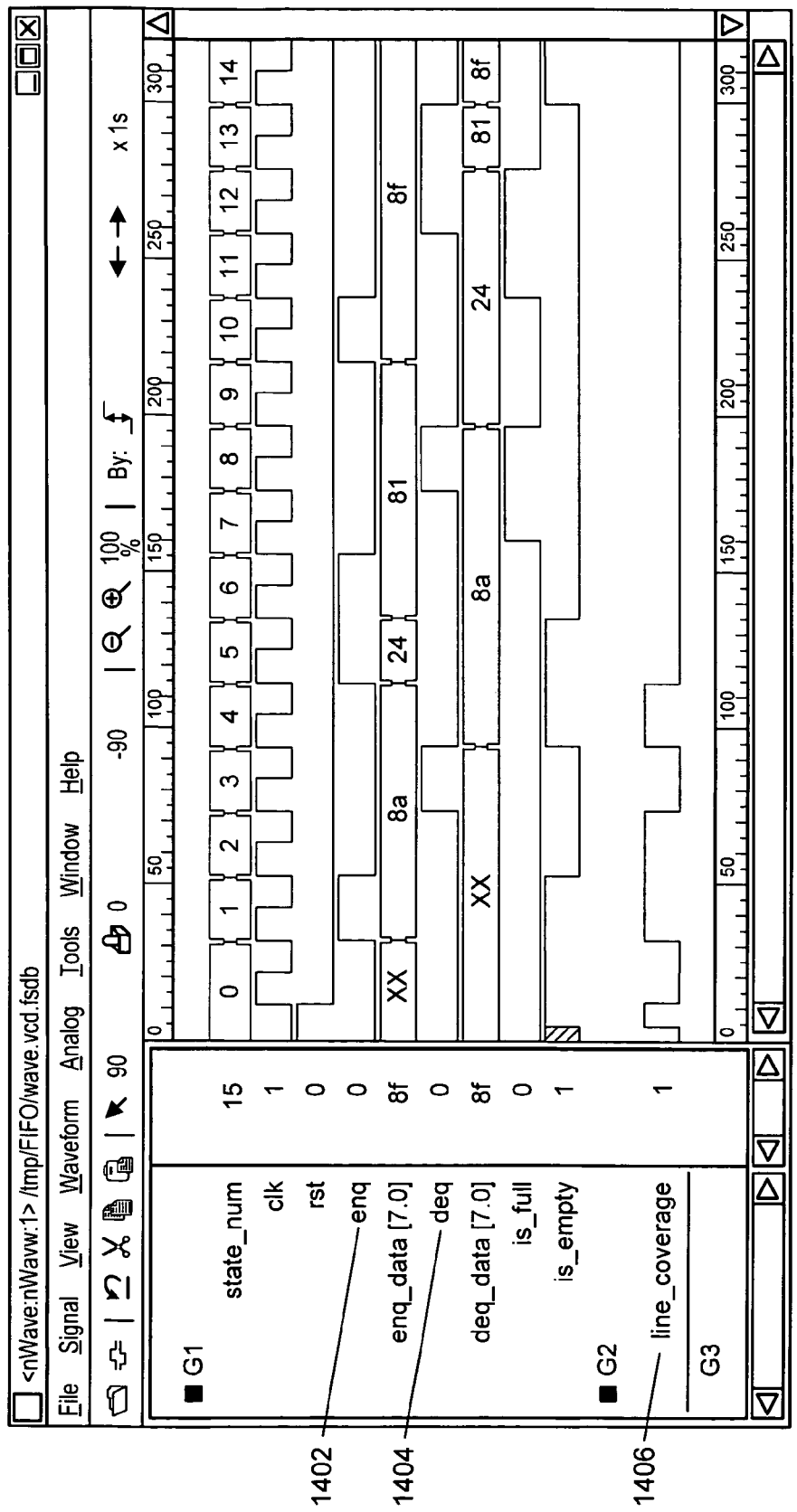
FIG. 14 illustrates, in a timing diagram, use of line coverage as a selection criterion to select states in certain embodiments of the invention, for use in formal analysis.

Assume that FIFO 300 is instantiated in the module in FIG. 11. FIG. 12 shows only that part of the circuit that is one level of sequential depth from the signals used by the properties. Traversing the circuit diagram of FIG. 12, the circuit elements that are identified are 'en_ptr', 'deq_ptr', 'last_op' and 'state'. A signal called 'fanin_cone_activity' is created such that the signal is asserted whenever any of the four aforementioned circuit elements change value. FIG. 13 shows the states that are selected for the example using this criteria. The states that are selected are those where the signal 'fanin_cone_activity' is asserted high.

In some embodiments, signal 'fanin_cone_activity' is generated in a manner similar to that described above for the statistics change signal, for example as follows: for each signal register or port in the fanin, do a Boolean OR of the (previous not equal to current) signals as follows.

(prevA !=currA) OR (prevB !=currB)

Although the above description refers to a sequential depth of one, in other embodiments a programmed computer traverses a circuit in the fanin cone of a device being checked, to find those sequential circuit elements and primary ports that are within a sequential depth of 'n', where 'n' is a number determined by the user.

Still another primary criterion that is used in some embodiments is based on a coverage metric that is commonly used during digital circuit simulation. Coverage metrics that may be used to generate primary criteria in accordance with the invention include, but are not limited to, the following: line coverage, branch coverage, path coverage, toggle coverage, finite state machine based coverage metrics, (such as state coverage; arc, or transition, coverage; pair state coverage, pair arc coverage), and coverage metrics which capture the behavior of particular circuit elements such as counters, and FIFOs.

Examples of coverage metrics that are used in some embodiments are described in the following patents each of which is incorporated by reference herein in its entirety: U.S. Pat. No. 6,438,725 granted to Chen, on Aug. 20, 2002 and entitled "Apparatus and method for fast code coverage analysis", U.S. Pat. No. 5,758,061 granted to Plum on May 26, 1998 and entitled "Computer software testing method and apparatus", U.S. Pat. No. 5,313,616 granted to Cline, et al. on May 17, 1994 and entitled "Method for analyzing calls of application program by inserting monitoring routines into the executable version and redirecting calls to the monitoring routines", and also U.S. Pat. No. 3,427,443 granted to Apple et al in February 1969 and U.S. Pat. No. 3,707,725 granted December, 1972 to Dellheim.

For additional information on how to make and use coverage metrics, see the following references each of which is incorporated by reference herein in its entirety:

David Dempster and Michael Stuart, "VERIFICATION METHODOLOGY MANUAL Techniques for Verifying HDL Designs" by, published by Teamwork International, New Century House, Stable View, Yateley, Hampshire, United Kingdom, Third Edition, June 2002;

Beizer, Boris, "Software Testing Techniques", 2nd edition, New York:Van Nostrand Reinhold, 1990;

John Joseph Chilenski and Steven P. Miller, "Applicability of Modified Condition/Decision Coverage to Software Testing", Software Engineering Journal, September 1994, Vol. 9, No. 5, pp. 193-200.

McCabe, Tom, "A Software Complexity Measure", IEEE Trans. Software Eng., Vol. 2, No. 6, December 1976, pp. 308-320.

Morell, Larry, "A Theory of Fault-Based Testing", IEEE Trans. Software Eng., Vol. 16, No. 8, August 1990, pp. 844-857.

Ntafos, Simeon, "A Comparison of Some Structural Testing Strategies", IEEE Trans. Software Eng., Vol. 14, No. 6, June 1988, pp. 868-874.

Roper, Marc, "Software Testing", London, McGraw-Hill Book Company, 1994.

Furthermore, examples of tools well known in the art that do coverage metrics are as follows:
 gcov: a Test Coverage Program
 Covered—the Verilog code coverage analyzer
 SureCov: Automatic FSM, Expression, and Code Coverage tool Certain embodiments that use such criteria select those states where the value of a coverage metric changes during simulation. For example, when using line coverage as a metric, every state in which a line in the circuit description is executed where that line was never executed before in the simulation is selected. Similarly, whenever a new state is covered or a new arc is traversed, when using state or arc coverage as a metric, those states are selected for formal analysis.

Figure 15:
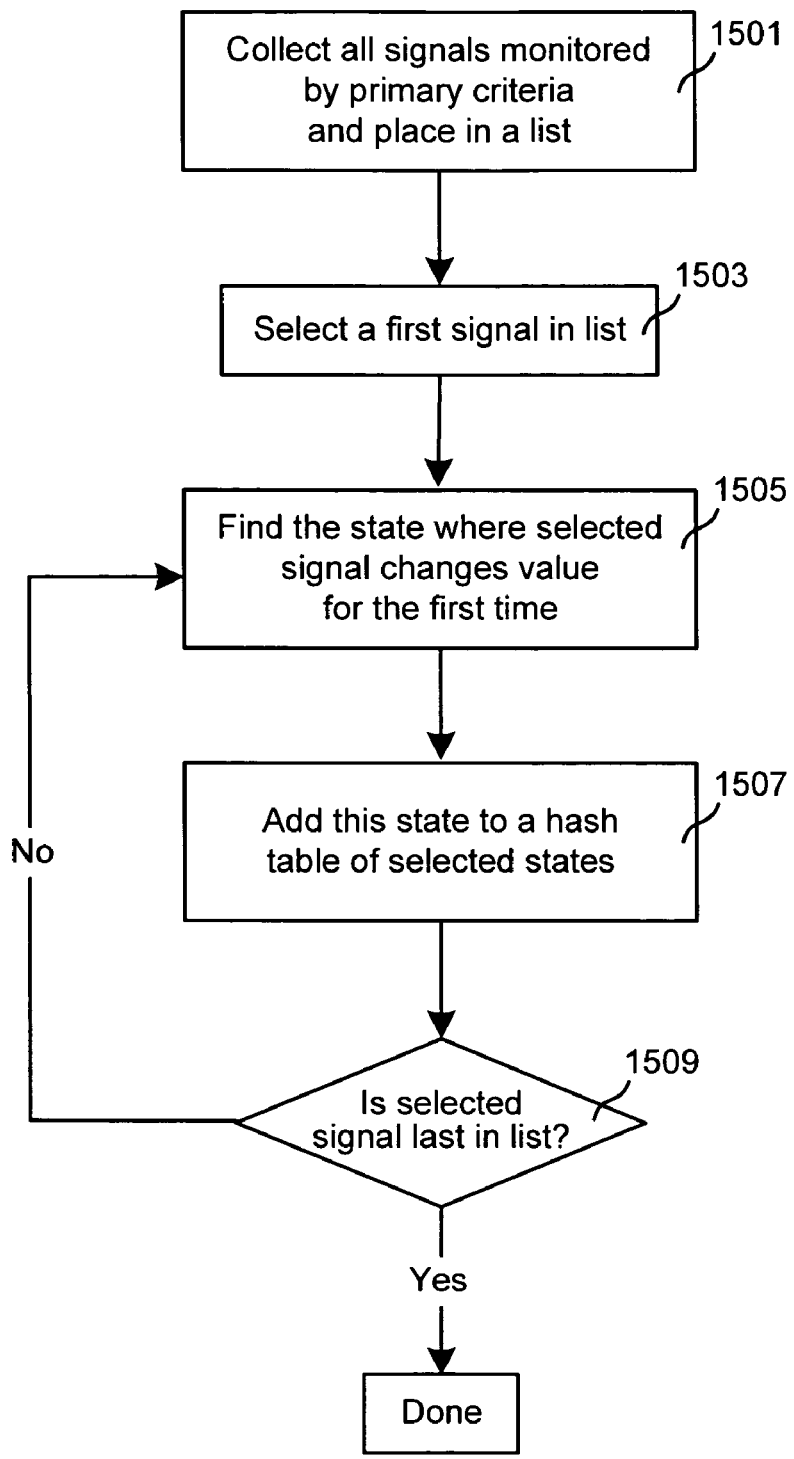
FIG. 15 illustrates, in a flow chart, acts performed in using a new activity criterion to select states in certain embodiments of the invention, for use in formal analysis.

FIG. 15 illustrates selection of states using the line coverage metric. Specifically, the waveforms in FIG. 15 illustrate a number of signals including an enqueue signal 1502 according to which the FIFO is enqueued, a dequeue signal 1504 according to which the FIFO is dequeued, and a line_coverage signal 1506 according to which states are selected for use in formal analysis.

One or more of the aforementioned primary criteria can be used to select states of a digital circuit's description during simulation, as initial states for formal analysis. However, in practice, a large number of states may be selected using one or more primary criteria. If the available time and computer resources do not permit all selected states to be provided as initial states for formal analysis, the following secondary criteria can be used to choose a smaller subset of simulation states from a subset of states that are selected by use of the aforementioned primary criteria.

Certain embodiments use a criterion (also called "new activity" criterion) as follows: choose one or more states where a signal monitored for a primary criterion (which may be limited to user-selected criterion in some embodiments) changes value for the first time, from a default value at the beginning of simulation to a different value, e.g. when the is_full signal for FIFO 300 goes from default value zero to value one, for the very first time. In the just-described example, states in which any later transitions occur in the is_full signal, e.g. from one to zero (when the FIFO is dequeued) and again from zero to one (when the FIFO is again enqueued) are not used, when applying this criterion.

Use of such a criterion is implemented in some embodiments, by going through the states, one state at a time, in the same sequence as the time sequence of simulation. In each state being visited in this process, a check is made for a change in a user-selected metric. If there is no change in the user-selected metric, the next state is examined. If there is a change in the user-selected metric (from its default value at the beginning of simulation), then the current state is selected as satisfying the criterion of being the very first state in which the user-selected metric changes.

Several embodiments use the new activity criterion to select states by performing the acts illustrated in FIG. 15. Specifically, such embodiments collect all signals monitored by primary criteria and place then in a list, as per act 1501. Next, such embodiments select a first signal in the list, as per act 1503. Then such embodiments find the state where selected signal changes value for the first time, as per act 1505. Act 1505 may be performed by any mechanism, e.g. the signal first_enq_change may be generated as illustrated in the snippet of Verilog code described below. Thereafter, such embodiments add this state to a hash table of selected states, as per act 1507. Note that in act 1507, the state is saved only if this state is not already in the set, and this happens automatically when using a hash table. Note that in other embodiments, structures other than a hash table may be used to hold the set of states being selected for use as starting points for formal analysis. Next, in act 1509, such embodiments check if the selected signal is the last signal in the list that was generated in act 1501, and if so then the set of states (e.g. in the hash table) is complete. If not, such embodiments select the next signal in the list, and go back to the act of finding described as being performed in act 1505.

The just-described process may be then repeated in certain embodiments, for each user-selected metric (assuming that there are a number of such metrics). Alternatively, in other embodiments, during examination of each state, a number of checks may be applied, one for each user-selected metric. In such embodiments, the process terminates only when a state has been found for each user-selected metric.

Several embodiments determine two subsets of states and take an intersection of the two subsets as follows: use of antecedent_select=(enq OR deq) for FIFO 300 results in selection of a first subset of eight states, namely states 2,4,6, 7,9,11,13 and 14 from among all states in the simulation; and use of the just-described new activity criterion results in selection of a second subset of states from all states in the simulation, for having a value change. Note that second subset has only two states, namely state 2 (first time when signal enq changes) and state 4 (first time when signal deq changes). Intersection of the first subset with the second subset results in only two states (namely states 2 and 4) being selected as the states in which an antecedent changes value for the first time.

Figure 15A:
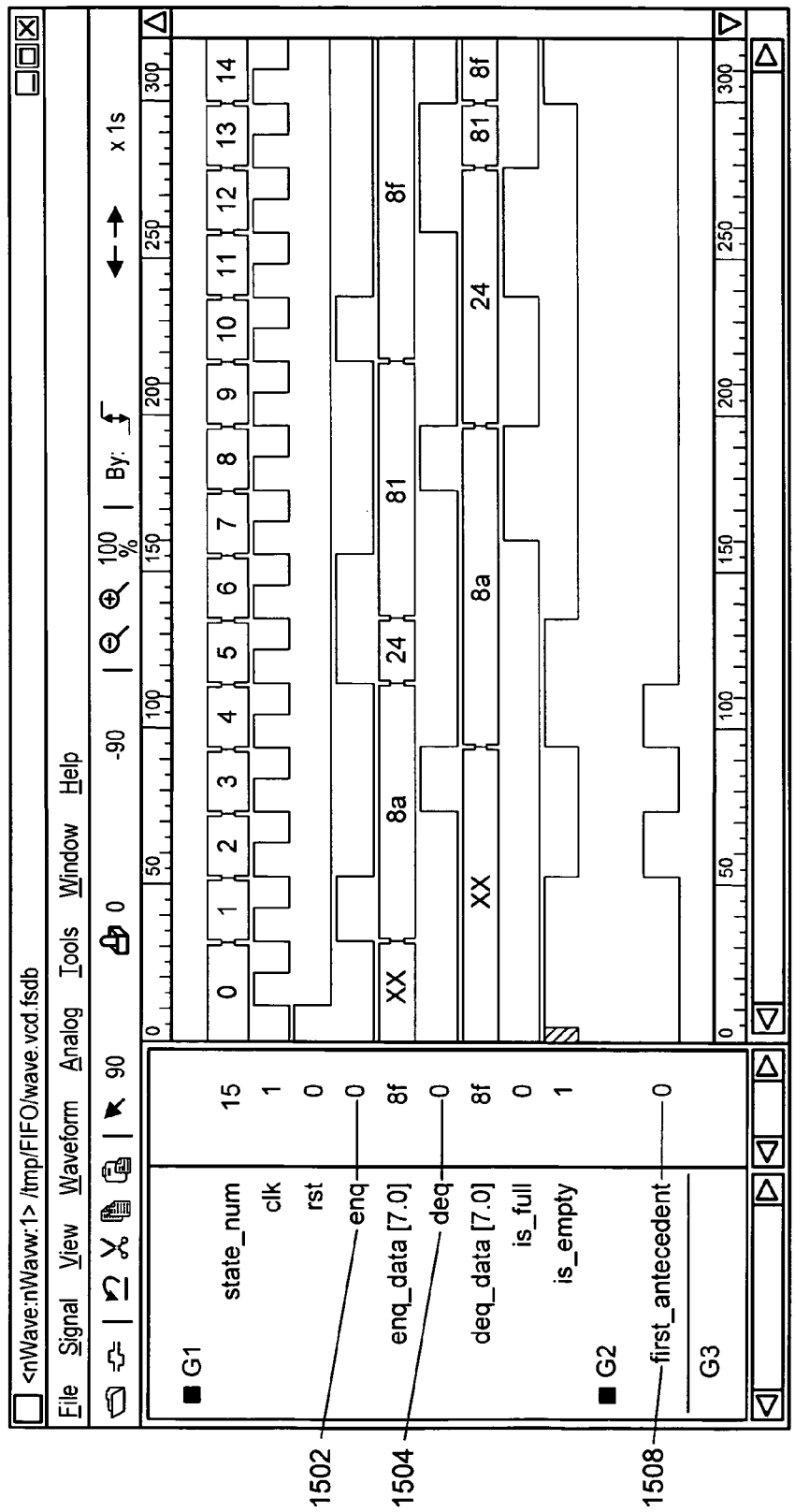

FIG. 15A illustrates certain states that are selected for FIFO 300, by application of such a new activity criterion, from among states that were shown as being selected in FIG. 7. FIG. 15A illustrates a number of signals including an enqueue signal 1502 according to which the FIFO is enqueued, a dequeue signal 1504 according to which the FIFO is dequeued, and a "first_antecedent" signal 1508 according to which states are further selected by application of the above-described new activity criterion. Signal first_antecedent may be generated as follows:

```
always @ (posedge clock) begin
  first_enq_change = 0;
  first_deq_change = 0;
  if (prev_enq != cur_enq) begin
    if (enq_changed == 0)
      first_enq_change = 1;
    enq_changed = 1;
  end
```

```
if (prev_deq != cur_deq) begin
    if (deq_changed == 0)
        first_deq_change = 1;
    deq_changed = 1;
end
prev_enq <= curr_enq;
prev_deq <= curr_deq;
first_antecedent = first_enq_change or first_deq_change;
end
```

In some embodiments, the just-described new activity criterion is applied as a secondary criterion, and is used to select states only from among those states that have been previously selected by applying a primary criterion. Such a new activity criterion (regardless of whether applied as primary or secondary) is expanded, in variants of the above-described embodiments, to choose those states in which a user-selected metric changes value for the first N times, with N being of a value specified by the user. Moreover, the same mechanism is applied in some embodiments to other selection criteria, e.g. first change in value of (a) corner case, (b) statistic, (c) user-specified signal, or (d) signal change in circuit element in the fanin-cone of specified properties.

Several embodiments apply all of the primary criteria described above and further apply the new activity criterion to select states from among the states selected by the primary criteria. The states obtained from such use of the new activity criterion are then provided as starting points for formal analysis. During such formal analysis on certain circuits having known defects, the selected states although numbering only 10% of the total states were able to identify 90% of the defects. The circuits that were tested in such embodiments were from a variety of technologies, such as microprocessors (CPUs), routers, and glue-logic chip sets.

In several embodiments, the values of some metrics change more frequently than others, and in such embodiments, it is possible that use of the above-described new activity criterion yields more than 10% of the total states, e.g. 50% of the total states may be selected. Some such embodiments use the following as a secondary criterion as either an alternative to the new activity criterion or in addition to the new activity criterion: pick the states where the value of a user-selected metric changes, provided the value changes at a low frequency, as compared to value changes in other metrics. When applying the just-described criterion (also called "low frequency" criterion), such embodiments discard the states where the values of the metrics change at a high frequency. Alternatively, this criterion may be described as selecting states where the values of the metrics change at a low frequency.

Several embodiments compute the frequency of change of values as follows: use one or more of the selection criteria (e.g. property, corner case, and/or statistics) to identify all signals to inspect; then for each signal, keep a separate count of how may times that particular signal changes value during simulation. Depending on the amount of time and compute power available for formal verification, a number 'M' is chosen by the user. Using the value M, inspect each signal and its count to identify the signals that change at a low frequency, and then use a change in the identified signals to select states.

Figure 16:
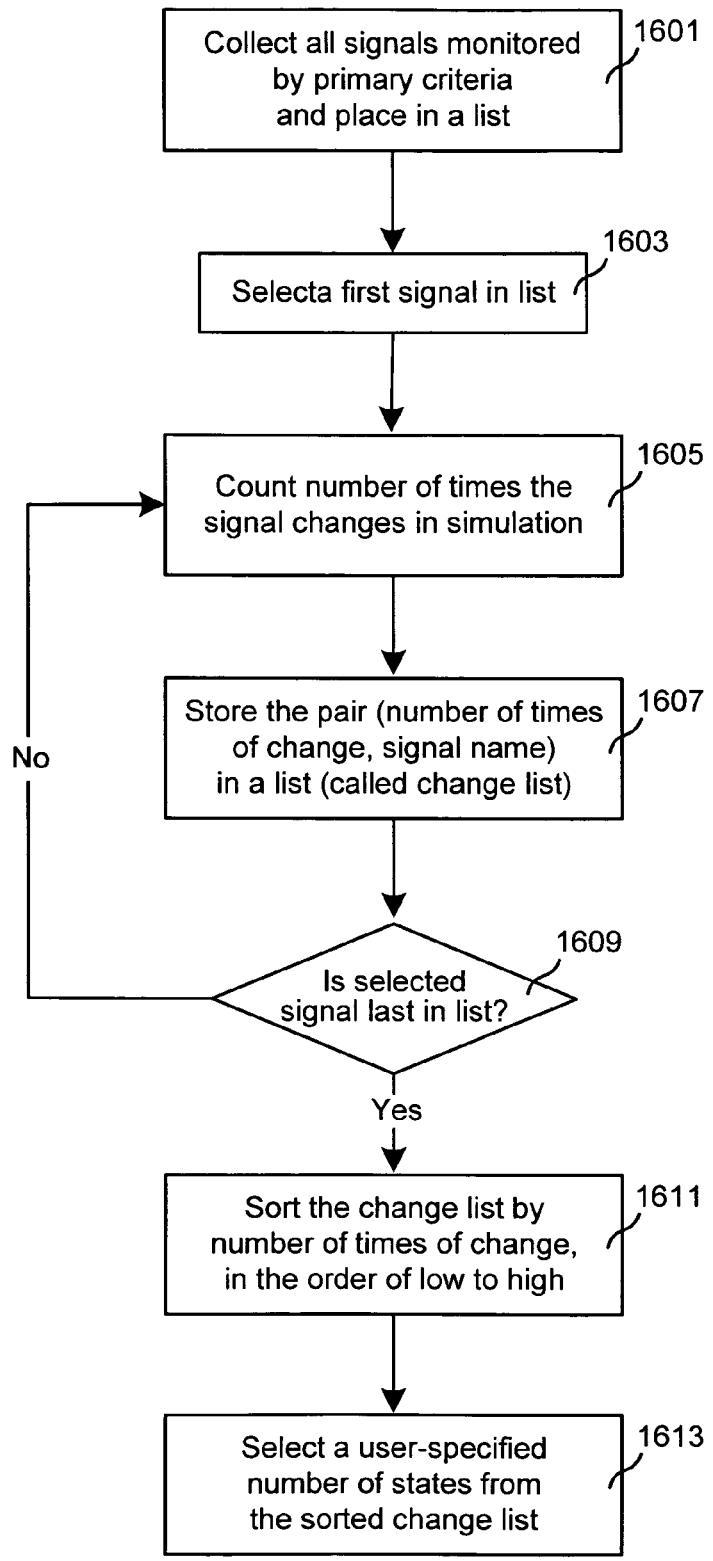
FIG. 16 illustrates, in a flow chart, acts performed in using a low frequency criterion to select states in certain embodiments of the invention, for use in formal analysis.

Several embodiments use the low frequency criterion to select states by performing the acts illustrated in FIG. 16. Specifically, such embodiments collect all signals monitored by primary criteria and place then in a list, as per act 1601. Next, such embodiments select a first signal in the list, as per act 1603. Then such embodiments count the number of times the signal changes in simulation, as per act 1605. Act 1605 may be performed by any mechanism, e.g. the counter number_of_times_enq_changed may be generated in a manner similar to the above-described snippet of Verilog code for the new activity criterion.

Thereafter, such embodiments add this state and the corresponding counter to a list (called "change list"), as per act 1607. Note that in other embodiments, structures other than a list may be used to hold the pair of state and counter. Next, in act 1609, such embodiments check if the selected signal is the last signal in the list that was generated in act 1601, and if not then return to act 1605 (described above). If the selected signal is the last signal, then in act 1611, such embodiments sort the change list by number of times of change, in the order of low to high, with the least frequent changing state being listed first. Thereafter, in act 1613, such embodiments may select a user-specified number of states from the sorted change list (selecting the lowest number of times changed states first). Note that in act 1613, other embodiments may select a predetermined number, e.g. 50% of the states in the sorted change list.

Figure 16A:
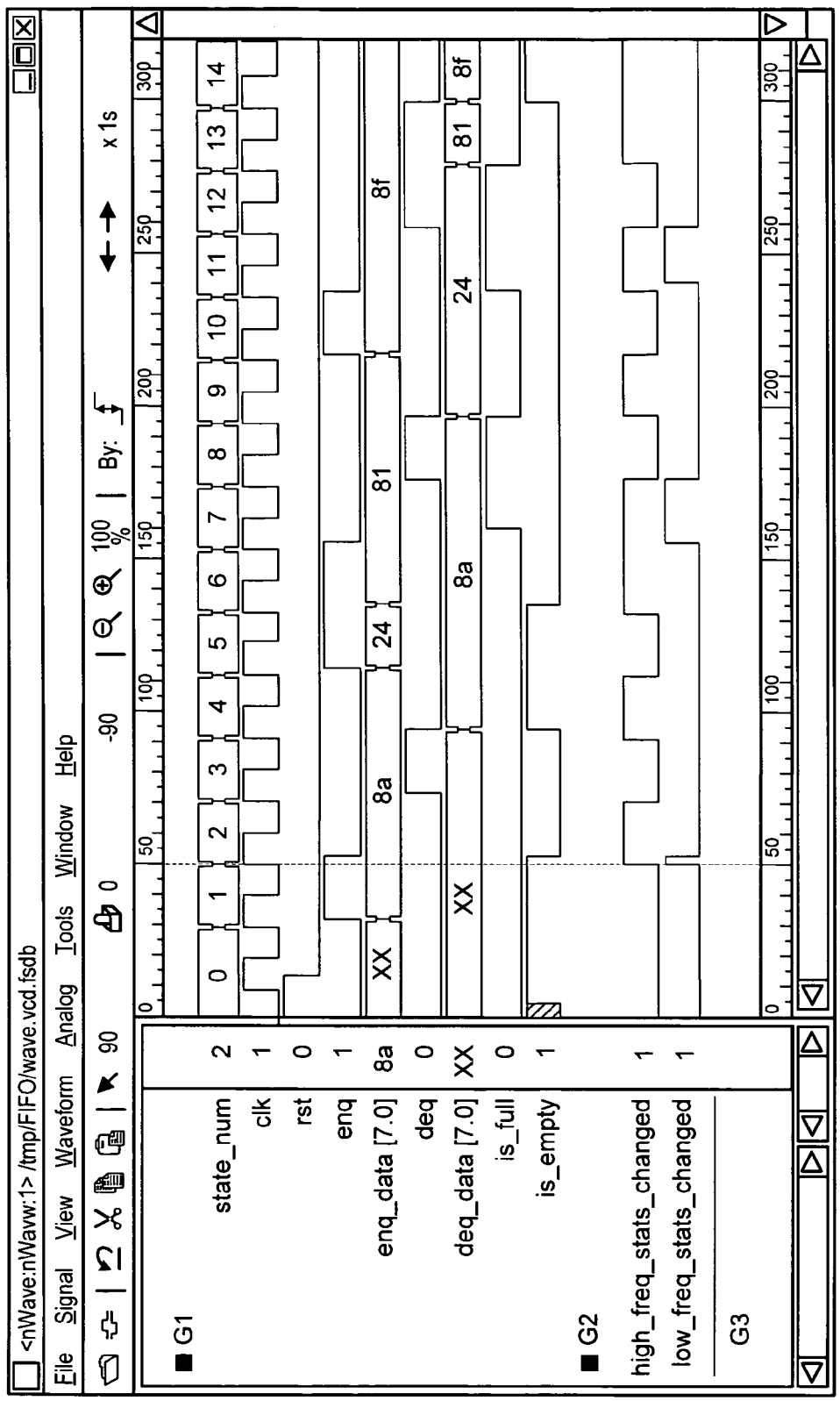

FIG. 16A illustrates the states of FIFO 300 that are selected from the states chosen in FIG. 9 by applying the secondary criterion of choosing those states where signal values change at a low frequency. The waveform in FIG. 16A is from the same simulation as FIG. 9 and in addition FIG. 16A includes signals that, when asserted, show the change in statistics at a frequency below a user-specified threshold.

In the above-described example, 'M' is chosen to be three. As shown for FIFO 300 in FIG. 16B, the statistics signals 'num_enqs' and 'num_deqs' change four times during the simulation while the signal 'current_entries' changes seven times. Since 'M' is set to three, these three statistics signals are discarded for this analysis. Two remaining statistics signals 'max_entries' and 'num_over_high_wtr' are used to determine the state selection. In this case, a signal 'low_freq' is created from these two statistics signals, such that it is asserted high whenever the two statistics signals change value during the simulation, as shown in FIGS. 16A and 16B.

A number of embodiments simply eliminate all but one of any number of duplicate states that happen to be selected by application of one or more primary criteria (e.g. property-based, corner case based, statistics based, user-specified, fanin-cone based and coverage-based criteria). States where the values of all signals that are used to evaluate all primary criteria (used in automatic state selection) are equal to one another are considered equivalent or "duplicate", even though one or more state registers have different values. Such embodiments therefore choose only one of the duplicate states, and discard the rest. The state that is selected (or discarded) from among a number of such duplicates may be picked by any method apparent to the skilled artisan in view of the disclosure, although in some embodiments, the state that occurs first in the simulation (from among the duplicate states) is in fact selected.

To implement the just-described secondary criterion (also called "uniqueness criterion"), certain embodiments simply visit each state in a subset of selected states, and compare the current state with a list of states that have been already found to be not duplicated. If the current state is already in the list, then go to the next state. If the current state is not in the list, add the current state to the list and then go look at another state in the subset. This process is repeated until all states in the subset of selected states have been visited. In this manner, any duplicate states that may be present in the subset are eliminated from the list of states which may then be supplied to a formal verification tool.

Figure 17:
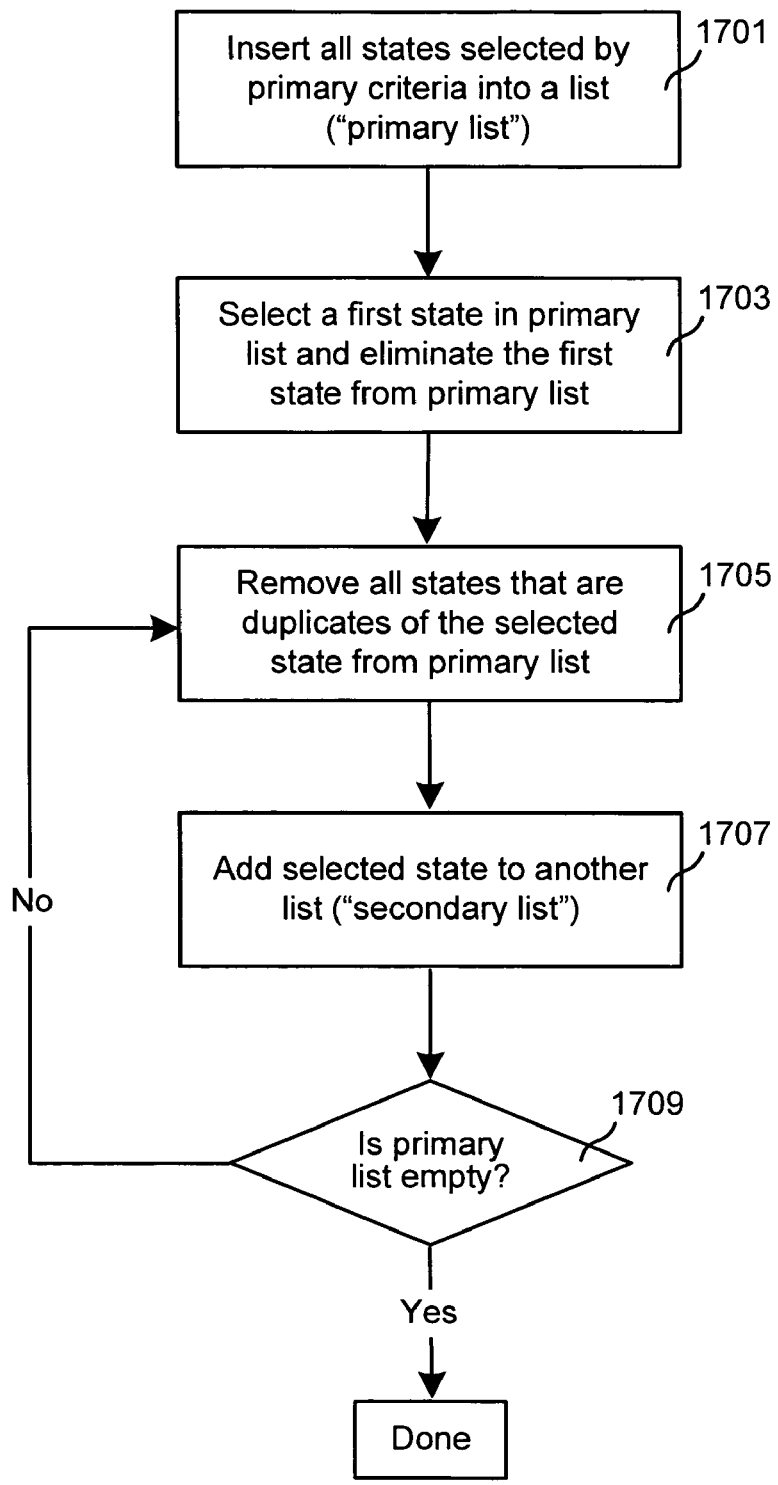
FIGS. 17 and 18 illustrate, in flow charts, acts performed in removing from a set of states selected by use of primary criteria, duplicate states and erroneous states respectively in certain embodiments of the invention, for use in formal analysis.

Certain embodiments perform the acts illustrated in FIG. 17 when implementing the uniqueness criterion. Specifically, such embodiments insert all states selected by primary criteria into a list ("primary list"), as per act 1701. Note that states can be inserted in any order, although some embodiments use simulation sequence to decide the order. Next, in act 1703, such embodiments select a first state from the primary list and remove the selected first state from the primary list (at this stage the primary list has been reduced by element). Such embodiments remove all states in the primary list that are duplicates of the selected state, as per act 1705. Moreover, such embodiments also add the selected state to another list ("secondary list"), as per act 1707. Such embodiments check if the primary list is not empty, as per act 1709 and if not empty, go back to selecting the first state as per act 1703. At this stage the first state in the primary list is different from the previous first stage (which is now in the secondary list), because as noted above the primary list is reduced in size. When the primary list becomes empty, the secondary list contains the states that are all unique states (i.e. a list free of duplicates), that are suitable as starting points for formal analysis.

When implementing yet another secondary criterion, several embodiments identify the states in which one or more user-specified properties are violated during simulation as being illegal states. In such embodiments, illegal states are discarded from a subset of states that are selected by applying one or more primary criteria. For example, if a checker for an arbiter fires, because more than one grant is asserted in a clock cycle, then the arbiter has reached an illegal state, and even if this state was selected by application of a primary criterion, this state is eliminated by application of the just-described secondary criterion.

Moreover, when applying the just-described secondary criterion, any state that is reached by simulation following a state with illegal activity is deemed to be suspect, and suspect states are also not used for formal analysis, even if suspect states were selected by application of a primary criterion. Exceptions to such a secondary criterion are made in some embodiments if an event occurs subsequently that ensures that the simulation reaches a legal state. An example of such an exceptional event is to reset the simulation.

The definition of illegal states is expanded in some embodiments to include those states which have behavior that is not amenable to formal analysis, such as toggling of asynchronous signals. These states are not be used as initial states for formal analysis in embodiments wherein one of the techniques of formal verification starts from the initial state and implicitly enumerates all states reachable from the initial state. A bad initial state completely obviates the result of such formal analysis and for this reason such states are excluded by application of the just-described secondary criterion.

To implement the just-described secondary criterion, certain embodiments simply visit each state in a subset of selected states, and check that none of the checkers have fired in the current state. If a checker has fired, the current state is discarded and the process goes to evaluate another state in the subset. If no checker has fired, the current state is added to a list of states (also called "legal states" list), and the process goes to evaluate another state in the subset. In this manner, illegal states are eliminated from a subset of states that are selected by use of one or more primary criteria.

Figure 18:
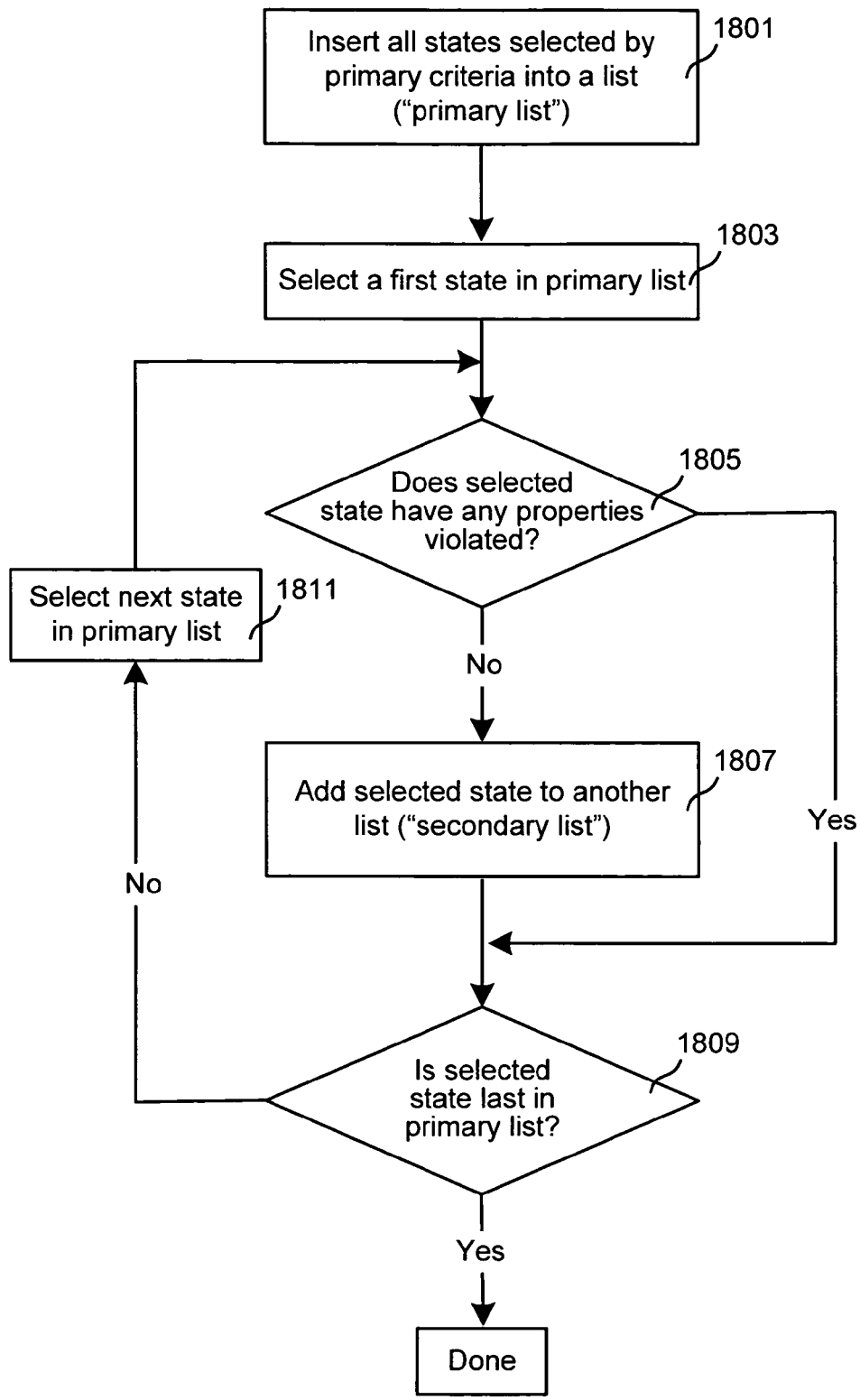

Certain embodiments perform the acts illustrated in FIG. 18 when implementing the just-described criterion (also called "legality" criterion). Specifically, such embodiments insert all states selected by primary criteria into a list ("primary list"), as per act 1801. Note that states can be inserted in any order, although some embodiments use simulation sequence to decide the order. Next, in act 1803, such embodiments select a first state from the primary list. Such embodiments check if the selected state has any property (from among a library of assertions and/or user-specified assertions) violated, as per act 1805. If no property is violated, then such embodiments add the selected state to another list ("secondary list") as per act 1807. These embodiments go to act 1809 (discussed next) from act 1807 and also if the answer was yes in act 1805 (i.e. if there was an error act 1807 is skipped). In act 1809, a check is performed to see if selected state is last in primary list. If not last, then get next state from primary list as per act 1811. If last then the process is completed, and the secondary list contains the states that are not erroneous and hence suitable starting points for formal analysis.

After various selection criteria have been applied, there may still be a large number of states, in a subset of states selected to be input to the formal verification tool. Largeness of the number of states is determined relative to the available time and computing resources required for formal analysis of all states in the selected subset. Certain embodiments enable rapid detection of counter examples and validation of the properties of the design by prioritizing the states that have been selected to be input to the formal verification tool.

Several embodiments order the selected states depending on the criteria used in making the selection. In some embodiments, states that satisfy the most number of primary criteria are prioritized ahead of states that satisfy the least number of primary criteria (e.g. if a state satisfies eight different primary criteria that state is prioritized ahead of states that satisfy only one primary criterion). This type of prioritization is sometimes referred to herein as multiple criteria prioritization.

In other embodiments, a particular ordering of selection criteria is indicated by the user. Specifically, the user prioritizes one or more selection criteria as being of higher priority than other selection criteria, and such embodiments prioritize the selected states in the priority order identified by the user. States that are selected by use of higher priority selection criteria are supplied to the formal verification tool before states that are selected by use of lower priority criteria.

Still other embodiments use an intersection of the above-described multiple criteria prioritization and the above-described user prioritization, to further order the selected states if one of these two techniques results in too many selected states for formal analysis.

Several embodiments prioritize states by based on statistics for corner cases reached during simulation: those states which have the largest number of corner cases are prioritized ahead of states that have the fewest number of corner cases. This technique of prioritization by number of corner cases can be used in combination with one or more other prioritization techniques.

In variants of the just-described embodiments, instead of or in addition to looking at the largest number of corner cases, other statistics may be used, e.g. any statistic indicating that a circuit element (such as FIFO 300) is evaluated. Examples of statistics that indicate evaluation of circuit elements are provided in the CHECKERWARE® DATA BOOK which has been incorporated by reference above. In some embodiments, states are ordered by the number of corner cases, and in case of a tie, the tie is resolved by prioritizing states based on evaluation statistics.

Some embodiments divide up test benches that run simulation for a long time, e.g. over 1 million cycles, into chunks of smaller number cycles (which is user defined to be e.g. 5000 cycles). The automatic state selector is then applied to states visited in each chunk. Then a subset of states (e.g. 10 selected states) that are selected by the automatic state selector for each chunk are aggregated to form a subset of selected states to be used for formal analysis. Other embodiments do not divide up each test bench and instead, the just-described method is applied to a set of test suites, regardless of the duration of simulation for each test suite.

Numerous modifications and adaptations of the prioritization techniques described herein will be apparent to the skilled artisan in view of the disclosure.

For example certain embodiments may have variations on one or more primary criteria, as will be apparent to the skilled artisan in view of the disclosure. For example, another primary criterion is to select states in which there is a change in a signal that is generated by a checker (which could be a signal internal to the checker or supplied by the checker), and yet another primary criterion is to choose a state in which a metric that is used to select states changes at most a predetermined number of times (e.g. if the predetermined number is specified to be 4, then use of this criterion selects the states in which the metric changes for the first time, the second time, the third time, and the fourth time, but does not select states in which the metric changes for fifth time or any more times). However in many embodiments, the number of times of change is selected to be 1.

In still another example, a variation of the above-described primary criteria is to pick not just a single state when applying these criteria, but to pick one or more states that occur within a predetermined time window during simulation around that single state (i.e. select one or more states before the otherwise selected state and/or one or more states after the otherwise selected state) thereby to select a set of states instead of just one state. For example, if the time window is predetermined to be of 5 states, in applying such a variation of a criterion (X), not only is a state selected by application of criterion (X) but also 5 states before and 5 states after the selected state are also selected, thereby to yield a set of eleven states that are selected by application of this variant of criterion (X). The symbol (X) in the previous sentence is used to denote any of a number of different criteria disclosed herein, such as one or more primary criteria.

Figure 19:
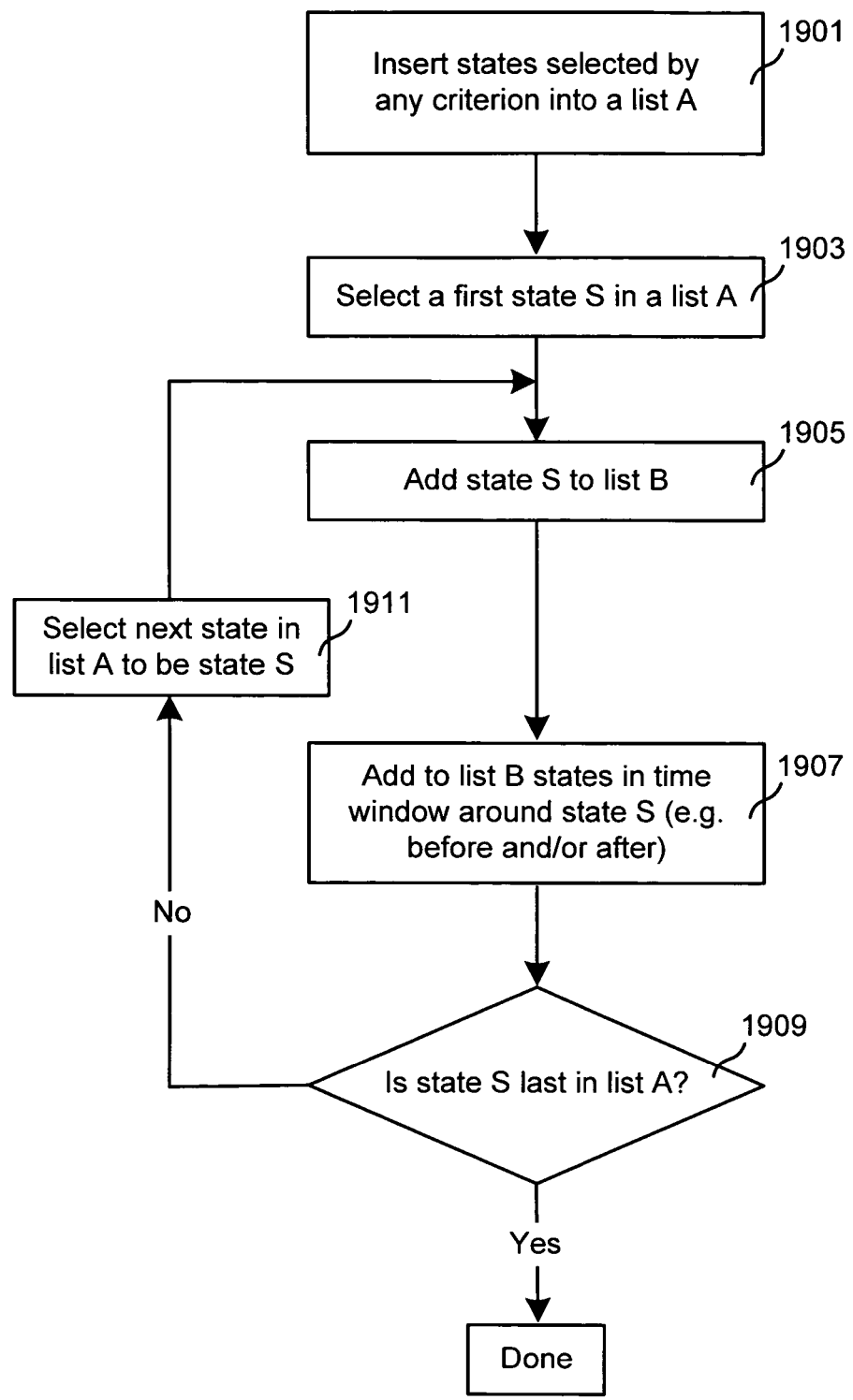
FIG. 19 illustrates, in a flow chart, acts performed in a variant of application of any primary criterion, for selection of states within a predetermined window around a state selected by the primary criterion in certain embodiments of the invention, for use in formal analysis.

One such embodiment performs the acts illustrated in FIG. 19. Specifically, in act 1901, the states that are selected by one or more primary criteria are inserted into a list "A"; and then in act 1903, the first state S is selected from list A. Next, in act 1905, state S is added to a list B and in act 1907, states within the time window before and after state S are also added to list B. Then, in act 1909, list A is checked to see if state S is the last state and if so the process ends and list B is the list of states that are selected by application of this criterion. In act 1909, if the answer is no, then the next state is selected from list A and control returns to act 1905.

Note that the size of the window used in act 1907 can be zero, in which case list B is of the same size as list A and has the same states as if this criterion was not applied. Depending on the embodiment, the window size may be adjusted by the user, or by a computer programmed to use an empirical method to calculate the window size (e.g. based on window sizes that were known to give good results in past simulations of similar circuits).

Some embodiments use a window size of 10, which is found to be a good number to be used as a default for all circuits. In some embodiments, the window size is based on the maximum depth to which a formal analysis tool is able to analyze, for example the window size may be selected to be a predetermined number of times (e.g. twice) the maximum depth. In one particular embodiment, a window size is set to 10, and this embodiment chooses a state in which a metric (as identified by one or more primary criteria) that is used to select states, changes for the very first time.

Also, as described above, states in list B can be subject to the legality criterion and/or the uniqueness criterion. Moreover, although certain embodiments eliminate error states by use of the legality criterion, in other embodiments the legality criterion is not applied thereby to allow formal analysis to start from one or error states if such states were selected by another criterion.

In certain embodiments, when using a windowing mechanism of the type described above in reference to FIG. 19, the window need not be centered around state S that was selected by application of other criteria, although some embodiments use a centered window. Specifically, empirical results have indicated that a centered window (e.g. of size 10 states before state 5 and 10 states after state S for a total of 21 states) works well for tools that search small depths, e.g. search up to a default depth of 5 from each state in the window. Depending on the implementation, the tool that is applied to such window-selected states may perform searching only in a region that is truncated by the window, or alternatively may not be limited to such a window. The just-described numbers are known to yield good results for a tool that uses the window to limit the search to only states within the window.

Note that embodiments that use a tool that searches more deeply, e.g. to a depth of 100 or 200 could be used with a window that is left justified, i.e. the state S is offset towards the right side of the window, so that more states prior to occurrence of S are searched. Note further that even a tool that searches to small depths can be used with large windows (e.g. on the order of 100 states), and in some examples in which use of multiple criteria results in selecting states that are adjacent to one another or within a few states of one another, use of the windowing mechanism can result in a large window that is generated by multiple overlapping windows applied to each criterion.

Certain embodiments use the following variant of the above-described multiple criteria prioritization: a smallest subset of selected states is identified as those states that satisfy every one of the primary criteria, and such a smallest subset is assigned the highest priority. Next, a particular selection criterion is relaxed, to identify a larger subset of states that satisfy all but the relaxed criteria. States that fall within the larger subset but that are not in the smallest subset are therefore prioritized after the states in the smallest subset. In this manner, each of a number of selection criteria are relaxed, one at a time, to yield an ordered subset of selected states.

If more states are necessary, such embodiments further relax the process, to identify states that satisfy all but two of the predetermined criteria. Following this process to the very end results in relaxation of all the criteria, thereby to identify in every selected state in the simulation. In such an embodiment, the order in which criteria are relaxed may be specified by the user, or alternatively such an order may be preprogrammed by a software vendor.

Moreover, one or more of the above-described prioritization techniques can be used as a secondary criterion in variants of the above-described embodiments. For example, in some embodiments a subset of selected states is down-sized by eliminating states that satisfy only one primary criterion. Alternatively, in other embodiments, a secondary criterion is to limit the states being supplied to the formal verification tool to only those states that satisfy every one of the primary criteria.

Similarly, one or more of the above-described primary and/or secondary criteria are used in some embodiments to implement a prioritization technique. For example, in certain embodiments, states in which metrics change less frequently are prioritized ahead of states in which metrics change more frequently. In other embodiments, states in which a user-selected metric changes value for the first time are prioritized ahead of states in which the same metric has previously changed its value (in another state) and is now changing value for the second time.

Also, it will be apparent to the skilled artisan that order of the various acts described herein is not a critical aspect in many embodiments. For example, some embodiments may perform act 1707 after act 1703 and before act 1705, although a different order is illustrated in FIG. 17.

Numerous modifications and adaptations of the methods and apparatuses described herein will be apparent to the skilled artisan in view of the disclosure. Numerous such modifications and adaptations are encompassed by the attached claims.

What is claimed is:

1. A method of formal analysis of a description of a device, the method being implemented in a programmed computer, the method comprising:
   simulating the description of the device to verify functionality of the device;
   determining a set of states that occur during the simulation of the device based on the description, wherein the set of states can be used as initial states in a formal analysis;
   determining a predetermined criterion for the description, the criterion designed to select states in the set of states to reduce states generated by the simulation that are to be used as initial states in a formal analysis of the description of the device;
   automatically selecting a subset of states from the set of states generated during the simulation using the predetermined criterion, wherein selection of the subset of states using the criterion is configured to optimize a subset of defects that can be possibly found using the subset of states in the formal analysis out of a total number of defects that can be found using every state in the set of states in the formal analysis, wherein automatically selecting comprises:
      applying a predetermined formula to a plurality of values associated with a state in the set of states; and
      if the predetermined formula evaluates to a predetermined result, the state meets the predetermined criterion and is selected as a state in the subset of states;
   performing formal analysis of the description of the device to determine defects of the description of the device, the formal analysis using the subset of states as the initial states instead of using all of the set of states as initial states; and
   storing a result of the formal analysis.

2. The method of claim 1 wherein:
the predetermined formula is related to a property of the device.

3. The method of claim 2 wherein:
the property is specified in the form of antecedent implies consequence; and the predetermined formula is based on the antecedent.

4. The method of claim 2 wherein:
the predetermined formula is related to a predetermined corner case based on the property.

5. The method of claim 1 wherein:
use of the predetermined criterion comprises evaluating a statistic related to a property of the device.

6. The method of claim 1 wherein:
use of the predetermined criterion comprises identifying a change in a signal in a circuit element or a port that drives a signal used in a property of the device.

7. The method of claim 1 wherein:
use of the predetermined criterion comprises identifying a change in a metric of coverage of the device.

8. The method of claim 1 wherein:
the act of selecting is hereinafter referred to as primary selecting and the subset of states is hereinafter referred to as intermediate subset of states; and
the method further comprises a secondary act of selecting at least said selected state, from the intermediate subset of states.

9. The method of claim 8 wherein:
states having new activity are selected during the secondary act of selecting.

10. The method of claim 8 wherein:
states having lowest frequency of change in a user-selected metric arc selected during the secondary act of selecting.

11. The method of claim 8 wherein:
during the secondary act of selecting at least one intermediate state is eliminated.

12. The method of claim 11 wherein:
elimination is done by removing duplicate states.

13. The method of claim 11 wherein:
elimination is done by removing illegal states.

14. The method of claim 1, further comprising:
prioritizing the states in the set of states, wherein automatically selecting comprises:
selecting states in the set of states based on their prioritization.

15. An apparatus configured to provide formal analysis of a description of a device, the apparatus comprising:
   one or more processors; and
   a memory containing instructions that, when executed by the one or more processors, cause the one or more processors to perform a set of steps comprising:
   simulating the description of the device to verify functionality of the device;
   determining a set of states that occur during the simulation of the device based on the description, wherein the set of states can be used as initial states in a formal analysis;
   determining a predetermined criterion for the description, the criterion designed to select states in the set of states to reduce states generated by the simulation that are to be used as initial stated in a formal analysis of the description of the device;
   automatically selecting a subset of states from the set of states generated during the simulation using the predetermined criterion, wherein selection of the subset of states using the criterion is configured to optimize a subset of defects that can be possibly found using the subset of states in the formal analysis out of a total number of defects that can be found using every state in the set of states in the formal analysis, wherein automatically selecting comprises:
      applying a predetermined formula to a plurality of values associated with a state in the set of states; and
      if the predetermined formula evaluates to a predetermined result, the state meets the predetermined criterion and is selected as a state in the subset of states;
   performing formal analysis of the description of the device to determine defects of the description of the device, the formal analysis using the subset of states as the initial states instead of using all of the set of states as initial states; and storing a result of the formal analysis.

16. The apparatus of claim 15 wherein:

use of the predetermined criterion comprises evaluating a statistic related to a property of the device.

17. The apparatus of claim 15 wherein:

the act of selecting is hereinafter referred to as primary selecting and the subset of states is hereinafter referred to as intermediate subset of states; and wherein the instructions cause the one or more processors to perform a further step comprising a secondary act of selecting at least said selected state, from the intermediate subset.

18. The apparatus of claim 15, wherein the instructions cause the one or more processors to perform further steps comprising:

prioritizing the states in the set of states, wherein automatically selecting comprises:

selecting states in the set of states based on their prioritorization.

* * * * *